US009542427B2

(12) United States Patent
Kataoka

(10) Patent No.: US 9,542,427 B2
(45) Date of Patent: Jan. 10, 2017

(54) COMPUTER PRODUCT, GENERATING APPARATUS, AND GENERATING METHOD FOR GENERATING HUFFMAN TREE, AND COMPUTER PRODUCT FOR FILE COMPRESSION USING HUFFMAN TREE

(71) Applicant: FUJITSU LIMITED, Kawasaki-shi, Kanagawa (JP)

(72) Inventor: Masahiro Kataoka, Tama (JP)

(73) Assignee: FUJITSU LIMITED, Kawasaki (JP)

(*) Notice: Subject to any disclaimer, the term of this patent is extended or adjusted under 35 U.S.C. 154(b) by 492 days.

(21) Appl. No.: 13/967,142

(22) Filed: Aug. 14, 2013

(65) Prior Publication Data

US 2013/0332433 A1 Dec. 12, 2013

Related U.S. Application Data

(63) Continuation of application No. PCT/JP2011/053059, filed on Feb. 14, 2011.

(51) Int. Cl.
*H03M 7/40* (2006.01)
*G06F 17/30* (2006.01)

(52) U.S. Cl.
CPC ........ *G06F 17/30327* (2013.01); *H03M 7/405* (2013.01)

(58) Field of Classification Search
CPC ......... H03M 7/30; H03M 7/40; H04N 7/1675; G06F 17/30864; G06F 17/30286

(Continued)

(56) References Cited

U.S. PATENT DOCUMENTS 6,040,790 A 3/2000 Law
6,650,256 B2 11/2003 Kondo et al.

(Continued)

FOREIGN PATENT DOCUMENTS

JP 6-131151 5/1994
JP 2002-278748 9/2002

(Continued)

OTHER PUBLICATIONS

International Search Report mailed May 10, 2011 in corresponding International Application No. PCT/JP2011/053059.

(Continued)

*Primary Examiner* — Joseph Lauture
(74) *Attorney, Agent, or Firm* — Staas & Halsey LLP

(57) ABSTRACT

A computer-readable recording medium stores a program causing a computer to determine the size of an applied $2^N$-branch non-contact Huffman tree depending on where in a range the total number of types (X) of character information groups exists. The size of the $2^N$-branch non-contact Huffman tree has the maximum number of branches, $2^N$. The radicand N is an upper limit of the length of a compression code. Thus, when the size of the $2^N$-branch non-contact Huffman tree is determined, the radicand (N) may be determined depending on the total number of types (X) of character information groups. Specifically, when the total number of types (X) of character information groups is $2^{x-2} < X \leq 2^{x-1}$, if the maximum number of branches ($2^N$) is at least $2^{x-1}$, a Huffman tree can be established. To minimize the size, N=x−1 may be adopted. Further, when the total number of types (X) of character information groups is $2^{x-1} < X \leq 2^x$, if the maximum number of branches ($2^N$) is at least $2^x$, a Huffman tree can be established. To minimize the size, N=x may be adopted.

19 Claims, 63 Drawing Sheets

(58) Field of Classification Search
USPC ...... 341/65, 50; 380/240, 241; 707/769, 700
See application file for complete search history.

(56) References Cited

U.S. PATENT DOCUMENTS

| | | | |
|---|---|---|---|
| 2009/0058693 A1* | 3/2009 | Laker | H03M 7/40 341/65 |
| 2010/0085222 A1 | 4/2010 | Kataoka et al. | |
| 2010/0131476 A1 | 5/2010 | Kataoka et al. | |

FOREIGN PATENT DOCUMENTS

| | | |
|---|---|---|
| JP | 2010-93414 | 4/2010 |
| WO | WO 2008/146756 | 12/2008 |

OTHER PUBLICATIONS

M. B. Baer,"On Conditional Branches in Optimal Decision Trees." 2007 *IEEE International Symposium on Information Theory*, IEEE, 2007, pp. 436-440.

PCT International Preliminary Report on Patentability mailed Aug. 29, 2013 in corresponding International Application No. PCT/JP2011/053059.

Extended European Search Report mailed Nov. 25, 2016 in related European Application No. 11858780.7.

\* cited by examiner

FIG.4

| RANK | CHARACTER DATA TYPE | CHARACTER DATA CODE | CHARACTER DATA CHARACTER (STRING) | NUMBER OF APPEARANCES | TOTAL NUMBER | APPEARANCE RATE | BEFORE CORRECTION OCCURRENCE PROBABILITY | BEFORE CORRECTION COMPRESSION CODE LENGTH |
|---|---|---|---|---|---|---|---|---|
| 1 | 16 | 3000 | 　 | 60451 | 1386951 | 0.043585534 | 0.03125 | 5 |
| 2 | 16 | 3E00 | > | 53183 | 1386951 | 0.038345262 | 0.03125 | 5 |
| ... | | | | | | | | |
| 6 | SPECIAL | | <br> | 28999 | 1386951 | 0.020908453 | 0.015625 | 6 |
| ... | | | | | | | | |
| 24 | 16 | 6E30 | の | 15577 | 1386951 | 0.011231111 | 0.0078125 | 7 |
| ... | | | | | | | | |
| 34 | 16 | 7000 | p | 10737 | 1386951 | 0.007741441 | 0.00390625 | 8 |
| ... | | | | | | | | |
| 79 | 16 | 6F30 | は | 3529 | 1386951 | 0.00254443 | 0.001953125 | 9 |
| ... | | | | | | | | |
| 110 | 16 | 6972 | 物 | 1569 | 1386951 | 0.001131258 | 0.000976563 | 10 |
| ... | | | | | | | | |
| 156 | 8 | 0x4E | | 879 | 1386951 | 0.000633764 | 0.000488281 | 11 |
| 167 | 8 | 0x51 | | 835 | 1386951 | 0.00060204 | 0.000488281 | 11 |
| ... | | | | | | | | |
| 286 | 16 | D552 | 動 | 485 | 1386951 | 0.000349688 | 0.000244141 | 12 |
| ... | | | | | | | | |
| 364 | 8 | 0x93 | | 337 | 1386951 | 0.000242979 | 0.00012207 | 13 |
| ... | | | | | | | | |
| 691 | 16 | 216B | 次 | 145 | 1386951 | 0.000104546 | 6.10352E-05 | 14 |
| ... | | | | | | | | |
| 1022 | 16 | EF83 | 華 | 84 | 1386951 | 6.05645E-05 | 3.05176E-05 | 15 |
| ... | | | | | | | | |
| 1301 | 8 | 0xCE | | 42 | 1386951 | 3.02823E-05 | 1.52588E-05 | 16 |
| 1302 | 8 | 0xFD | | 35 | 1386951 | 2.52352E-05 | 1.52588E-05 | 16 |
| 1303 | 8 | 0xEA | | 33 | 1386951 | 2.37932E-05 | 1.52588E-05 | 16 |
| 1304 | 8 | 0x24 | | 23 | 1386951 | 1.65831E-05 | 1.52588E-05 | 16 |
| 1305 | 8 | 0x23 | | 17 | 1386951 | 1.22571E-05 | 7.62939E-06 | 17 |
| | | | | | TOTAL OCCURRENCE PROBABILITY | | 0.711037 | |

FIG.5

| COMPRESSION CODE LENGTH | NUMBER OF LEAVES | NUMBER OF LEAVES WITH CORRECTION A | NUMBER OF LEAVES WITH CORRECTION B-1 | NUMBER OF LEAVES WITH CORRECTION B-2 | NUMBER OF LEAVES WITH CORRECTION B-3 | NUMBER OF BRANCHES OF HUFFMAN TREE PER LEAF | SUBTOTAL |
|---|---|---|---|---|---|---|---|
| 5 | 2 | 2 | 1 | 0 | 0 | 64 | 0 |
| 6 | 9 | 9 | 7 | 6 | 6 | 32 | 192 |
| 7 | 22 | 22 | 19 | 18 | 18 | 16 | 288 |
| 8 | 28 | 28 | 24 | 23 | 23 | 8 | 184 |
| 9 | 29 | 29 | 25 | 23 | 23 | 4 | 92 |
| 10 | 25 | 25 | 21 | 20 | 20 | 2 | 40 |
| 11 | 86 | 1190 | 1208 | 1215 | 1215 | 1 | 1215 |
| 12 | 162 | | | | | | |
| 13 | 251 | | | | | | |
| 14 | 407 | | | | | | |
| 15 | 279 | | | | | | |
| 16 | 4 | | | | | | |
| 17 | 1 | | | | | | |
| TOTAL NUMBER OF LEAVES / TOTAL OCCURRENCE PROBABILITY | 1305 / 0.711 | 1305 / 1.146 | 1305 / 1.042 | 1305 / 0.982 | 1305 / 0.982 | | |
| TOTAL NUMBER OF BRANCHES | | | | | | | 2011 |

FIG.6

| RANK | CHARACTER DATA TYPE | CHARACTER DATA CODE | CHARACTER DATA CHARACTER (STRING) | NUMBER OF APPEARANCES | TOTAL NUMBER | APPEARANCE RATE | BEFORE CORRECTION OCCURRENCE PROBABILITY | BEFORE CORRECTION COMPRESSION CODE LENGTH | BEFORE CORRECTION AVERAGE LENGTH | CORRECTION A OCCURRENCE PROBABILITY | CORRECTION A COMPRESSION CODE LENGTH | CORRECTION A AVERAGE LENGTH | CORRECTION B-1 OCCURRENCE PROBABILITY | CORRECTION B-1 COMPRESSION CODE LENGTH | CORRECTION B-1 AVERAGE LENGTH | CORRECTION B-2 OCCURRENCE PROBABILITY | CORRECTION B-2 COMPRESSION CODE LENGTH | CORRECTION B-2 AVERAGE LENGTH |
|---|---|---|---|---|---|---|---|---|---|---|---|---|---|---|---|---|---|---|
| 1 | 16 | 3000 | 0 | 60451 | 1386951 | 0.043586 | 0.03125 | 5 | 0.217928 | 0.03125 | 5 | 0.217928 | 0.03125 | 5 | 0.217928 | 0.015625 | 6 | 0.261513 |
| 2 | 16 | 3E00 | v | 53183 | 1386951 | 0.038345 | 0.03125 | 5 | 0.191726 | 0.03125 | 5 | 0.191726 | 0.015625 | 6 | 0.230072 | 0.015625 | 6 | 0.230072 |
| 3 | 16 | 2200 | | 33815 | 1386951 | 0.024381 | 0.015625 | 6 | 0.146285 | 0.015625 | 6 | 0.146285 | 0.015625 | 6 | 0.146285 | 0.015625 | 6 | 0.146285 |
| ... | | | | | | | | | | | | | | | | | | |
| 12 | 16 | 3400 | 4 | 21501 | 1386951 | 0.015502 | 0.007813 | 7 | 0.108516 | 0.007813 | 7 | 0.108516 | 0.007813 | 7 | 0.108516 | 0.007813 | 7 | 0.108516 |
| ... | | | | | | | | | | | | | | | | | | |
| 34 | 16 | 7000 | p | 10737 | 1386951 | 0.007741 | 0.003906 | 8 | 0.061932 | 0.003906 | 8 | 0.061932 | 0.003906 | 8 | 0.061932 | 0.003906 | 8 | 0.061932 |
| ... | | | | | | | | | | | | | | | | | | |
| 62 | 16 | 6A30 | た | 5107 | 1386951 | 0.003682 | 0.001953 | 9 | 0.03314 | 0.001953 | 9 | 0.03314 | 0.001953 | 9 | 0.03314 | 0.001953 | 9 | 0.03314 |
| ... | | | | | | | | | | | | | | | | | | |
| 91 | 16 | 6430 | n | 2637 | 1386951 | 0.001901 | 0.000977 | 10 | 0.019013 | 0.000977 | 10 | 0.019013 | 0.000977 | 10 | 0.019013 | 0.000488 | 11 | 0.020914 |
| ... | | | | | | | | | | | | | | | | | | |
| 116 | 16 | 625F | 形 | 1309 | 1386951 | 0.000944 | 0.000488 | 11 | 0.010382 | 0.000488 | 11 | 0.010382 | 0.000488 | 11 | 0.010382 | 0.000488 | 11 | 0.010382 |
| ... | | | | | | | | | | | | | | | | | | |
| 202 | 8 | 75 | | 673 | 1386951 | 0.000485 | 0.000244 | 12 | 0.005823 | 0.000488 | 11 | 0.005338 | 0.000488 | 11 | 0.005338 | 0.000488 | 11 | 0.005338 |
| ... | | | | | | | | | | | | | | | | | | |
| 364 | 8 | 93 | | 337 | 1386951 | 0.000243 | 0.000122 | 13 | 0.003159 | 0.000488 | 11 | 0.002673 | 0.000488 | 11 | 0.002673 | 0.000488 | 11 | 0.002673 |
| ... | | | | | | | | | | | | | | | | | | |
| 615 | 8 | 45 | | 169 | 1386951 | 0.000122 | 6.10352E-05 | 14 | 0.001706 | 0.000488 | 11 | 0.00134 | 0.000488 | 11 | 0.00134 | 0.000488 | 11 | 0.00134 |
| ... | | | | | | | | | | | | | | | | | | |
| 1022 | 16 | EF83 | 華 | 84 | 1386951 | 6.05645E-05 | 3.05176E-05 | 15 | 0.000908 | 0.000488 | 11 | 0.000666 | 0.000488 | 11 | 0.000666 | 0.000488 | 11 | 0.000666 |
| ... | | | | | | | | | | | | | | | | | | |
| 1301 | 8 | CE | | 42 | 1386951 | 3.02823E-05 | 1.52588E-05 | 16 | 0.000485 | 0.000488 | 11 | 0.000333 | 0.000488 | 11 | 0.000333 | 0.000488 | 11 | 0.000333 |
| ... | | | | | | | | | | | | | | | | | | |
| 1305 | 8 | 23 | | 17 | 1386951 | 1.22571E-05 | 7.62939E-06 | 17 | 0.000208 | 0.000488 | 11 | 0.000135 | 0.000488 | 11 | 0.000135 | 0.000488 | 11 | 0.000135 |
| TOTAL | | | | 1386951 | | 1 | 0.711037 | | 8.179405 | 1.146484 | | 7.878965 | 1.049316 | | 8.103753 | 0.98584 | | 8.277232 |

FIG.14

| COMPRESSION CODE LENGTH | NUMBER OF LEAVES (OTHER THAN BASIC WORDS) | NUMBER OF LEAVES (BASIC WORDS) | TOTAL NUMBER OF LEAVES | NUMBER OF LEAVES WITH CORRECTION A | NUMBER OF LEAVES WITH CORRECTION B*1 | NUMBER OF LEAVES WITH CORRECTION B*2 | ... | NUMBER OF LEAVES WITH CORRECTION B*10 | NUMBER OF LEAVES WITH CORRECTION B*11 | NUMBER OF BRANCHES OF HUFFMAN TREE | |
|---|---|---|---|---|---|---|---|---|---|---|---|
| | | | | | | | | | | PER LEAF | SUBTOTAL |
| 6 | 2 | | 2 | 2 | 2 | 2 | | 2 | 2 | 64 | 128 |
| 7 | 9 | | 9 | 9 | 10 | 11 | | 12 | 12 | 32 | 384 |
| 8 | 22 | | 22 | 22 | 26 | 30 | | 41 | 41 | 16 | 656 |
| 9 | 28 | | 28 | 28 | 34 | 39 | | 54 | 54 | 8 | 432 |
| 10 | 29 | | 29 | 29 | 35 | 40 | | 55 | 55 | 4 | 220 |
| 11 | 25 | | 25 | 25 | 30 | 34 | | 45 | 45 | 2 | 90 |
| 12 | 86 | | 86 | 2214 | 2192 | 2173 | | 2120 | 2120 | 1 | 2120 |
| 13 | 162 | | 178 | | | | | | | | |
| 14 | 251 | 16 | 491 | | | | | | | | |
| 15 | 407 | 240 | 919 | | | | | | | | |
| 16 | 279 | 512 | 535 | | | | | | | | |
| 17 | 4 | 256 | 4 | | | | | | | | |
| 18 | 1 | | 1 | | | | | | | | |
| TOTAL NUMBER OF LEAVES | 1305 | 1024 | 2329 | 2329 | 2329 | 2329 | | 2329 | 2329 | | |
| TOTAL OCCURRENCE PROBABILITY | 0.356 | 0.021 | 0.392 | 0.823 | 0.861 | 0.897 | | 0.984 | 0.984 | | |
| TOTAL NUMBER OF BRANCHES | | | | | | | | | | | 4030 |

FIG.23

| COMPRESSION CODE LENGTH | NUMBER OF LEAVES (OTHER THAN BASIC WORDS) | NUMBER OF LEAVES (BASIC WORDS) | TOTAL NUMBER OF LEAVES | NUMBER OF LEAVES WITH CORRECTION A | NUMBER OF LEAVES WITH CORRECTION B*1 | NUMBER OF LEAVES WITH CORRECTION B*2 | NUMBER OF LEAVES WITH CORRECTION B*3 | NUMBER OF BRANCHES OF HUFFMAN TREE | |
|---|---|---|---|---|---|---|---|---|---|
| | | | | | | | | PER LEAF | SUBTOTAL |
| 6 | 2 | | 2 | 2 | 2 | 2 | 2 | 128 | 256 |
| 7 | 9 | | 9 | 9 | 10 | 11 | 11 | 64 | 704 |
| 8 | 22 | | 22 | 22 | 25 | 27 | 27 | 32 | 864 |
| 9 | 28 | | 28 | 28 | 32 | 34 | 35 | 16 | 544 |
| 10 | 29 | | 29 | 29 | 33 | 35 | 36 | 8 | 280 |
| 11 | 25 | | 25 | 25 | 29 | 30 | 31 | 4 | 120 |
| 12 | 86 | | 86 | 86 | 98 | 104 | 106 | 2 | 212 |
| 13 | 162 | 64 | 226 | 5200 | 5172 | 5158 | 5153 | 1 | 5153 |
| 14 | 251 | 960 | 1211 | | | | | | |
| 15 | 407 | 2048 | 2455 | | | | | | |
| 16 | 279 | 1024 | 1303 | | | | | | |
| 17 | 4 | | 4 | | | | | | |
| 18 | 1 | | 1 | | | | | | |
| TOTAL NUMBER OF LEAVES | 1305 | 4096 | 5401 | 5401 | 5401 | 5401 | 5401 | | |
| TOTAL OCCURRENCE PROBABILITY | 0.711 | 0.877 | 0.711 | 0.877 | 0.942 | 0.986 | 0.992 | | |
| TOTAL NUMBER OF BRANCHES | | | | | | | | | 8133 |

3400

| HIGHER-ORDER CHARACTER CODE STRUCTURE | |
|---|---|
| CHARACTER CODE | POINTER TO LEAF |
| ⋮ | ⋮ |
| e691 (0x216B: 次) | POINTER TO LEAF OF e691 |
| ⋮ | ⋮ |
| e24 (0x6E30: の) | POINTER TO LEAF OF e24 |
| ⋮ | ⋮ |
| e79 (0x6F30: は) | POINTER TO LEAF OF e79 |
| ⋮ | ⋮ |

| DIVIDED CHARACTER CODE STRUCTURE ||
|---|---|
| DIVIDED CHARACTER CODE | POINTER TO LEAF |
| 0x00 | POINTER TO LEAF OF "0x00" |
| 0x01 | POINTER TO LEAF OF "0x01" |
| ⋮ | ⋮ |
| 0xFF | POINTER TO LEAF OF "0xFF" |

| SPECIAL WORD STRUCTURE ||
|---|---|
| TOTAL NUMBER OF SPECIAL WORDS | 4121 |
| MAXIMUM BIT LENGTH OF SPECIAL WORD | Lrmax |
| BIT LENGTH OF SPECIAL WORD r1 | Lr1 (=64) |
| SPECIAL WORD r1 (<br>) ||
| POINTER TO LEAF OF SPECIAL WORD r1 ||
| BIT LENGTH OF SPECIAL WORD r2 | Lr2 (=64) |
| SPECIAL WORD r2 (</a>) ||
| POINTER TO LEAF OF SPECIAL WORD r2 ||
| ⋮ ||
| BIT LENGTH OF SPECIAL WORD r25 | Lr25 |
| SPECIAL WORD r25 ||
| POINTER TO LEAF OF SPECIAL WORD r25 ||
| EOT (0xFFFF) ||

| SPECIAL WORD STRUCTURE | |
|---|---|
| TOTAL NUMBER OF SPECIAL WORDS | 4121 |
| MAXIMUM BIT LENGTH OF SPECIAL WORD | Lrmax |
| BIT LENGTH OF SPECIAL WORD r1 | Lr1(=64) |
| SPECIAL WORD r1(<br>) | |
| POINTER TO LEAF OF SPECIAL WORD r1 | |
| BIT LENGTH OF SPECIAL WORD r2 | Lr2(=64) |
| SPECIAL WORD r2(</a>) | |
| POINTER TO LEAF OF SPECIAL WORD r2 | |
| ⋮ | |
| BIT LENGTH OF SPECIAL WORD r25 | Lr25 |
| SPECIAL WORD r25 | |
| POINTER TO LEAF OF SPECIAL WORD r25 | |
| BIT LENGTH OF BASIC WORD s1 | Ls1 |
| BASIC WORD s1 ("相方") | |
| POINTER TO LEAF OF BASIC WORD s1 | |
| ⋮ | |
| BIT LENGTH OF BASIC WORD s4096 | Ls4096 |
| BASIC WORD s4096 ("ワン切り") | |
| POINTER TO LEAF OF BASIC WORD s4096 | |
| EOT(0xFFFF) | |

FIG.40

|  | SPECIAL WORDS (min25 - max4121) | HIGH-FREQUENCY CHARACTERS (max1024) | LOW-FREQUENCY DIVIDED CHARACTERS (256) |
|---|---|---|---|
| ENGLISH | ENGLISH WORDS | ALPHABETICAL CHARACTERS, SPECIAL SYMBOLS | - |
| JAPANESE | JAPANESE WORDS | KANA, KATAKANA, KANJI (EDUCATIONAL KANJI) | KANJI (LEVEL-2, 3, AND 4) ETC. |

FIG.41

|  | SPECIAL WORDS (min25 - max2073) | 8-BIT CHARACTERS (256) |
|---|---|---|
| ENGLISH | ENGLISH WORDS | ALPHABETICAL CHARACTERS, SPECIAL SYMBOLS |

FIG.42

|  | SPECIAL WORDS (MIN 25 TO MAX 4121) AND JAPANESE CHARACTER (COMBINATION OF 256) | | 8-BIT CHARACTERS (256) |
|---|---|---|---|
| ENGLISH | ENGLISH WORDS | - | ALPHABETICAL CHARACTERS, SPECIAL SYMBOLS |
| JAPANESE | JAPANESE WORDS | KANA, KATAKANA, KANJI | |

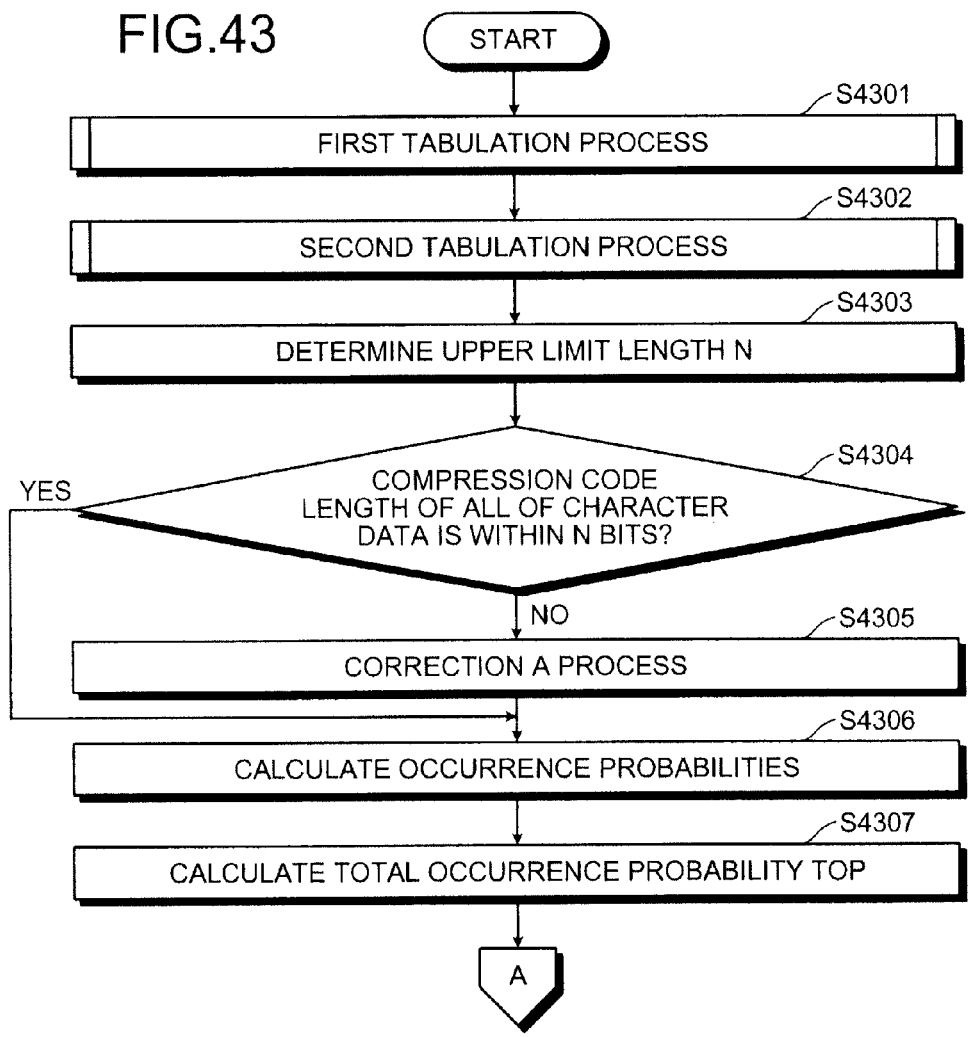

FIG.58

| COMPRESSION CODE LENGTH | TOTAL NUMBER OF LEAVES | NUMBER OF LEAVES WITH CORRECTION A | NUMBER OF LEAVES WITH CORRECTION B*1 | NUMBER OF LEAVES WITH CORRECTION B*2 | NUMBER OF LEAVES WITH CORRECTION B*3 | NUMBER OF LEAVES WITH CORRECTION B*4 | NUMBER OF LEAVES WITH CORRECTION B*5 | NUMBER OF BRANCHES OF HUFFMAN TREE | |
|---|---|---|---|---|---|---|---|---|---|
| | | | | | | | | PER LEAF | SUBTOTAL |
| 6 | 2 | 2 | 11 | 11 | 11 | 11 | 11 | 64 | 704 |
| 7 | 9 | 9 | 0 | 22 | 22 | 22 | 22 | 32 | 704 |
| 8 | 22 | 22 | 22 | 0 | 10 | 10 | 10 | 16 | 160 |
| 9 | 28 | 28 | 28 | 28 | 18 | 19 | 19 | 8 | 144 |
| 10 | 29 | 29 | 29 | 29 | 29 | 28 | 29 | 4 | 116 |
| 11 | 25 | 25 | 25 | 25 | 25 | 25 | 24 | 2 | 50 |
| 12 | 86 | | | | | | | 1 | |
| 13 | 178 | | | | | | | | |
| 14 | 491 | | | | | | | | |
| 15 | 919 | | | | | | | | |
| 16 | 535 | | | | | | | | |
| 17 | 4 | | | | | | | | |
| 18 | 1 | 2214 | 2214 | 2214 | 2214 | 2214 | 2214 | | 2214 |
| TOTAL NUMBER OF LEAVES | 2329 | 2329 | 2329 | 2329 | 2329 | 2329 | 2329 | | |
| TOTAL OCCURRENCE PROBABILITY | 0.392 | 0.823 | 0.894 | 0.979 | 0.999 | 1.000 | 1.000 | | |
| TOTAL NUMBER OF BRANCHES | | | | | | | | | 4092 |

FIG.59

| COMPRESSION CODE LENGTH | NUMBER OF LEAVES | NUMBER OF LEAVES WITH CORRECTION A | NUMBER OF LEAVES WITH CORRECTION B-1 | NUMBER OF LEAVES WITH CORRECTION B-2 | NUMBER OF LEAVES WITH CORRECTION B-3 | NUMBER OF BRANCHES OF HUFFMAN TREE PER LEAF | SUBTOTAL |
|---|---|---|---|---|---|---|---|
| 5 | 2 | 2 | 0 | 0 | 0 | 64 | 0 |
| 6 | 9 | 9 | 11 | 0 | 0 | 32 | 0 |
| 7 | 22 | 22 | 22 | 33 | 25 | 16 | 400 |
| 8 | 28 | 28 | 28 | 28 | 36 | 8 | 288 |
| 9 | 29 | 29 | 29 | 29 | 29 | 4 | 116 |
| 10 | 25 | 25 | 25 | 25 | 25 | 2 | 50 |
| 11 | 86 | 1190 | 1190 | 1190 | 1190 | 1 | 1190 |
| 12 | 162 | | | | | | |
| 13 | 251 | | | | | | |
| 14 | 407 | | | | | | |
| 15 | 279 | | | | | | |
| 16 | 4 | | | | | | |
| 17 | 1 | | | | | | |
| TOTAL NUMBER OF LEAVES | 1305 | 1305 | 1305 | 1305 | 1305 | | |
| TOTAL OCCURRENCE PROBABILITY | 0.711 | 1.146 | 1.115 | 1.029 | 0.998 | | |
| TOTAL NUMBER OF BRANCHES | | | | | | | 2044 |

FIG.60

| CHARACTER STRING | 次 | | | | | の | | | | 兎 | | | | は | | |
|---|---|---|---|---|---|---|---|---|---|---|---|---|---|---|---|---|
| | | | | | | | | | | FIRST HALF | | SECOND HALF | | | | |
| CHARACTER CODE STRING (HEXADECIMAL) | 2 | 1 | 6 | B | 6 | E | 3 | 0 | | 5 | 1 | 4 | E | 6 | F | 3 | 0 |
| CHARACTER CODE STRING (BINARY) | 0010 | 0001 | 0110 | 1011 | 0110 | 1110 | 0011 | 0000 | | 0101 | 0001 | 0100 | 1110 | 0110 | 1111 | 0011 | 0000 |

FIG.61

| CHARACTER STRING | 次 | | の | | 兎 | | は | |
|---|---|---|---|---|---|---|---|---|
| | | | | | FIRST HALF | SECOND HALF | | |
| COMPRESSION CODE STRING | 1011 | 1111 | 1011 | 0101 | 011 | 1001 | 1001 | 110 | 1001 | 1000 | 011 | 1110 | 1000 | 1 |

FIG.62

| CHARACTER STRING | 兎 | | は | | | 動 | | | 物 | | | 園 | | | の | | |
|---|---|---|---|---|---|---|---|---|---|---|---|---|---|---|---|---|---|
| | FIRST HALF | SECOND HALF | | | | | | | | | | | | | | | |
| CHARACTER CODE STRING (HEXADECIMAL) | 5 | 1 | 4 | E | F | 3 | 0 | D | 5 | 5 | 6 | 9 | 2 | 6 | 1 | 2 | 5 | 7 | 6 | E | 3 | 0 | 0 |
| CHARACTER CODE STRING (BINARY) | 0101 | 0001 | 0100 | 1110 | 1111 | 0011 | 0000 | 1101 | 0101 | 0101 | 1001 | 0110 | 0010 | 0001 | 0010 | 0101 | 0111 | 0110 | 1110 | 0011 | 0000 | 0000 |

FIG.63

| CHARACTER STRING | 兎 | | は | | 動物園 (BASIC WORD) | | | の | |
|---|---|---|---|---|---|---|---|---|---|
| | FIRST HALF | SECOND HALF | | | | | | | |
| COMPRESSION CODE STRING | 0100 | 1100 | 1110 | 0100 | 0011 | 1100 | 0011 | 0100 | 0111 | 01 | 1111 | 0011 | 0000 | 1 | 0010 | 1011 |

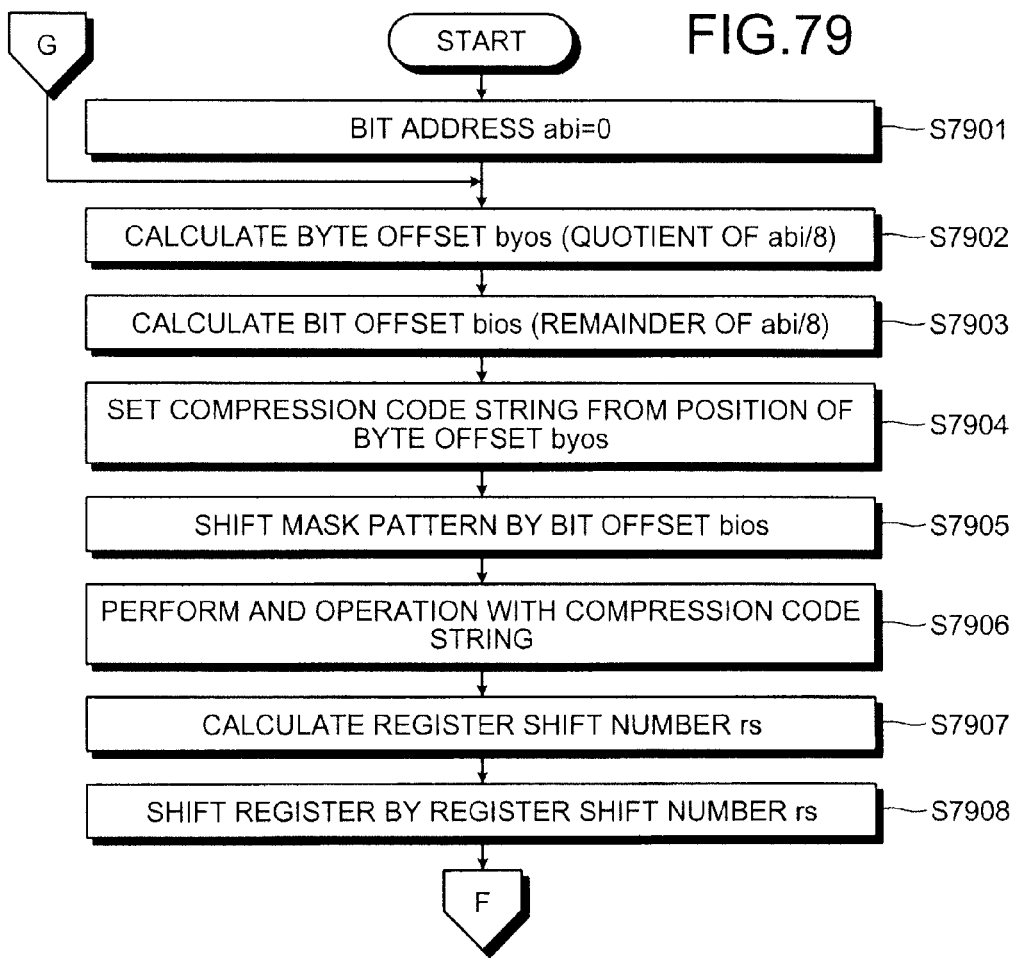

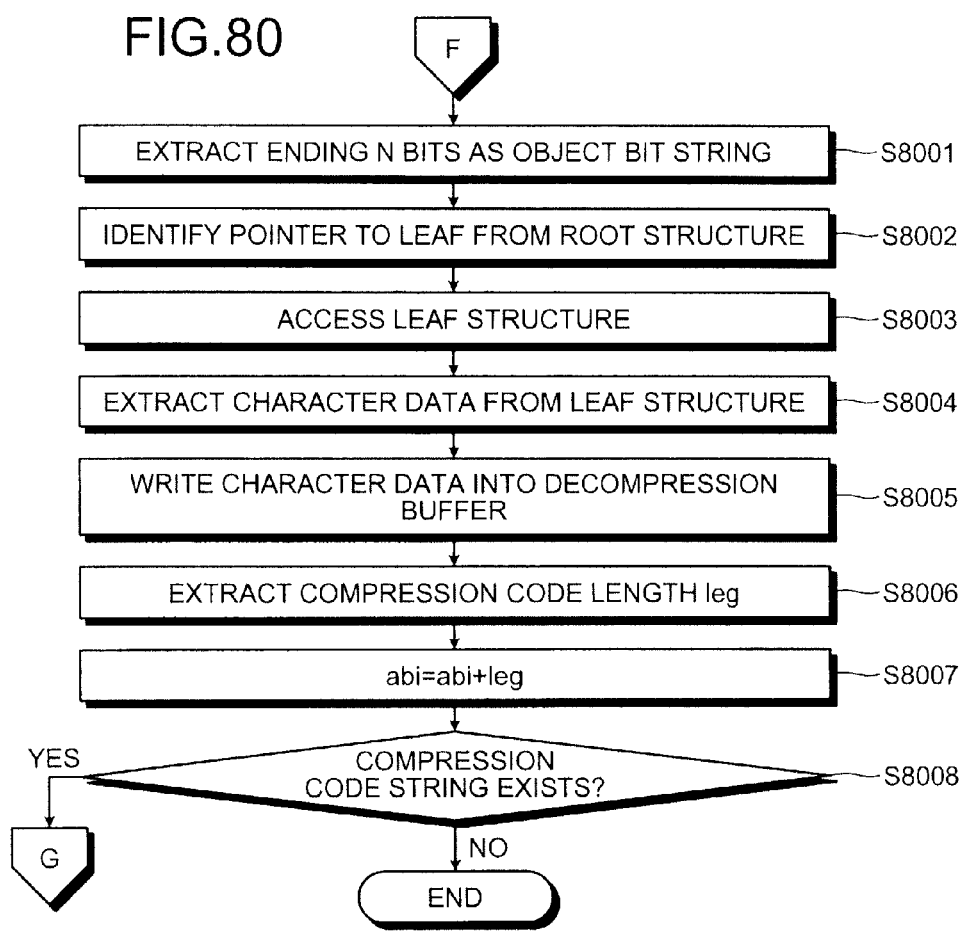

COMPUTER PRODUCT, GENERATING APPARATUS, AND GENERATING METHOD FOR GENERATING HUFFMAN TREE, AND COMPUTER PRODUCT FOR FILE COMPRESSION USING HUFFMAN TREE

CROSS REFERENCE TO RELATED APPLICATIONS

This application is a continuation application of International Application PCT/JP2011/053059, filed on Feb. 14, 2011 and designating the U.S., the entire contents of which are incorporated herein by reference.

FIELD

The present invention relates to a computer product, a generating apparatus, and a generating method for generating a Huffman tree, and computer product for file compression using a Huffman tree.

BACKGROUND

A $2^N$-branch nodeless Huffman tree having a compression code length specified by an integer multiple of 2, 3, and 4 is conventionally generated by development from a node aggregate acting as a generation source of 4-, 8-, and 16-branch Huffman trees (see, e.g., Japanese Laid-Open Patent Publication No. 2010-093414).

However, since a $2^N$-branch nodeless Huffman tree has a compression code length that can only be specified by an integer multiple of 2, 3, and 4, an exponent N of a maximum branch number $2^N$ can inevitably only be specified by an integer multiple of 2, 3, and 4. Therefore, the maximum branch number $2^N$ is 4 ($=2^2$), 8 ($=2^3$), 16 ($=2^4$), 64 ($=2^6$), 256 ($=2^8$), 512 ($=2^9$), 1024 ($2^{10}$), 4096 ($2^{12}$), or 16384 ($=2^{14}$). Therefore, a number other than an integer multiple of 2, 3, and 4 such as 2048 ($=2^{11}$) and 8192 ($=2^{13}$) cannot be specified as the maximum branch number $2^N$.

On the other hand, if the number of types of single characters, basic words, and reserved words (hereinafter referred to as character data) making up text data is greater than $2^m$ (where m is an integer multiple of 2, 3, and 4) and less than or equal to $2^{m+1}$ (where m+1 is not an integer multiple of 2, 3, and 4), the maximum branch number $2^N$ must be N≥m+2. For example, if the number of types of the character data (hereinafter referred to as the number of character data types) is greater than $2^{10}$ and less than or equal to $2^{11}$, the maximum branch number $2^N$ must be $2^{12}$. If the number of character data types is greater than $2^{12}$ and less than or equal to $2^{13}$, the maximum branch number $2^N$ must be $2^{14}$. Therefore, a size of the $2^N$-branch nodeless Huffman tree becomes larger, which has room for improvement.

SUMMARY

According to an aspect of an embodiment, a computer-readable recording medium that stores a generating program causing a computer to execute a process that includes tabulating a number of character data types for each compression code length specified by an occurrence probability corresponding to an appearance rate of each character data appearing in an object file; determining an upper limit length N of compression code length assigned to the character data, among compression code lengths from a minimum compression code length to a maximum compression code length and based on the total number of character data types; correcting the number of character data types tabulated at the tabulating for the upper limit length N determined at the determining, to the sum of the numbers of character data types for the compression code lengths equal to or greater than the upper limit length N; and constructing a $2^N$-branch nodeless Huffman tree with the maximum branch number defined as the upper limit length N and leaves that are compression codes having compression code lengths corresponding to respective occurrence probabilities of the character data, based on the numbers of character data types for the respective compression code lengths after the correction at the correcting.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram of details of (2) Calculation of Compression Code Length (N=11) of FIG. 2;

FIG. 5 is a diagram of details of (3) Specification of Number of Leaves to (5) Generation of Leaf Structure (N=11) of FIG. 2;

FIG. 6 is a diagram of a correction result of each character data;

FIG. 14 is a diagram of details of (3) Specification of Number of Leaves to (5) Generation of Leaf Structure (N=12) of FIG. 2;

FIG. 23 is a diagram of details of (3) Specification of Number of Leaves to (5) Generation of Leaf Structure (N=13) of FIG. 2;

FIG. 35 is a diagram of a divided character code structure;

FIG. 36 is a diagram (part 1) of a special word structure;

FIG. 37 is a diagram (part 2) of a special word structure;

FIG. 40 is a diagram of a classification example of character data in UTF 16;

FIG. 41 is a diagram of a classification example of character data in ASCII code;

FIG. 42 is a diagram of a classification example of character data in shift JIS code;

FIG. 43 is a flowchart of a $2^N$-branch nodeless Huffman tree generation process procedure (first half);

FIG. 58 is a diagram of details of (3) Specification of Number of Leaves to (5) Generation of Leaf Structure (N=12) of FIG. 2 when another example of the correction B+ process depicted in FIG. 56 is applied;

FIG. 59 is a diagram of details of (3) Specification of Number of Leaves to (5) Generation of Leaf Structure (N=11) of FIG. 2 when another example of the correction B- process described above is applied;

FIG. 60 is a diagram of an example of a compression object character string;

FIG. 61 is a diagram of a compression code of the compression object character string depicted in FIG. 60;

FIG. 62 is a diagram of another example of a compression object character string;

FIG. 63 is a diagram of a compression code of the compression object character string depicted in FIG. 62;

FIG. 79 is a flowchart (part 1) of a decompression process procedure using the $2^N$-branch nodeless Huffman tree; and FIG. 80 is a flowchart (part 2) of a decompression process procedure using the $2^N$-branch nodeless Huffman tree.

DESCRIPTION OF EMBODIMENTS

Embodiments of a generating program, a generating apparatus, and a generating method according to the present invention will now be described with reference to the accompanying drawings. In this description, "character data" are data of single characters, basic words, reserved words, etc., making up text data. A single character is a character represented by one character code. A character code length of a single character differs depending on a character code type.

For example, the character code is 16-bit code in the case of Unicode Transformation Format (UTF) 16, 8-bit code in the case of American Standard Code for Information Interchange (ASCII) code, and 8-bit code in the case of Shift Japanese Industrial Standard (JIS) code. If a Japanese character is represented by the shift JIS code, two 8-bit codes are combined.

For example, words and reserved words represented by certain character strings are included along with the single characters. The words include several hundred to several thousand basic words to be learned by pupils and students in school education, for example. The basic words are frequently-appearing character strings. The reserved words are preliminarily determined character strings and include, for example, HTML tags (e.g., <br>). The basic words and the reserved words are referred to as "special words". This embodiment will be described by taking UTF 16 as an example of the character code.

Figure 1:
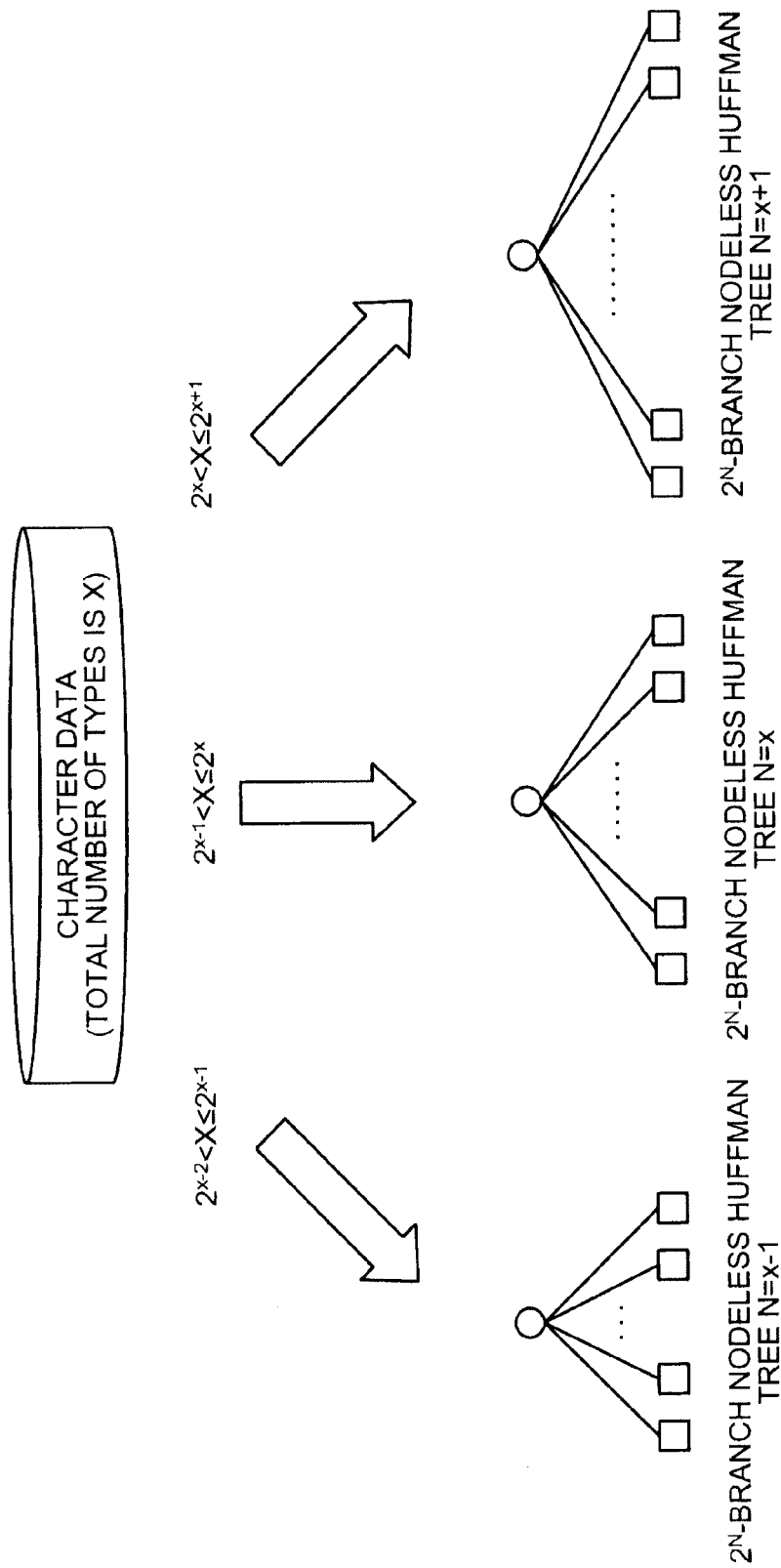
FIG. 1 is a diagram of an example of a size determining method of a $2^N$-branch nodeless Huffman tree.

FIG. 1 is a diagram of an example of a size determining method of a $2^N$-branch nodeless Huffman tree. The $2^N$-branch nodeless Huffman tree is a Huffman tree having $2^N$ branches branching from a root to directly point leaves with one or multiple branches. No node (inner node) exists. Since no node exists and leaves are directly hit, a decompression rate can be accelerated as compared to a normal Huffman tree having nodes. A leaf is a structure including corresponding character data and a compression code thereof. A leaf is also referred to as a leaf structure. The number of branches assigned to a leaf depends on a compression code length of a compression code present in the leaf to which the branches are assigned. Details thereof will be described later.

A size of the $2^N$-branch nodeless Huffman tree to be applied is determined depending on which range a total number of character data types X falls within. A size of the $2^N$-branch nodeless Huffman tree is a maximum branch number $2^N$. An exponent N is an upper limit of the compression code length. Therefore, if the size of the $2^N$-branch nodeless Huffman tree is determined, the exponent N may be determined depending on the total number of character data types X.

For example, when the total number of character data types X is $2^{x-2} < X \leq 2^{x-1}$, the Huffman tree can be constructed if the maximum branch number $2^N$ is at least $2^{x-1}$. The size may be minimized by setting N=x−1. When the total number of character data types X is $2^{x-1} < X \leq 2^x$, the Huffman tree can be constructed if the maximum branch number $2^N$ is at least $2^x$. The size may be minimized by setting N=x. When the total number of character data types X is $2^x < X \leq 2^{x+1}$, the Huffman tree can be constructed if the maximum branch number $2^N$ is at least $2^{x+1}$. The size may be minimized by setting N=x+1.

For example, if the total number of character data types X is X=1305, X is $2^{10} < X \leq 2^{11}$ and the exponent N of the maximum branch number $2^N$ is N=11. Therefore, a $2^{11}$-branch nodeless Huffman tree is generated and the character data can be compressed with a compression code having a compression code length of 11 bits at most.

If the total number of character data types X is X=3048, X is $2^{11} < X \leq 2^{12}$ and the exponent N of the maximum branch number $2^N$ is N=12. Therefore, a $2^{12}$-branch nodeless Huffman tree is generated and the character data can be compressed with a compression code having a compression code length of 12 bits at most.

If the total number of character data types X is X=5401, X is $2^{12} < X \leq 2^{13}$ and the exponent N of the maximum branch number $2^N$ is N=13. Therefore, a $2^{13}$-branch nodeless Huffman tree is generated and the character data can be compressed with a compression code having a compression code length of 13 bits at most.

Figure 2:
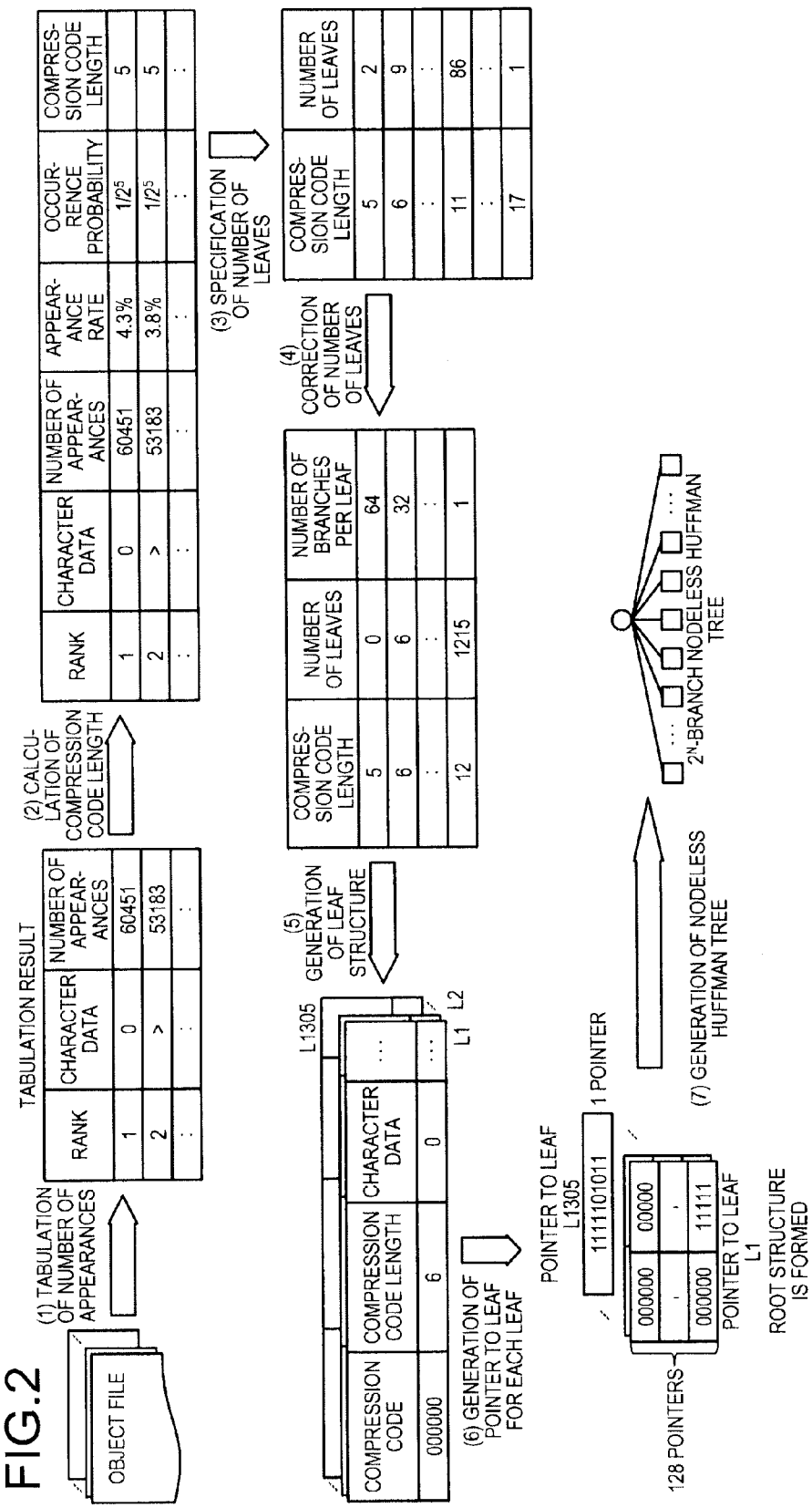
FIG. 2 is a diagram of a flow of generation of the $2^N$-branch nodeless Huffman tree.

FIG. 2 is a diagram of a flow of generation of the $2^N$-branch nodeless Huffman tree.

(1) Tabulation of Number of Appearances

The generating apparatus tabulates the number of appearances of character data present in an object file group. The object file group to be tabulated is electronic data such as document files and web pages, for example, and is electric data in text format, HyperText Markup Language (HTML) format, and Extensible Markup Language (XML) format, for example. A single object file may be an object of tabulation. A tabulation result is sorted in descending order of the number of appearances and ranks in ascending order are given from the highest number of appearances. In this description, it is assumed that the total number of character data types is 1305 ($<2048$ ($=2^{11}$)) by way of example.

(2) Calculation of Compression Code Length

The generating apparatus calculates a compression code length for each character data based on the tabulation result acquired in (1). For example, the generating apparatus calculates an appearance rate for each character data. The appearance rate can be acquired by dividing the number of appearances of each character data by the total number of appearances of all of the character data. The generating apparatus obtains an occurrence probability corresponding to the appearance rate and derives a compression code length from the occurrence probability.

The occurrence probability is expressed by $\frac{1}{2^x}$. X is an exponent. A compression code length is the exponent X of the occurrence probability. For example, the compression code length is determined depending on which of the following ranges of the occurrence probability the appearance rate falls within. AR denotes the appearance rate.

$1/2^0 > AR \geq 1/2^1$ ... A compression code length is 1 bit.

$1/2^1 > AR \geq 1/2^2$ ... A compression code length is 2 bit.

$1/2^2 > AR \geq 1/2^3$ ... A compression code length is 3 bit.

$1/2^3 > AR \geq 1/2^4$ ... A compression code length is 4 bit.

...

$1/2^{N-1} > AR \geq 1/2^N$ ... A compression code length is N bit.

(3) Specification of Number of Leaves

The generating apparatus tabulates the number of leaves for each compression code length to specify the number of leaves for each compression code length. In FIG. 2, it is assumed that the maximum compression code length is 17 bits. The number of leaves is the number of character data types. Therefore, if the number of leaves at the compression code length of 5 bits is 2, this indicates that 2 character data assigned with a 5-bit compression code are present.

(4) Correction of Number of Leaves

The generating apparatus corrects the number of leaves. For example, the generating apparatus makes corrections such that the exponent N of the upper limit $2^N$ of the number of branches is set to the maximum compression code length. For example, in the case of the exponent N=11, the sum of the number of leaves at the compression code lengths from 11 to 17 bits is defined as the corrected number of leaves at the compression code length of 11 bits. The generating apparatus assigns the number of branches per leaf for each compression code length. For example, the number of branches per leaf is determined as $2^0$, $2^1$, $2^2$, $2^3$, $2^4$, $2^5$, $2^6$, and $2^7$ for the compression code lengths after the correction in descending order.

For example, in FIG. 2, while the total number of the character data (number of leaves) assigned with a compression code having the compression code length of 11 bits is 1215, the number of branches per leaf is 1. To each character data assigned with a compression code having the compression code length of 11 bits, only one branch is assigned. On the other hand, while the total number of the character data (number of leaves) assigned with a compression code having the compression code length of 6 bits is 6, the number of branches per leaf is 32. To each character data assigned with a compression code having the compression code length of 6 bits, 32 branches are assigned.

(5) Generation of Leaf Structure

The generating apparatus then generates a leaf structure. The leaf structure is a data structure formed by correlating character data, a compression code length thereof, and a compression code having the compression code length. For example, a character "0" ranked first in the appearance ranking has a compression code length of 6 bits and a compression code of "000000". In the example of FIG. 2, the number of character data types (number of leaves) is 1305 and, therefore, structures of a leaf L1 to a leaf L1305 are generated.

(6) Generation of Pointer to Leaf

The generating apparatus then generates a pointer to leaf for each leaf structure. The pointer to leaf is a bit string acquired by connecting a compression code in a leaf structure to be pointed and a bit string corresponding to one of numbers corresponding to branches per leaf. For example, since the compression code length of the compression code "000000" assigned to the character "0" of the leaf L1 is 6 bits, the number of branches of the leaf L1 is 32.

Therefore, the leading 6 bits of the pointers to the leaf L1 indicate the compression code "000000". The subsequent bit strings are 32 ($=2^5$) types of bit strings represented by the number of branches for the leaf L1. As a result, 32 types of 5-bit bit strings are subsequent bit strings of the compression code "000000". Therefore, the pointers to the leaf L1 are 32 types of 11-bit bit strings with the leading 6 bits fixed to "000000". If the number of branches per leaf is one, one pointer to leaf exists, and the compression code and the pointer to leaf are the same bit strings.

(7) Construction of $2^N$-Branch Nodeless Huffman Tree

Lastly, the generating apparatus constructs a $2^N$-branch nodeless Huffman tree. For example, pointers to leaf are used as a root to construct the $2^N$-branch nodeless Huffman tree that directly specifies leaf structures. If the compression code string is an 11-bit bit string having "000000" as the leading 6 bits, the structure of the leaf L1 of the character "0" can be pointed through the $2^N$-branch nodeless Huffman tree regardless of which one of 32 types of bit strings corresponds to the subsequent 5 bits.

Figure 3:
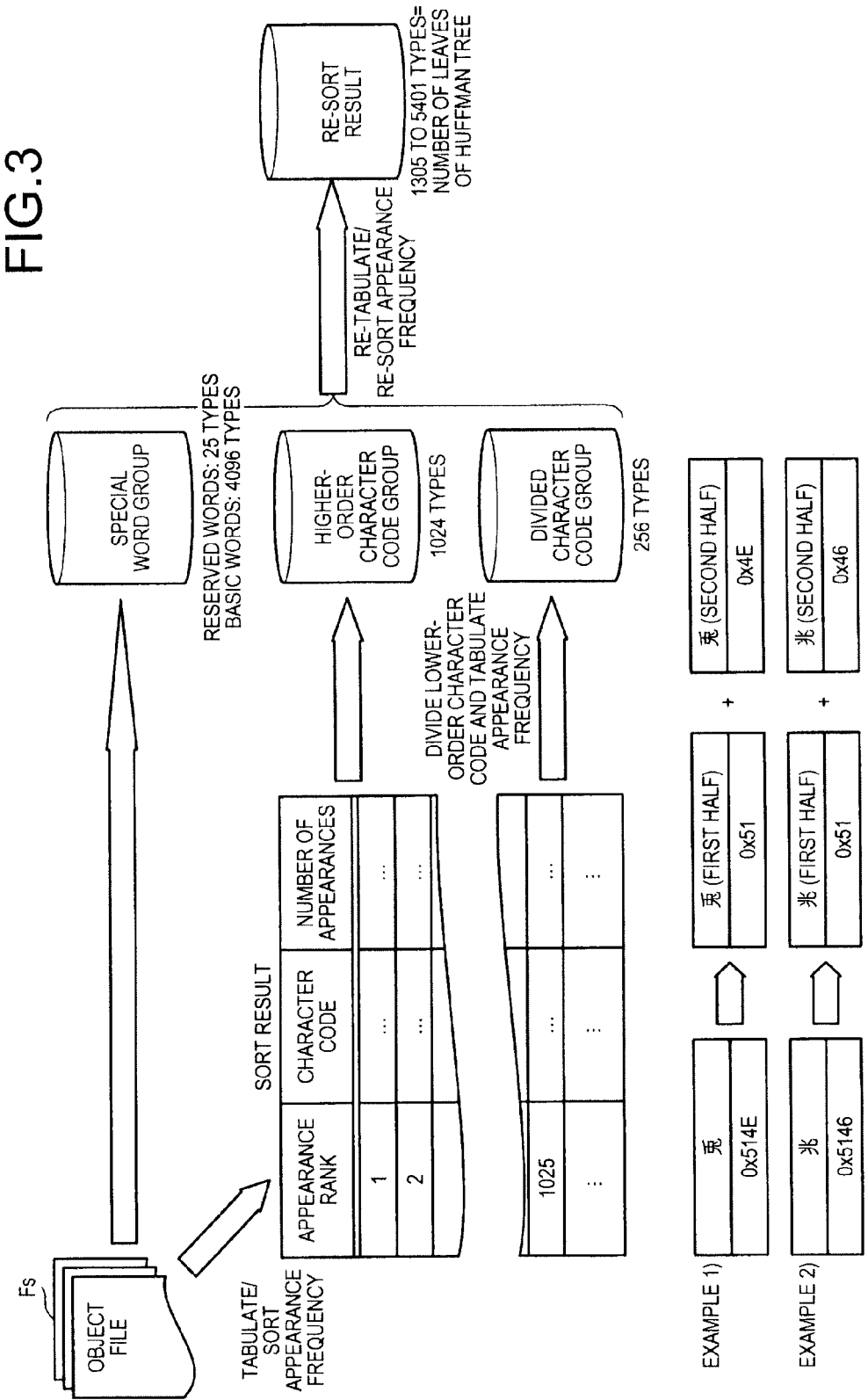
FIG. 3 is a diagram of details of (1) Tabulation of Number of Appearances of FIG. 2.

FIG. 3 is a diagram of details of (1) Tabulation of Number of Appearances of FIG. 2. The generating apparatus tabulates the numbers of appearances of character codes in an object file group Fs and sorts the character codes in descending order. The generating apparatus divides the character codes into higher-order (e.g., first to 1024th) character codes and lower-order (1025th or lower) character codes.

Since a higher-order character code has high frequency of appearance, a 16-bit code is assigned as a compression code. A lower-order character code is divided into upper 8 bits and lower 8 bits. Although up to 65536 (256×256) types of characters can be supported by 16-bits codes, the division of a lower-order character code by 8 bits can suppress sixty thousand or more types of the lower-order character codes to 256 types of divided character codes.

For example, a 16-bit character code of a Kanji character 兇 is "0x514E" and therefore divided into upper 8 bits "0X51" and lower 8 bits "0x4E". Similarly, a 16-bit character code of a Kanji character 兆 is "0x5146" and therefore divided into upper 8 bits "0X51" and lower 8 bits "0x46". The appearance frequency of the eight-bit divided character codes after the division is tabulated. In the example of 兇 and 兆, the appearance frequency is twice for the divided character code "0x51" and once for the divided character codes "0x4E" and "0x46".

Tags such as <p> and <p/> etc., are defined as the reserved words. Several tens of (e.g., 25) reserved words are defined in advance. The basic words are defined in advance as needed. By way of example, 4096 basic words are defined. The higher-order character code group, the divided character code group, the reserved word group, and the basic word group are mixed to re-tabulate the appearance frequencies and are re-sorted in descending order of the appearance frequency. The re-sort result is a tabulation result of FIG. 1.

If the basic word group is not tabulated, 1305 types of character data sorted in descending order of the appearance frequency are acquired. By suppressing the number of character data types to this level, a 16-bit character code can be compressed into a compression code less than or equal to 12 bits and the compression code can be decompressed into the 16-bit character code.

If the basic word group is tabulated, 5401 types of character data sorted in descending order of the appearance frequency are acquired. If 4096 types of basic words are tabulated, a 16-bit character code can be compressed into a compression code less than or equal to 13 bits and the compression code can be decompressed into the 16-bit character code. Since a basic word is a character string of multiple connected 16-bit codes, if the number of characters is n, an n×16-bit code can be compressed into a compression code less than or equal to 13 bits and the compression rate can be improved. The compression code can be decompressed into the n×16-bit character code and the decompression rate can be accelerated.

FIG. 4 is a diagram of details of (2) Calculation of Compression Code Length (N=11) of FIG. 2. A character data table of FIG. 4 is a table reflecting the tabulation result of FIG. 3 and has a rank field, decompression type field, a code field, a character field, an appearance number field, a total number field, an appearance rate field, an uncorrected occurrence probability field, and a compression code length field set for each character data. Among these fields, fields from the rank field to the total number field have information acquired as a re-sort result of FIG. 3.

In the rank field, ranks (in ascending order) are written in descending order of the number of appearances of character data. In the decompression type field of character data fields, types of character data are written. A 16-bit code (single character) is denoted by "16". An 8-bit divided character code is denoted by "8". "SPECIAL" indicates a special word (basic word or reserved word).

In the code field of the character data fields, a character or a divided character code is written. In the case of a special word, this field is left blank. In the character field of the character data fields, a character or a special word is written. In the case of a divided character code, this field is left blank. In the appearance number field, the number of appearances of character data in the object file group is written. In the total number field, the total number of appearances of all of the character data is written.

In the appearance rate field, a value acquired by dividing the number of appearances by the total number is written as an appearance rate. In the occurrence probability field of uncorrected fields, occurrence probability corresponding to the appearance rate is written. In the compression code length field, a compression code length corresponding to the occurrence probability, i.e., an exponent y of the occurrence probability $½^y$ is written as a compression code length.

FIG. 5 is a diagram of details of (3) Specification of Number of Leaves to (5) Generation of Leaf Structure (N=11) of FIG. 2. A result of tabulation of the number of leaves (the total number of character data types) on the basis of the compression code length in the character data table of FIG. 4 is the uncorrected number of leaves in FIG. 5. Correction A is correction for aggregating the number of leaves assigned to compression code lengths greater than or equal to the upper limit length N of the compression code length (i.e., the exponent N of the maximum branch number $2^N$ of the $2^N$-branch nodeless Huffman tree) to the upper limit length N of the compression code length. In this case, although the maximum compression code length before the correction is 17 bits, the total number of character data types is 1305 and, therefore, the upper limit length N of the compression code length is N=11. Thus, with the correction A, the number of leaves at the compression code length of 11 bits is set to the sum of the numbers of leaves at the compression code lengths from 11 to 17 bits (1190).

The generating apparatus obtains the total occurrence probability. Since the occurrence probability of each compression code length is determined ($½^5$ in the case of 5 bits), a multiplication result of each compression code length is acquired by multiplying the occurrence probability by the number of leaves for each compression code length. For example, the number of leaves at the compression code length of 5 bits with the correction A is 2. The occurrence probability of the compression code length of 5 bits is $½^5$. Therefore, the occurrence probability of the compression code length of 5 bits with the correction A is $2×(½^5)=½^4$. The compression code length occurrence probability with the correction A is also obtained for the compression code length greater than or equal to 6 bits. By summing the occurrence probabilities of the compression code lengths after the correction A, the total occurrence probability with the correction A is acquired.

The generating apparatus determines whether the total occurrence probability is less than or equal to one. A threshold value t is $0<t≤1$. If it is not desired to provide the threshold value t, t=1 may be used. If less than the threshold value t, a shift to correction B is made. If greater than or equal to the threshold value t and less than or equal to one, the number of leaves at each compression code length at this point is fixed without shifting to the correction B.

The correction B is correction for updating the number of leaves without changing the compression code lengths (5 bits to 12 bits) in the correction A. For example, this is the correction performed if the total occurrence probability with the correction A is not greater than or equal to the threshold value t or not less than or equal to one. In particular, the correction B includes 2 types.

In one type of the correction, if the total occurrence probability is less than the threshold value t, the total occurrence probability is increased until the maximum value of the total occurrence probability less than or equal to one is acquired, for example, until the total occurrence probability converges to a maximum asymptotic value (hereinafter, correction $B^+$). In the other type of the correction, if the total occurrence probability is greater than one, the total occurrence probability is reduced until the maximum value less than or equal to one is acquired after the total occurrence probability becomes less than one, for example, until the total occurrence probability converges to a maximum asymptotic value (hereinafter, correction $B^-$).

In the example depicted in FIG. 5, since the total occurrence probability with the correction A is "1.146", the correction $B^-$ is performed. The same correction is performed by dividing the number of leaves by the total occurrence probability in the correction B regardless of whether the correction $B^+$ or correction $B^-$.

At the first time of the correction $B^-$ (correction $B^-1$), the number of leaves with the correction A at each compression code length is divided by the total occurrence probability (1.146) of the previous correction (the correction A in this case) to update the number of leaves. Figures after the decimal point may be rounded down or rounded off. For the upper limit N of the compression code length in the correction A (N=11 bits), the number of leaves at the upper limit N of the compression code length is obtained by subtracting the total number of leaves with the correction $B^-1$ at the compression code lengths (except the number of leaves at the upper limit length N of the compression code length) from the total number of leaves (1305) rather than dividing by the total occurrence probability (1.146) of the previous correction (the correction A in this case). In this case, the number of leaves is 1208.

The generating apparatus subsequently obtains the total occurrence probability with the correction $B^-1$ from the computing process same as the case of the correction A. The generating apparatus then determines whether the total occurrence probability with the correction $B^-1$ converges to the maximum asymptotic value less than or equal to one. If the total occurrence probability with the correction $B^-1$ does not converge to the maximum asymptotic value less than or equal to one, a shift to the second correction $B^-$ (correction $B^-2$) is made. If converging to the maximum asymptotic value, the number of leaves at each compression code length at this point is fixed without shifting to the correction $B^-2$. Since the total occurrence probability "1.042" updated with the correction $B^-1$ is greater than one and does not converge to the maximum asymptotic value, the shift to the correction $B^-2$ is made.

In the correction $B^-2$, the number of leaves with the correction $B^-1$ at each compression code length is divided by the total occurrence probability (1.042) of the previous correction (the correction $B^-1$ in this case) to update the number of leaves. Figures after the decimal point may be rounded down or rounded off. For the upper limit N of the compression code length in the correction $B^-1$ (N=11 bits), the number of leaves at the upper limit N of the compression code length is obtained by subtracting the total number of leaves with the correction $B^-2$ at the compression code lengths (except the number of leaves at the upper limit length N of the compression code length) from the total number of leaves (1305) rather than dividing by the total occurrence probability (1.042) of the previous correction (the correction $B^-1$ in this case). In this case, the number of leaves is 1215.

The generating apparatus subsequently obtains the total occurrence probability with the correction $B^-2$ from the computing process same as the case of the correction $B^-1$. The generating apparatus then determines whether the total occurrence probability with the correction $B^-2$ converges to the maximum asymptotic value less than or equal to one. If the total occurrence probability with the correction B⁻2 does not converge to the maximum asymptotic value less than or equal to one, a shift to the third correction B⁻ (correction B⁻3) is made. If converging to the maximum asymptotic value, the number of leaves at each compression code length at this point is fixed without shifting to the correction B⁻3. Although the total occurrence probability "0.982" updated with the correction B⁻2 is less than or equal to one, it is unknown whether the total occurrence probability converges to the maximum asymptotic value and, therefore, the shift to the correction B⁻3 is made.

In the correction B⁻3, the number of leaves with the correction B⁻2 at each compression code length is divided by the total occurrence probability (0.982) of the previous correction (the correction B⁻2 in this case) to update the number of leaves. Figures after the decimal point may be rounded down or rounded off. For the upper limit N of the compression code length in the correction B⁻2 (N=11 bits), the number of leaves at the upper limit N of the compression code length is obtained by subtracting the total number of leaves with the correction B⁻3 at the compression code lengths (except the number of leaves at the upper limit length N of the compression code length) from the total number of leaves (1305) rather than dividing by the total occurrence probability (0.983) of the previous correction (the correction B⁻2 in this case). In this case, the number of leaves is 1215.

The generating apparatus subsequently obtains the total occurrence probability with the correction B⁻3 from the computing process same as the case of the correction B⁻2. The generating apparatus then determines whether the total occurrence probability with the correction B⁻3 converges to the maximum asymptotic value less than or equal to one. If the total occurrence probability with the correction B⁻3 does not converge to the maximum asymptotic value less than or equal to one, a shift to the fourth correction B⁻ (correction B⁻4) is made. If converging to the maximum asymptotic value, the number of leaves at each compression code length at this point is fixed without shifting to the correction B⁻4. The total occurrence probability "0.982" updated with the correction B⁻3 is the same value as the total occurrence probability "0.982" updated with the correction B⁻2. In other words, the numbers of leaves at the compression code lengths with the correction B⁻3 are the same as the numbers of leaves at the compression code lengths with the correction B⁻2. In this case, the generating apparatus determines that the total occurrence probability converges to the maximum asymptotic value and the numbers of leaves are fixed.

As described above, the correction B⁻ is continued until the numbers of leaves are fixed. In the example of FIG. 5, the number of leaves at each compression code length is fixed with the correction B⁻3. Subsequently, the generating apparatus calculates the number of branches per leaf for each compression code length. In the calculation of the number of branches per leaf, as described above, the number of branches per leaf is assigned in descending order from the upper limit length N of the compression code length (N=11 bits in this case) as $2^0$, $2^1$, $2^2$, $2^3$, $2^4$, $2^5$, and $2^6$. A subtotal of the number of branches is a multiplication result of multiplying the number of branches per leaf by the fixed number of leaves for each compression code length.

FIG. 6 is a diagram of a correction result of each character data. In FIG. 6, the correction results of the correction A and the corrections B⁻1 to B⁻2 are added to the character data table. Since the number of leaves at each compression code length is updated by the correction as depicted in FIG. 5, the compression code lengths are assigned in order such that the character data ranked first in the rank field has the shortest compression code length.

For example, if fixed with the correction B⁻2, the number of leaves is 6 at the compression code length of 6 bits; the number of leaves is 18 at the compression code length of 7 bits; . . . ; and the number of leaves is 1215 at the compression code length of 11 bits. Therefore, the compression code length of 6 bits is assigned to the character data ranked in the first to sixth places (corresponding to 6 leaves); the compression code length of 7 bits is assigned to the character data ranked in the 7th to 24th places (corresponding to 18 leaves); . . . ; and the compression code length of 11 bits is assigned to the character data ranked in the 91st to 1305th places (corresponding to 1215 leaves).

The generating apparatus assigns a compression code to each character data to generate a leaf structure based on the character data, the compression code length assigned to the character data, and the number of leaves at each compression code length. For example, since the compression code length of 6 bits is assigned to the higher-order character "0" ranked first for the appearance rate, the compression code thereof is "000000". Therefore, a structure of a leaf L1 is generated that includes the compression code "000000", the compression code length "6", and the character data "0".

Figure 7:
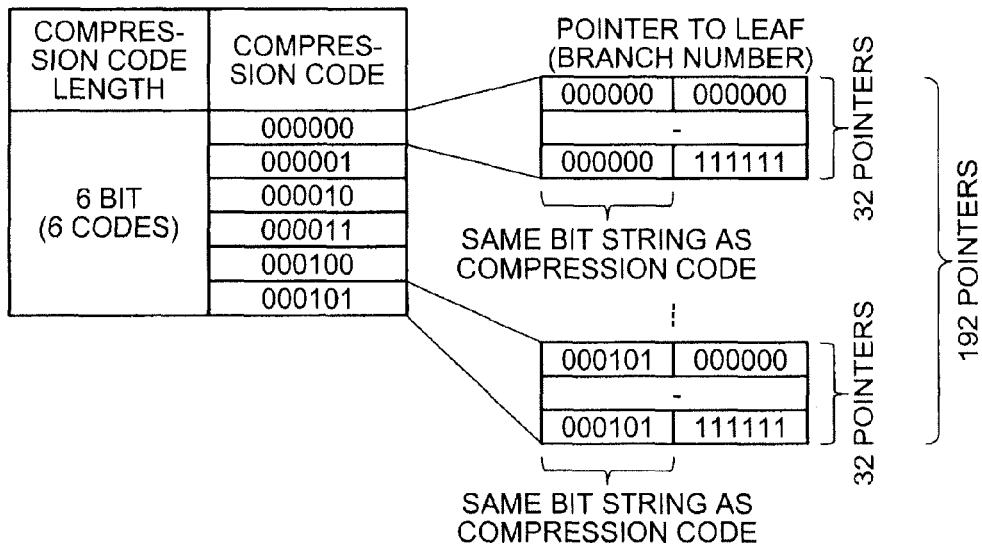
FIG. 7 is a diagram (part 1) of details of Generation of Pointer to Leaf (N=11)

FIGS. 7 to 12 are diagrams of details of Generation of Pointer to Leaf (N=11). FIGS. 7 to 12 depict a pointer to a leaf when the upper limit N of the compression code length is 11 bits. In FIG. 7, since the number of leaves is 6 at the compression code length of 6 bits, compression codes "000000" to "000101" are assigned. The number of branches per leaf is 32 when the compression code length is 6 bits. Therefore, 32 ($=2^5$) pointers to leaf are generated for a compression code having the compression code length of 6 bits. For example, the leading 6 bits of the pointers to leaf represent a compression code and the subsequent 5 bits represent 32 types of bit strings. Therefore, 32 types of the pointers to leaf are generated for each of the compression codes having the compression code length of 6 bits.

Figure 8:
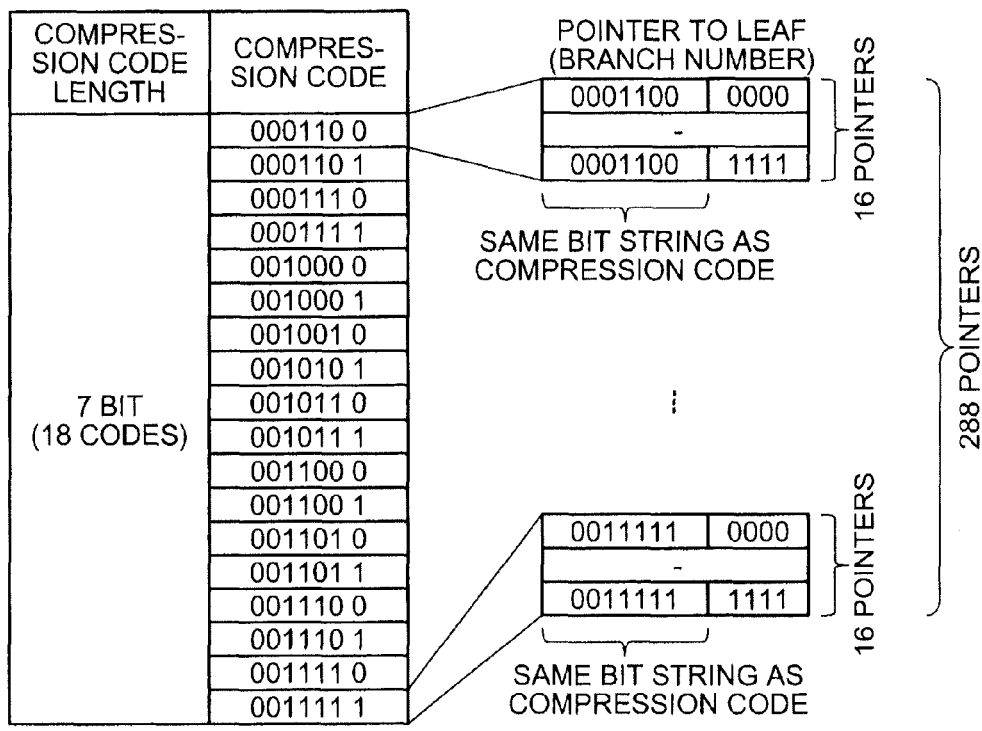
FIG. 8 is a diagram (part 2) of details of Generation of Pointer to Leaf (N=11)

In FIG. 8, since the number of leaves is 18 when the compression code length is 7 bits, compression codes "0001100" to "0011111" are assigned. The number of branches per leaf is 16 when the compression code length is 7 bits. Therefore, 16 ($=2^4$) pointers to leaf are generated for a compression code having the compression code length of 7 bits. For example, the leading 7 bits of the pointers to leaf represent a compression codes and the subsequent 4 bits represent 16 types of bit strings. Therefore, 16 types of the pointers to leaf are generated for each of the compression codes having the compression code length of 7 bits.

Figure 9:
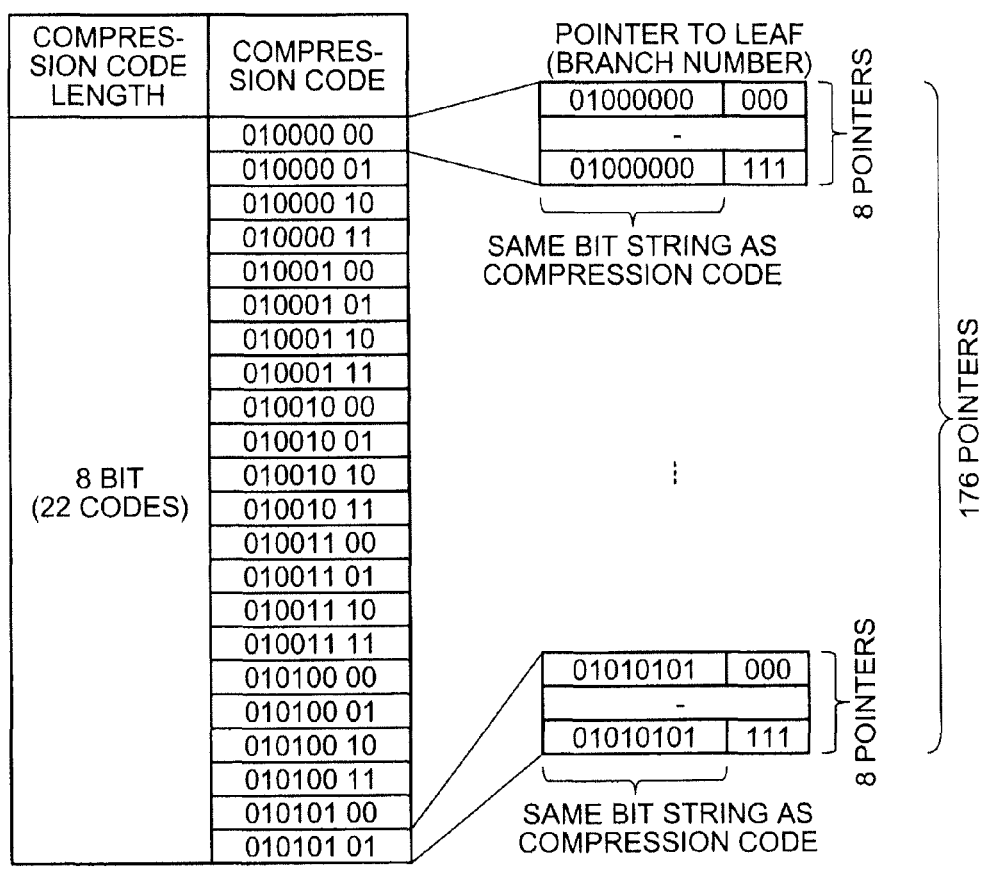
FIG. 9 is a diagram (part 3) of details of Generation of Pointer to Leaf (N=11)
Figure 10:
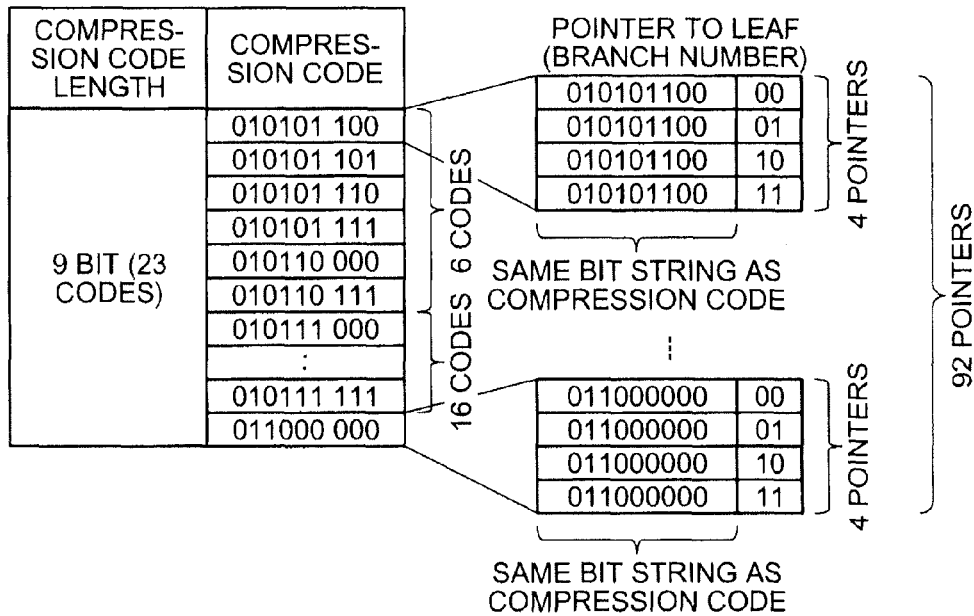
FIG. 10 is a diagram (part 4) of details of Generation of Pointer to Leaf (N=11)
Figure 12:
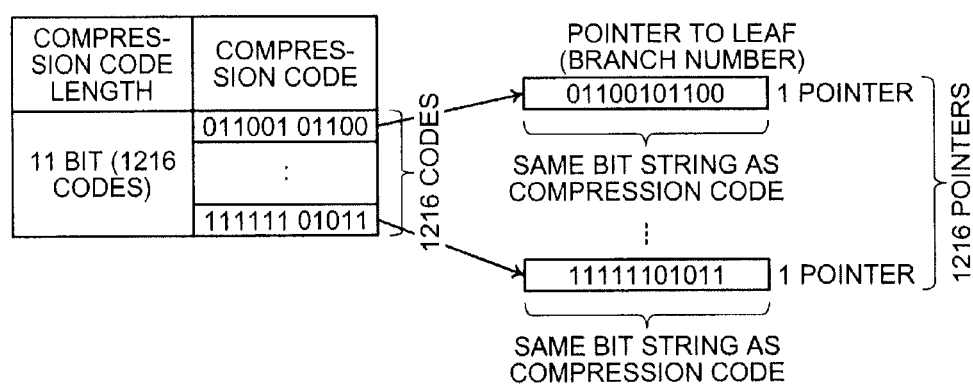
FIG. 12 is a diagram (part 6) of details of Generation of Pointer to Leaf (N=11)

Similarly, in FIG. 9, 8 types of the pointers to leaf are generated for each of the compression codes having the compression code length of 8 bits. In FIG. 10, 4 types of the pointers to leaf are generated for each of the compression codes having the compression code length of 9 bits. In FIG. 10, 2 types of the pointers to leaf are generated for each of the compression codes having the compression code length of 10 bits. In FIG. 12, one type of the pointer to leaf is generated for each of the compression codes having the compression code length of 11 bits.

Figure 13:
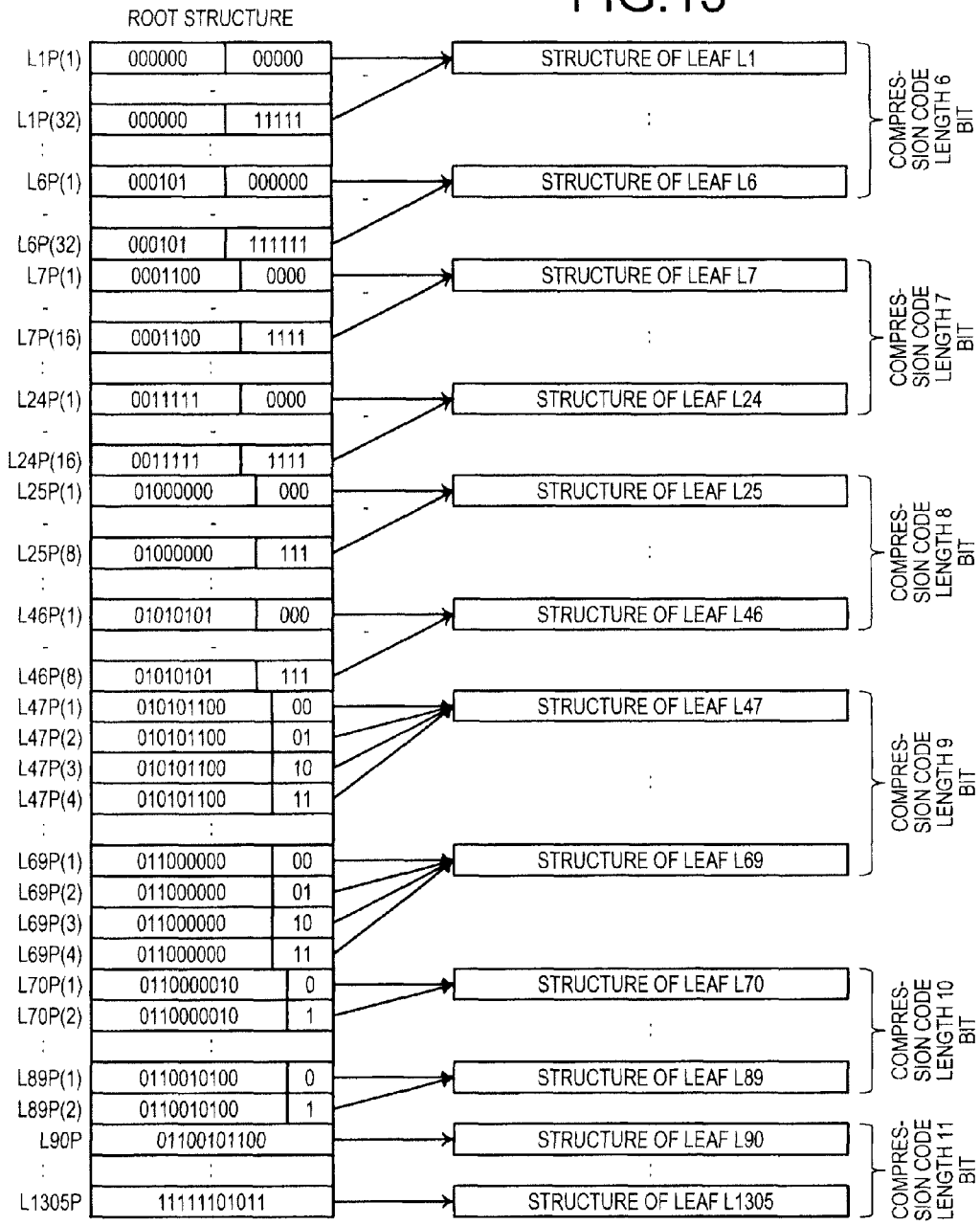
FIG. 13 is a diagram of details of (7) Construction of $2^N$-Branch Nodeless Huffman Tree (N=11) of FIG. 2.

FIG. 13 is a diagram of details of (7) Construction of $2^N$-Branch Nodeless Huffman Tree (N=11) of FIG. 2. FIG. 13 depicts a 2048($=2^{11}$)-branch nodeless Huffman tree in the case of N=11. A root structure stores the pointers to leaf. A pointer to leaf can specify a leaf structure at a pointed destination.

For example, as depicted in FIG. 7, 32 pointers to leaf are generated for a leaf structure storing a compression code having the compression code length of 6 bits. Therefore, for the structure of the leaf L1, 32 pointers L1P(1) to L1P(32) to the leaf L1 are stored in the root structure. The same applies to the structure of the leaf L2 to the structure of the leaf L6.

As depicted in FIG. 8, 16 pointers to leaf are generated for a leaf structure storing a compression code having the compression code length of 7 bits. Therefore, for the structure of the leaf L7, 16 pointers L7P(1) to L7P(16) to the leaf L7 are stored in the root structure. The same applies to the structure of the leaf L8 to the structure of the leaf L24.

As depicted in FIG. 9, 8 pointers to leaf are generated for a leaf structure storing a compression code having the compression code length of 8 bits. Therefore, for the structure of the leaf L25, 8 pointers L25P(1) to L25P(8) to the leaf L25 are stored in the root structure. The same applies to the structure of the leaf L26 to the structure of the leaf L46.

As depicted in FIG. 10, 4 pointers to leaf are generated for a leaf structure storing a compression code having the compression code length of 9 bits. Therefore, for the structure of the leaf L47, 4 pointers L47P(1) to L47P(4) to the leaf L47 are stored in the root structure. The same applies to the structure of the leaf L48 to the structure of the leaf L69.

Figure 11:
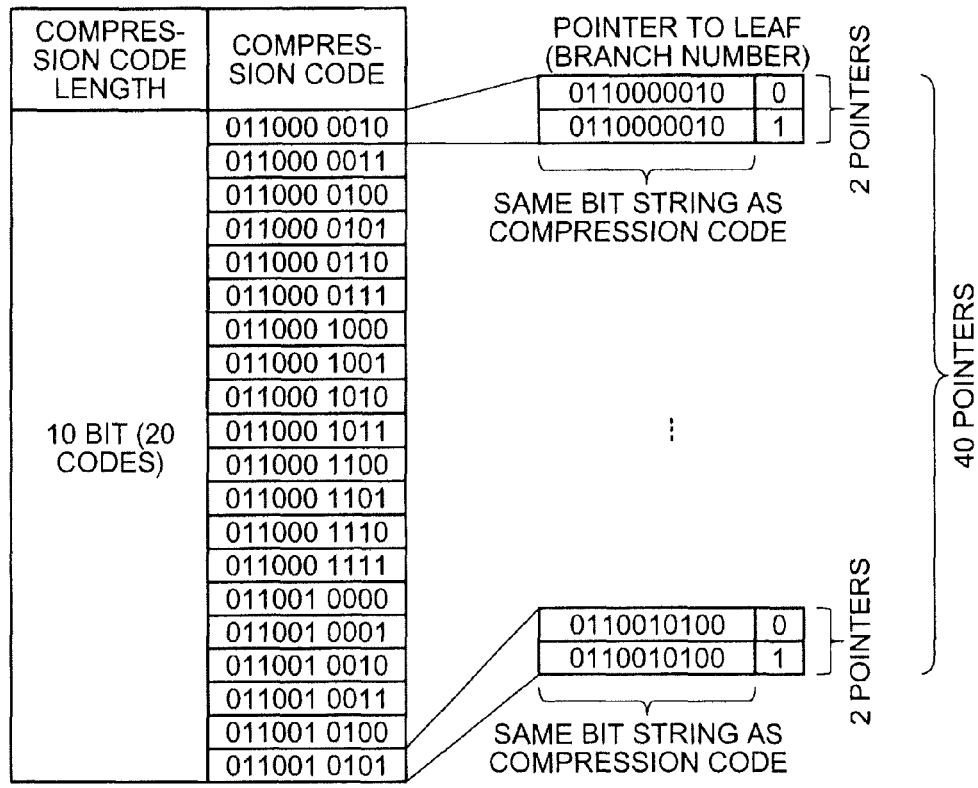
FIG. 11 is a diagram (part 5) of details of Generation of Pointer to Leaf (N=11)

As depicted in FIG. 11, 2 pointers to leaf are generated for a leaf structure storing a compression code having the compression code length of 10 bits. Therefore, for the structure of the leaf L70, 2 pointers L70P(1) to L70P(2) to the leaf L70 are stored in the root structure. The same applies to the structure of the leaf L71 to the structure of the leaf L89.

As depicted in FIG. 12, 1 pointer to leaf is generated for a leaf structure storing a compression code having the compression code length of 11 bits. Therefore, for the structure of the leaf L90, 1 pointer L90P to the leaf L90 is stored in the root structure. The same applies to the structure of the leaf L91 to the structure of the leaf L1305.

FIG. 14 is a diagram of details of (3) Specification of Number of Leaves to (5) Generation of Leaf Structure (N=12) of FIG. 2. In the case of N=12, for example, records of 1024 types of basic words are also added to the character data table of FIG. 4. It is assumed that the basic words have the number of appearances lower than 1305 types of the character codes, the divided character codes, and the reserved words. Therefore, it is assumed that a character data table is generated for 2329 types of character data acquired by adding 1024 types to 1305 types. Since the addition of the basic words changes the total number of FIG. 4, the occurrence probabilities of 2329 types of character data differ from the values depicted in FIG. 4.

As is the case with FIG. 5, the generating apparatus obtains the total occurrence probability. The generating apparatus determines whether the total occurrence probability is greater than or equal to the threshold value t and less than or equal to one. If less than the threshold value t, a shift to the correction B is made. If greater than or equal to the threshold value t and less than or equal to one, the number of leaves at each compression code length at this point is fixed without shifting to the correction B.

In the example of FIG. 14, the correction $B^-$ is performed since the total occurrence probability "0.823" with the correction A is less than the threshold value t.

At the first time of the correction $B^+$ (correction $B^+1$), the number of leaves with the correction A at each compression code length is divided by the total occurrence probability (0.823) of the previous correction (the correction A in this case) to update the number of leaves. Figures after the decimal point may be rounded down or rounded off. For the upper limit N of the compression code length in the correction A (N=12 bits), the number of leaves at the upper limit N of the compression code length is obtained by subtracting the total number of leaves with the correction $B^+1$ at the compression code lengths (except the number of leaves at the upper limit length N of the compression code length) from the total number of leaves (2329) rather than dividing by the total occurrence probability (0.823) of the previous correction (the correction A in this case). In this case, the number of leaves is 2192.

The generating apparatus subsequently obtains the total occurrence probability with the correction $B^+1$ from the computing process same as the case of the correction A. The generating apparatus then determines whether the total occurrence probability with the correction $B^+1$ converges to the maximum asymptotic value less than or equal to one. If the total occurrence probability with the correction $B^+1$ does not converge to the maximum asymptotic value less than or equal to one, a shift to the second correction $B^+$ (correction $B^+2$) is made. If converging to the maximum asymptotic value, the number of leaves at each compression code length at this point is fixed without shifting to the correction $B^+2$. Although the total occurrence probability "0.861" updated with the correction $B^+1$ is less than or equal to one, it is unknown whether the total occurrence probability converges to the maximum asymptotic value and, therefore, the shift to the correction $B^+2$ is made.

In the correction $B^+2$, the number of leaves with the correction $B^+1$ at each compression code length is divided by the total occurrence probability (0.861) of the previous correction (the correction $B^+1$ in this case) to update the number of leaves. Figures after the decimal point may be rounded down or rounded off. For the upper limit N of the compression code length in the correction $B^+2$ (N=12 bits), the number of leaves at the upper limit N of the compression code length is obtained by subtracting the total number of leaves with the correction $B^+2$ at the compression code lengths (except the number of leaves at the upper limit length N of the compression code length) from the total number of leaves (2329) rather than dividing by the total occurrence probability (0.861) of the previous correction (the correction $B^+1$ in this case). In this case, the number of leaves is 2173.

The generating apparatus subsequently obtains the total occurrence probability with the correction $B^+2$ from the computing process same as the case of the correction $B^+1$. The generating apparatus then determines whether the total occurrence probability with the correction $B^+2$ converges to the maximum asymptotic value less than or equal to one. If the total occurrence probability with the correction $B^+2$ does not converge to the maximum asymptotic value less than or equal to one, a shift to the third correction $B^+$ (correction $B^+3$) is made. If converging to the maximum asymptotic value, the number of leaves at each compression code length at this point is fixed without shifting to the correction $B^+3$. Although the total occurrence probability "0.897" updated with the correction $B^+2$ is less than or equal to one, but is larger than the total occurrence probability "0.861" updated with the correction $B^+1$. That is, the total occurrence probability with the correction $B^+1$ is not the maximum asymptotic value, and it is also unknown whether the total occurrence probability with the correction $B^+2$ converges to the maximum asymptotic value. Therefore, a shift to the correction $B^+3$ is made.

As described above, the correction B⁺ is continued until the numbers of leaves are fixed. In the example of FIG. 14, the total occurrence probability "0.984" updated with the correction B⁺10 is the same value as the total occurrence probability "0.984" updated with the correction B⁺11. In other words, the numbers of leaves at the compression code lengths with the correction B⁺10 are the same as the numbers of leaves at the compression code lengths with the correction B⁺11. In this case, the generating apparatus determines that the total occurrence probability converges to the maximum asymptotic value and the numbers of leaves are fixed.

Subsequently, the generating apparatus calculates the number of branches per leaf for each compression code length. In the calculation of the number of branches per leaf, as described above, the number of branches per leaf is assigned in descending order from the upper limit length N of the compression code length (N=12 bits in this case) as $2^0$, $2^1$, $2^2$, $2^3$, $2^4$, $2^5$, and $2^6$. A subtotal of the number of branches is a multiplication result of multiplying the number of branches per leaf by the fixed number of leaves for each compression code length.

Figure 15:
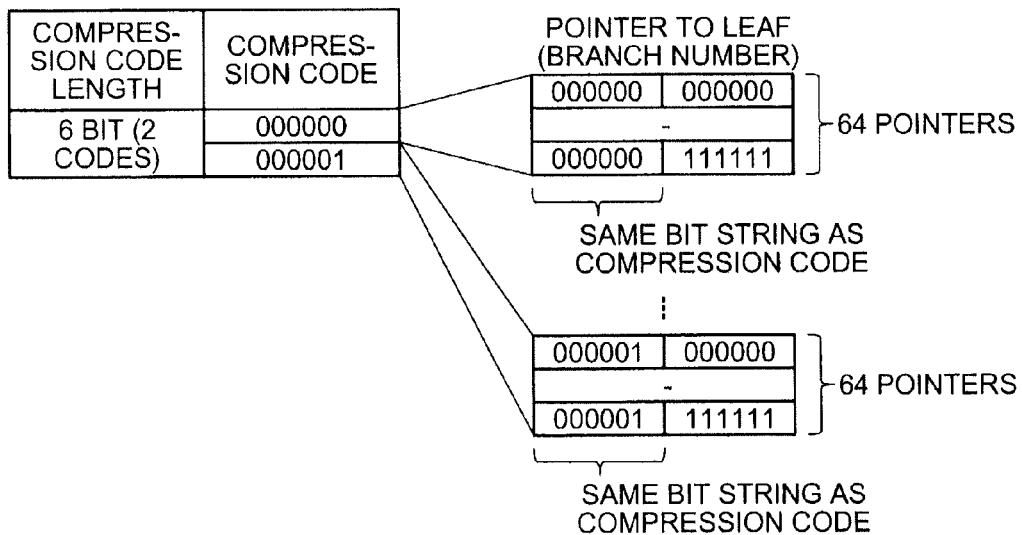
FIG. 15 is a diagram (part 1) of details of Generation of Pointer to Leaf (N=12)

FIGS. 15 to 21 are diagrams of details of Generation of Pointer to Leaf (N=12). FIGS. 15 to 21 depict a pointer to a leaf when the upper limit N of the compression code length is 12 bits. In FIG. 15, since the number of leaves is 2 at the compression code length of 6 bits, compression codes "000000" to "000001" are assigned. The number of branches per leaf is 64 when the compression code length is 6 bits. Therefore, 64 ($=2^6$) pointers to leaf are generated for a compression code having the compression code length of 6 bits. For example, the leading 6 bits of the pointers to leaf represent a compression code and the subsequent 6 bits represent 64 types of bit strings. Therefore, 64 types of the pointers to leaf are generated for each of the compression codes having the compression code length of 6 bits.

Figure 16:
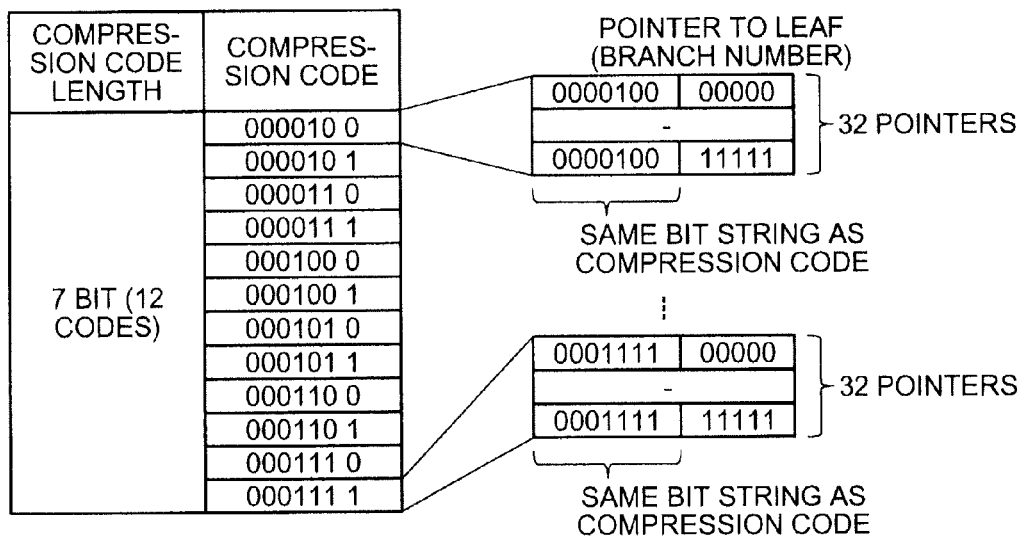
FIG. 16 is a diagram (part 2) of details of Generation of Pointer to Leaf (N=12)

In FIG. 16, since the number of leaves is 12 when the compression code length is 7 bits, compression codes "0000100" to "0001111" are assigned. The number of branches per leaf is 32 when the compression code length is 7 bits. Therefore, 32 ($=2^5$) pointers to leaf are generated for a compression code having the compression code length of 7 bits. For example, the leading 7 bits of the pointers to leaf represent a compression codes and the subsequent 5 bits represent 32 types of bit strings. Therefore, 32 types of the pointers to leaf are generated for each of the compression codes having the compression code length of 7 bits.

Figure 17:
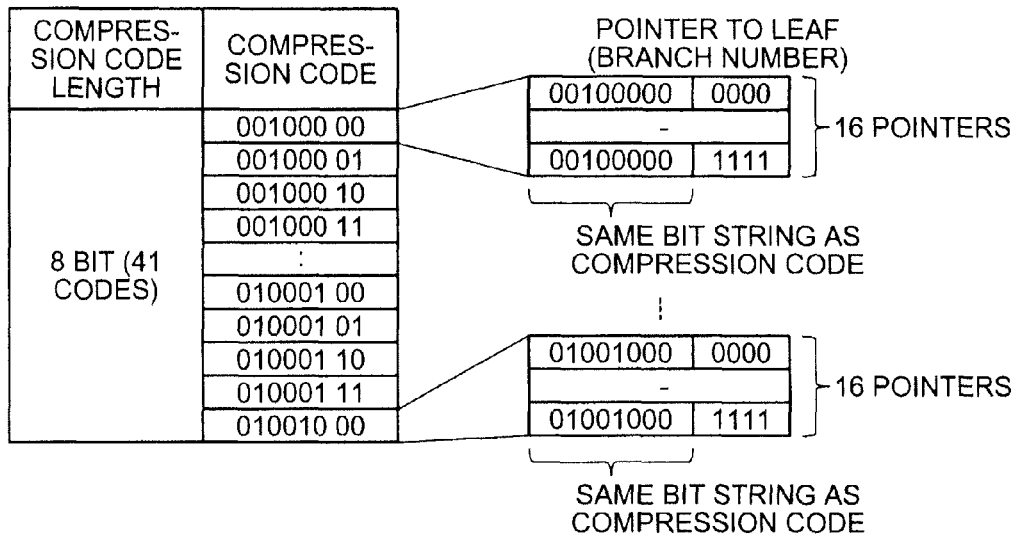
FIG. 17 is a diagram (part 3) of details of Generation of Pointer to Leaf (N=12)
Figure 18:
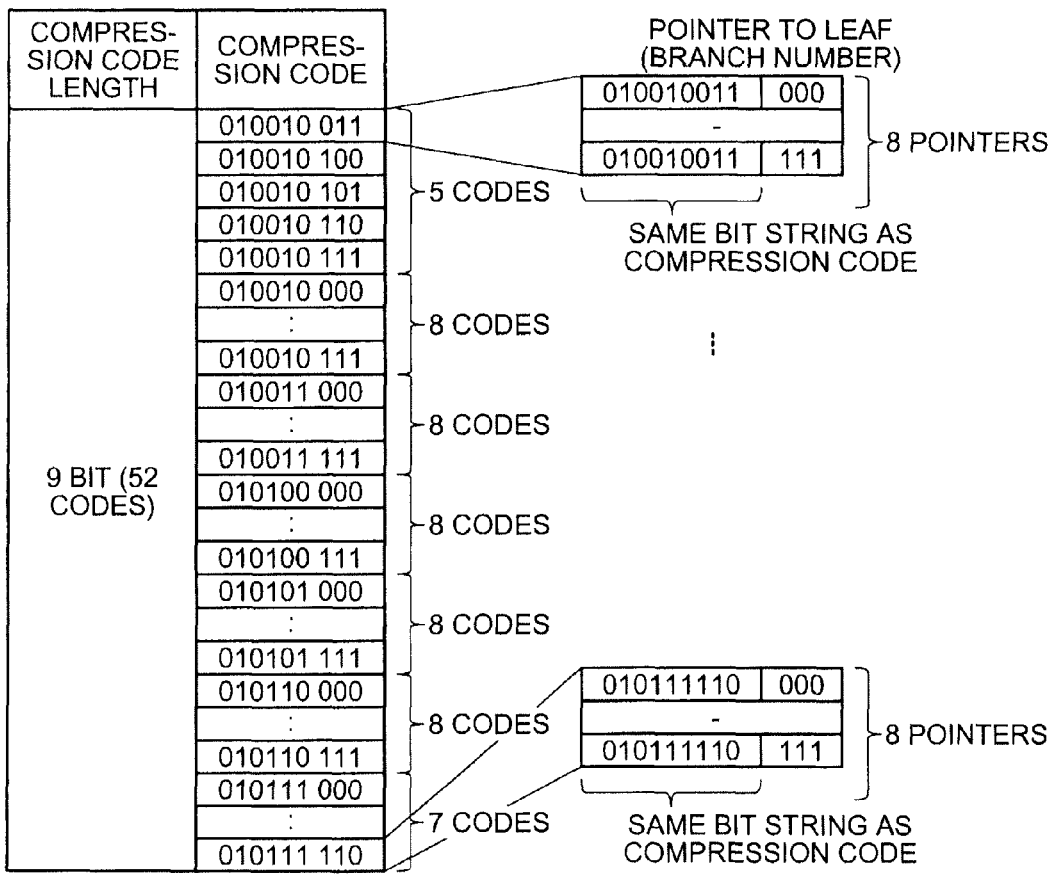
FIG. 18 is a diagram (part 4) of details of Generation of Pointer to Leaf (N=12)
Figure 19:
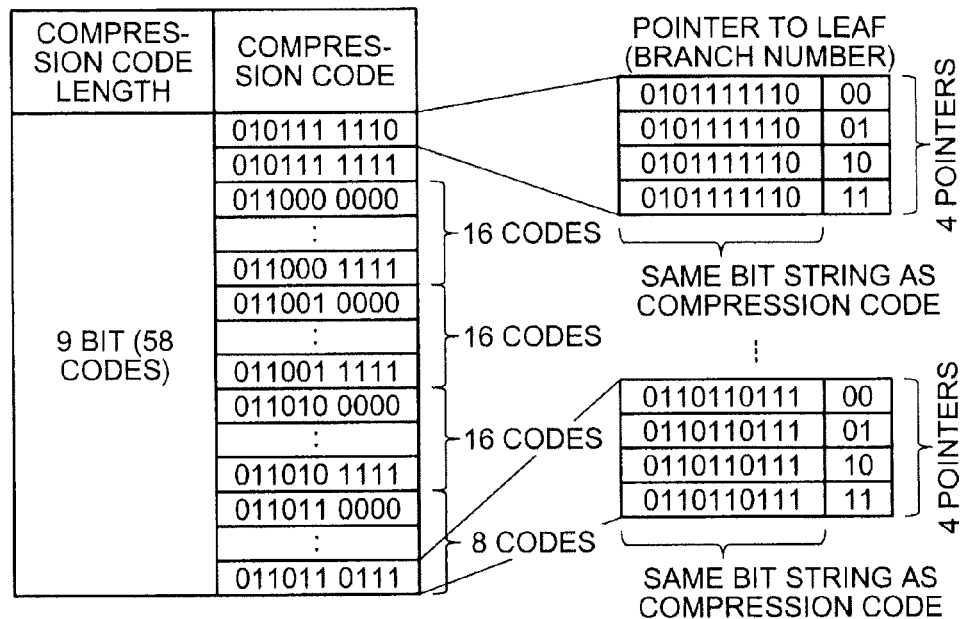
FIG. 19 is a diagram (part 5) of details of Generation of Pointer to Leaf (N=12)
Figure 20:
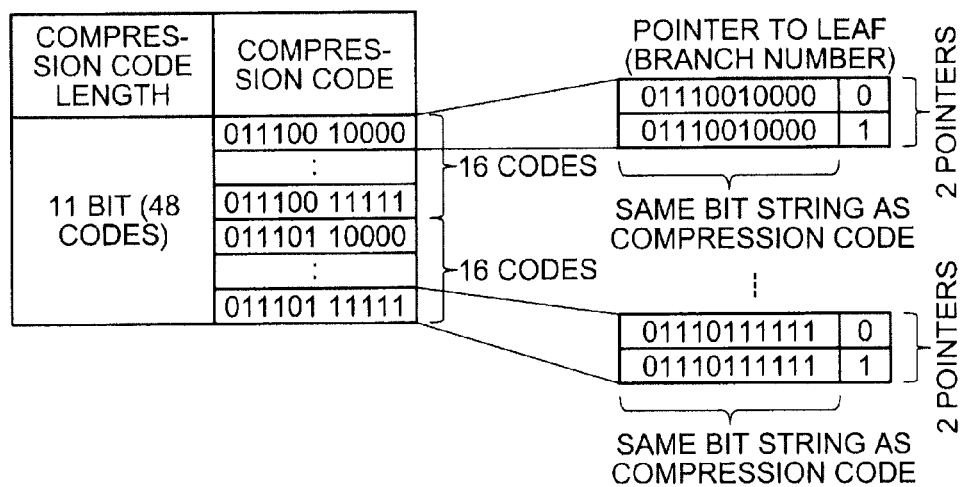
FIG. 20 is a diagram (part 6) of details of Generation of Pointer to Leaf (N=12)
Figure 21:
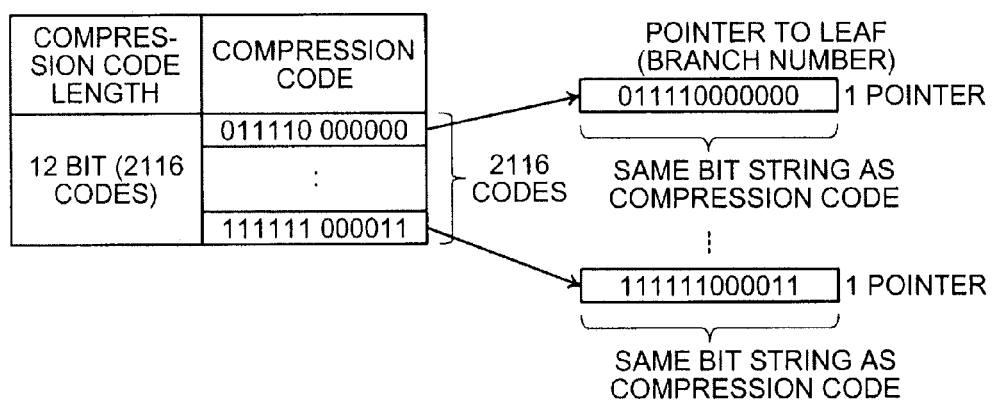
FIG. 21 is a diagram (part 7) of details of Generation of Pointer to Leaf (N=12)

Similarly, in FIG. 17, 16 types of the pointers to leaf are generated for each of the compression codes having the compression code length of 8 bits. In FIG. 18, 8 types of the pointers to leaf are generated for each of the compression codes having the compression code length of 9 bits. In FIG. 19, 4 types of the pointers to leaf are generated for each of the compression codes having the compression code length of 10 bits. In FIG. 20, 2 types of the pointers to leaf are generated for each of the compression codes having the compression code length of 11 bits. In FIG. 21, one type of the pointer to leaf is generated for each of the compression codes having the compression code length of 12 bits.

Figure 22:
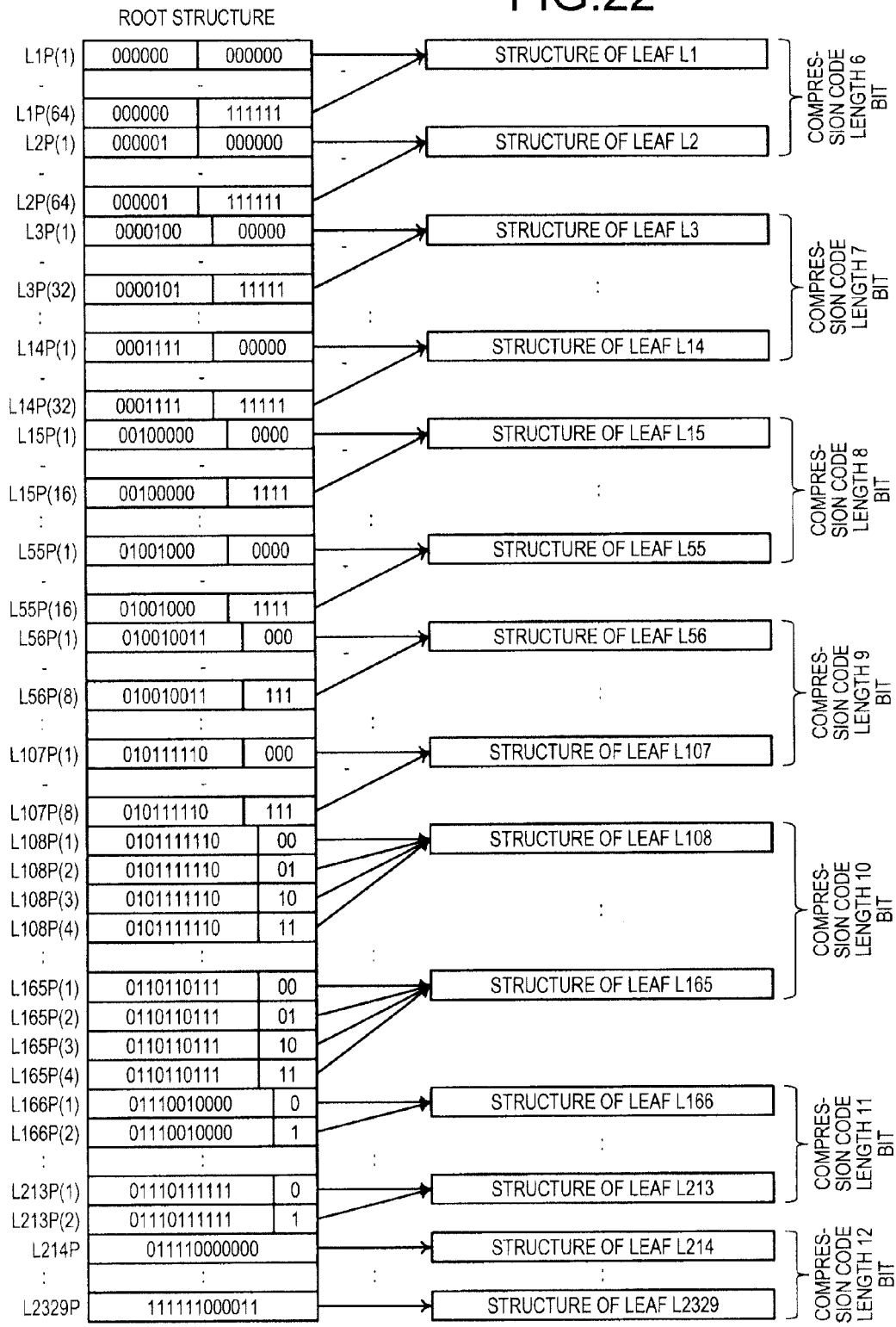
FIG. 22 is a diagram of details of (7) Construction of $2^N$-Branch Nodeless Huffman Tree (N=12)

FIG. 22 is a diagram of details of (7) Construction of $2^N$-Branch Nodeless Huffman Tree (N=12). FIG. 22 depicts a 4096($=2^{12}$)-branch nodeless Huffman tree in the case of N=12. A root structure stores the pointers to leaf. A pointer to leaf can specify a leaf structure at a pointed destination.

For example, as depicted in FIG. 15, 64 pointers to leaf are generated for a leaf structure storing a compression code having the compression code length of 6 bits. Therefore, for the structure of the leaf L1, 64 pointers L1P(1) to L1P(64) to the leaf L1 are stored in the root structure. The same applies to the structure of the leaf L2.

As depicted in FIG. 16, 32 pointers to leaf are generated for a leaf structure storing a compression code having the compression code length of 7 bits. Therefore, for the structure of the leaf L3, 32 pointers L3P(1) to L3P(32) to the leaf L3 are stored in the root structure. The same applies to the structure of the leaf L4 to the structure of the leaf L14.

As depicted in FIG. 17, 16 pointers to leaf are generated for a leaf structure storing a compression code having the compression code length of 8 bits. Therefore, for the structure of the leaf L15, 16 pointers L15P(1) to L15P(16) to the leaf L15 are stored in the root structure. The same applies to the structure of the leaf L16 to the structure of the leaf L55.

As depicted in FIG. 18, 8 pointers to leaf are generated for a leaf structure storing a compression code having the compression code length of 9 bits. Therefore, for the structure of the leaf L56, 8 pointers L56P(1) to L56P(8) to the leaf L56 are stored in the root structure. The same applies to the structure of the leaf L57 to the structure of the leaf L107.

As depicted in FIG. 19, 4 pointers to leaf are generated for a leaf structure storing a compression code having the compression code length of 10 bits. Therefore, for the structure of the leaf L108, 4 pointers L108P(1) to L108P(4) to the leaf L108 are stored in the root structure. The same applies to the structure of the leaf L109 to the structure of the leaf L165.

As depicted in FIG. 20, 2 pointers to leaf are generated for a leaf structure storing a compression code having the compression code length of 11 bits. Therefore, for the structure of the leaf L166, 2 pointers L166P(1) to L166P(2) to the leaf L166 are stored in the root structure. The same applies to the structure of the leaf L167 to the structure of the leaf L213.

As depicted in FIG. 21, 1 pointer to leaf is generated for a leaf structure storing a compression code having the compression code length of 12 bits. Therefore, for the structure of the leaf L214, 1 pointer L214P to the leaf L214 are stored in the root structure. The same applies to the structure of the leaf L215 to the structure of the leaf L2329.

FIG. 23 is a diagram of details of (3) Specification of Number of Leaves to (5) Generation of Leaf Structure (N=13) of FIG. 2. In the case of N=13, for example, records of 4096 types of basic words are also added to the character data table of FIG. 3. It is assumed that the basic words have the number of appearances lower than 1305 types of the character codes, the divided character codes, and the reserved words. Therefore, it is assumed that a character data table is generated for 5401 types of character data acquired by adding 4096 types to 1305 types. Since the addition of the basic words changes the total number of FIG. 4, the occurrence probabilities of 5401 types of character data differ from the values depicted in FIG. 4. In the example depicted in FIG. 23, since the total occurrence probability with the correction A is "0.877", the correction B⁺ is performed.

Figure 24:
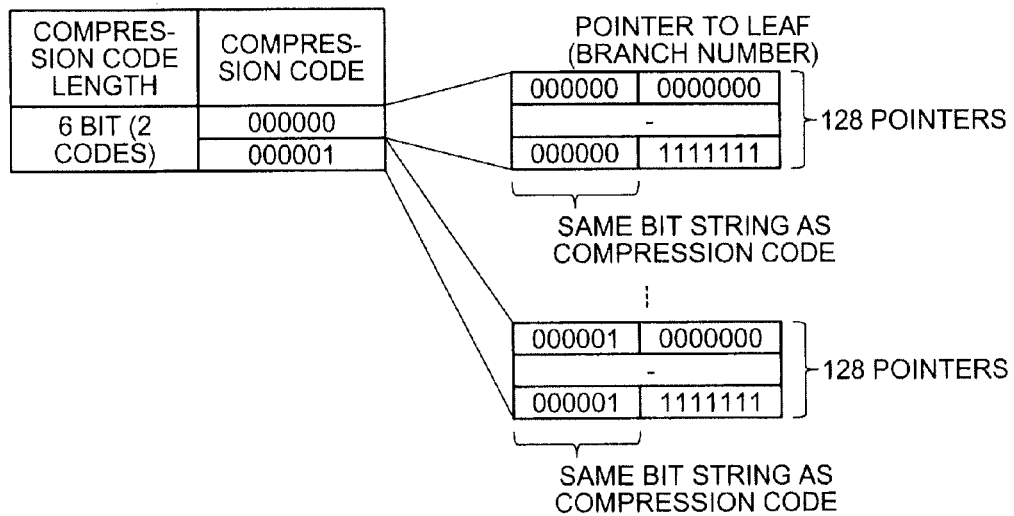
FIG. 24 is a diagram (part 1) of details of Generation of Pointer to Leaf (N=13)

FIGS. 24 to 31 are diagrams of details of (6) Generation of Pointer to Leaf (N=13). FIGS. 24 to 31 depict a pointer to a leaf when the upper limit N of the compression code length is 13 bits. In FIG. 24, since the number of leaves is 2 at the compression code length of 6 bits, compression codes "000000" to "000001" are assigned. The number of branches per leaf is 128 when the compression code length is 6 bits. Therefore, 128 ($=2^7$) pointers to leaf are generated for a compression code having the compression code length of 6 bits. For example, the leading 6 bits of the pointers to leaf represent a compression code and the subsequent 7 bits represent 128 types of bit strings. Therefore, 128 types of the pointers to leaf are generated for each of the compression codes having the compression code length of 6 bits.

Figure 25:
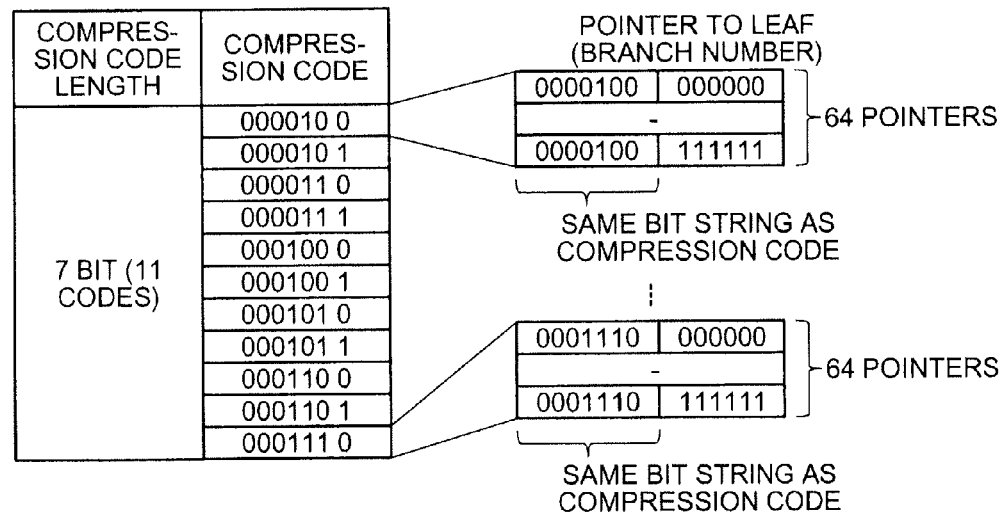
FIG. 25 is a diagram (part 2) of details of Generation of Pointer to Leaf (N=13)

In FIG. 25, since the number of leaves is 11 when the compression code length is 7 bits, compression codes "0000100" to "0001110" are assigned. The number of branches per leaf is 64 when the compression code length is 7 bits. Therefore, 64 (=$2^6$) pointers to leaf are generated for a compression code having the compression code length of 7 bits. For example, the leading 7 bits of the pointers to leaf represent a compression codes and the subsequent 6 bits represent 64 types of bit strings. Therefore, 64 types of the pointers to leaf are generated for each of the compression codes having the compression code length of 7 bits.

Figure 26:
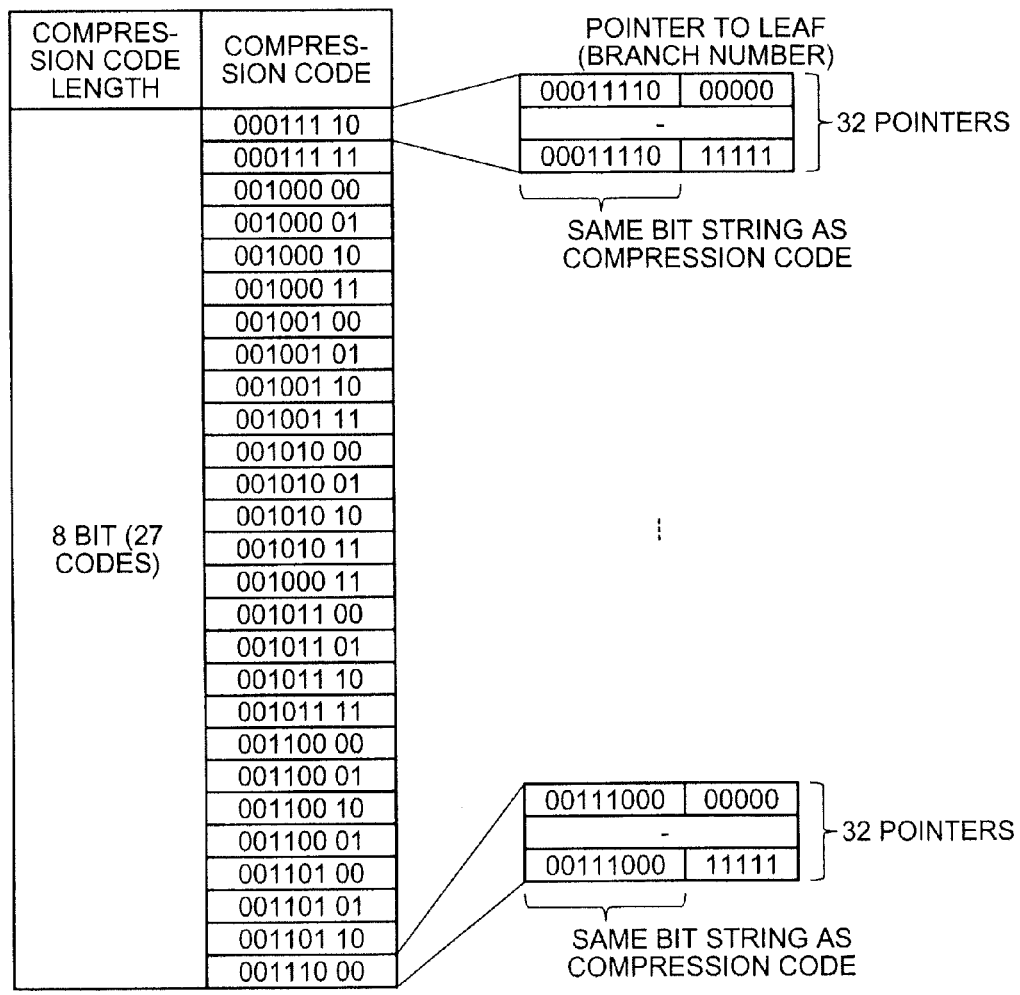
FIG. 26 is a diagram (part 3) of details of Generation of Pointer to Leaf (N=13)
Figure 27:
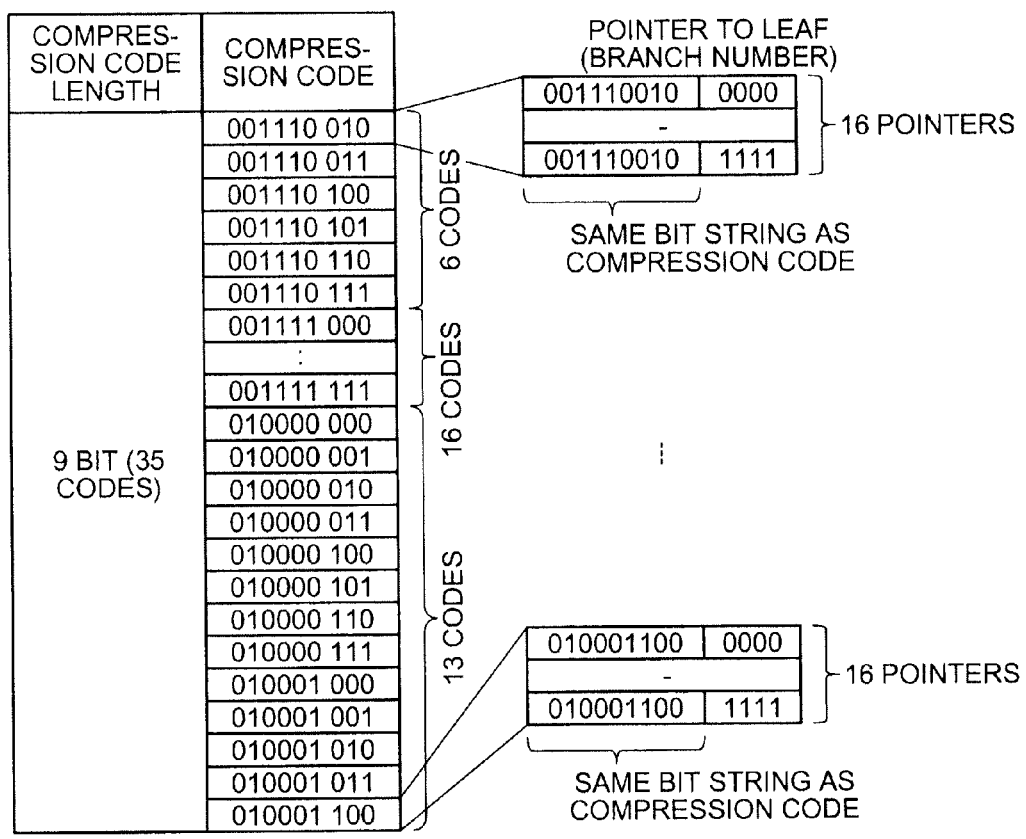
FIG. 27 is a diagram (part 4) of details of Generation of Pointer to Leaf (N=13)
Figure 28:
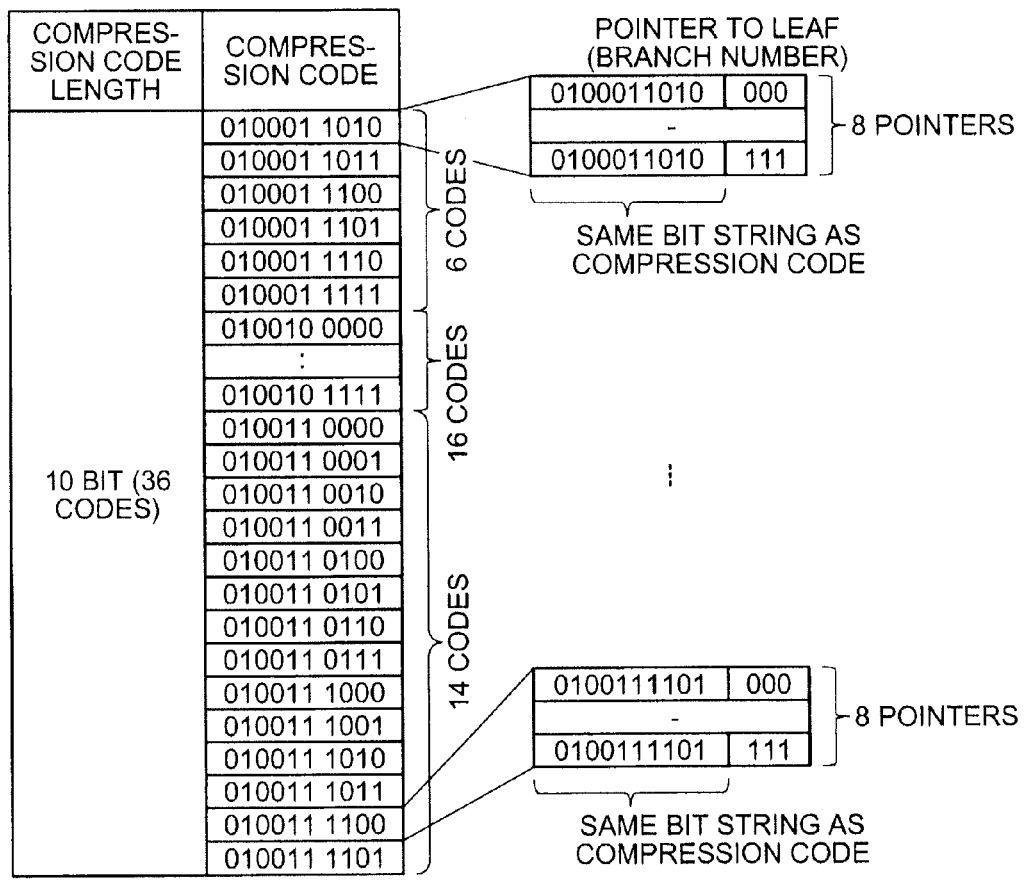
FIG. 28 is a diagram (part 5) of details of Generation of Pointer to Leaf (N=13)
Figure 29:
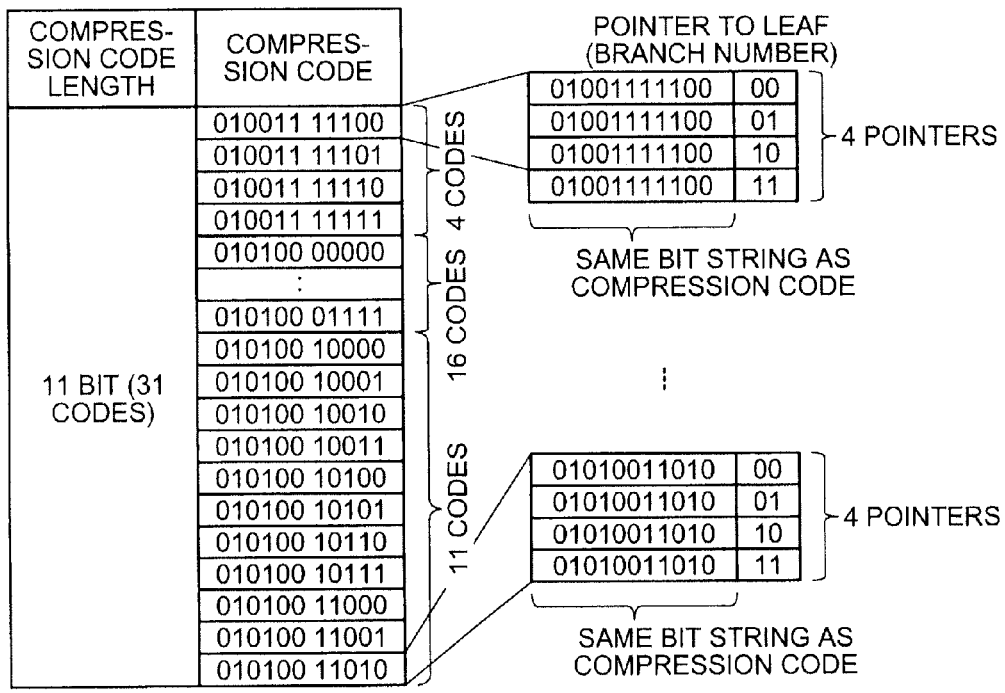
FIG. 29 is a diagram (part 6) of details of Generation of Pointer to Leaf (N=13)
Figure 30:
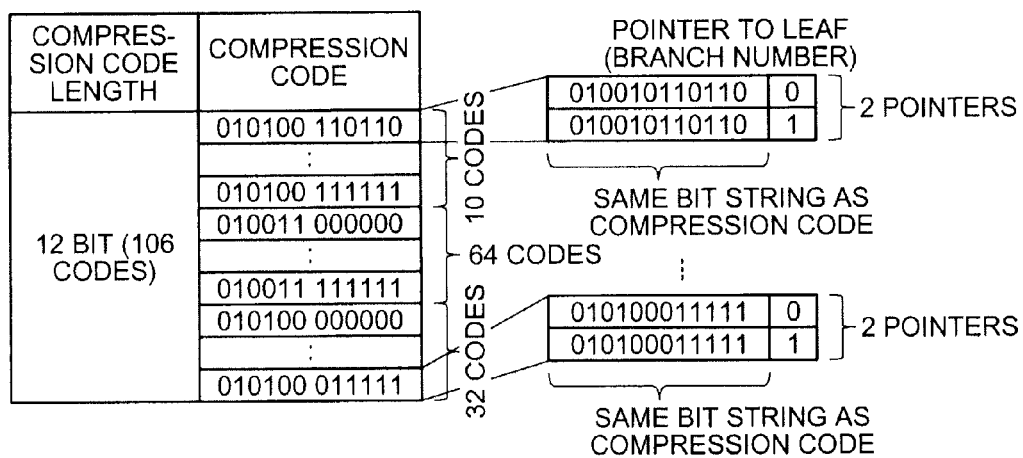
FIG. 30 is a diagram (part 7) of details of Generation of Pointer to Leaf (N=13)
Figure 31:
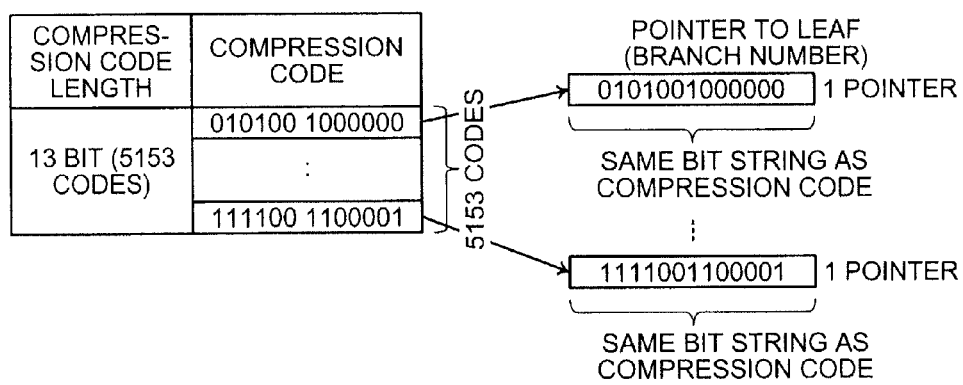
FIG. 31 is a diagram (part 8) of details of Generation of Pointer to Leaf (N=13)

Similarly, in FIG. 26, 32 types of the pointers to leaf are generated for each of the compression codes having the compression code length of 8 bits. In FIG. 27, 16 types of the pointers to leaf are generated for each of the compression codes having the compression code length of 9 bits. In FIG. 28, 8 types of the pointers to leaf are generated for each of the compression codes having the compression code length of 10 bits. In FIG. 29, 4 types of the pointers to leaf are generated for each of the compression codes having the compression code length of 11 bits. In FIG. 30, 2 types of the pointer to leaf are generated for each of the compression codes having the compression code length of 12 bits. In FIG. 31, one type of the pointer to leaf is generated for each of the compression codes having the compression code length of 13 bits.

Figure 32:
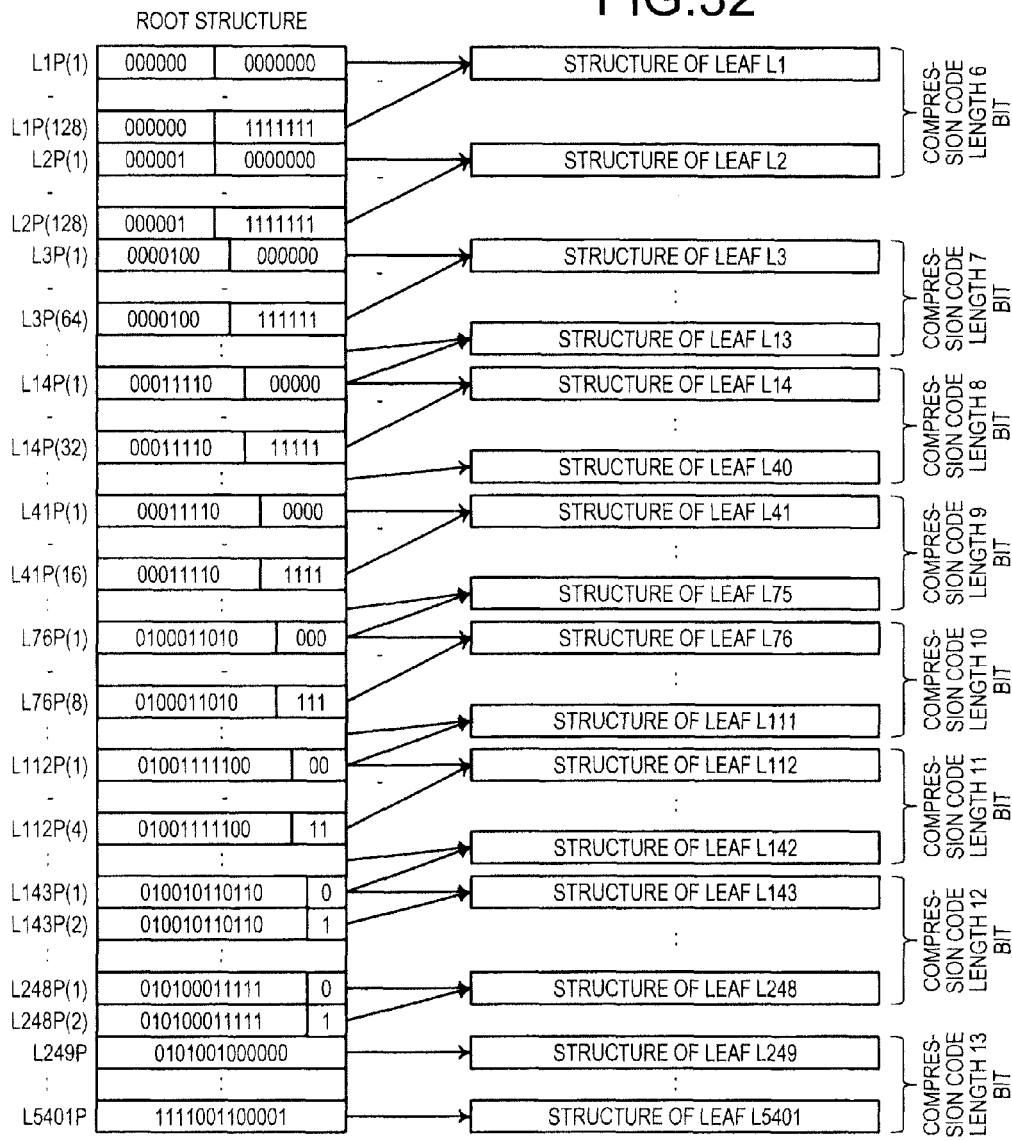
FIG. 32 is a diagram of details of (7) Construction of $2^N$-Branch Nodeless Huffman Tree (N=13) of FIG. 2.

FIG. 32 is a diagram of details of (7) Construction of $2^N$-Branch Nodeless Huffman Tree (N=13) of FIG. 2. FIG. 32 depicts an 8192(=$2^{13}$)-branch nodeless Huffman tree in the case of N=13. A root structure stores the pointers to leaf. A pointer to leaf can specify a leaf structure at a pointed destination.

For example, as depicted in FIG. 24, 128 pointers to leaf are generated for a leaf structure storing a compression code having the compression code length of 6 bits. Therefore, for the structure of the leaf L1, 128 pointers L1P(1) to L1P(128) to the leaf L1 are stored in the root structure. The same applies to the structure of the leaf L2.

As depicted in FIG. 25, 64 pointers to leaf are generated for a leaf structure storing a compression code having the compression code length of 7 bits. Therefore, for the structure of the leaf L3, 64 pointers L3P(1) to L3P(64) to the leaf L3 are stored in the root structure. The same applies to the structure of the leaf L4 to the structure of the leaf L13.

As depicted in FIG. 26, 32 pointers to leaf are generated for a leaf structure storing a compression code having the compression code length of 8 bits. Therefore, for the structure of the leaf L14, 32 pointers L14P(1) to L14P(32) to the leaf L14 are stored in the root structure. The same applies to the structure of the leaf L15 to the structure of the leaf L40.

As depicted in FIG. 27, 16 pointers to leaf are generated for a leaf structure storing a compression code having the compression code length of 9 bits. Therefore, for the structure of the leaf L41, 16 pointers L41P(1) to L41P(16) to the leaf L41 are stored in the root structure. The same applies to the structure of the leaf L42 to the structure of the leaf L75.

As depicted in FIG. 28, 8 pointers to leaf are generated for a leaf structure storing a compression code having the compression code length of 10 bits. Therefore, for the structure of the leaf L76, 8 pointers L76P(1) to L76P(8) to the leaf L76 are stored in the root structure. The same applies to the structure of the leaf L77 to the structure of the leaf L111.

As depicted in FIG. 29, 4 pointers to leaf are generated for a leaf structure storing a compression code having the compression code length of 11 bits. Therefore, for the structure of the leaf L112, 4 pointers L112P(1) to L112P(4) to the leaf L166 are stored in the root structure. The same applies to the structure of the leaf L113 to the structure of the leaf L142.

As depicted in FIG. 30, 2 pointers to leaf is generated for a leaf structure storing a compression code having the compression code length of 12 bits. Therefore, for the structure of the leaf L143, 2 pointers L143P(1) to L143P(2) to the leaf L143 are stored in the root structure. The same applies to the structure of the leaf L144 to the structure of the leaf L248.

As depicted in FIG. 31, 1 pointer to leaf is generated for a leaf structure storing a compression code having the compression code length of 13 bits. Therefore, for the structure of the leaf L249, 1 pointer L249P to the leaf L249 is stored in the root structure. The same applies to the structure of the leaf L250 to the structure of the leaf L5401.

Figures 33, 34:
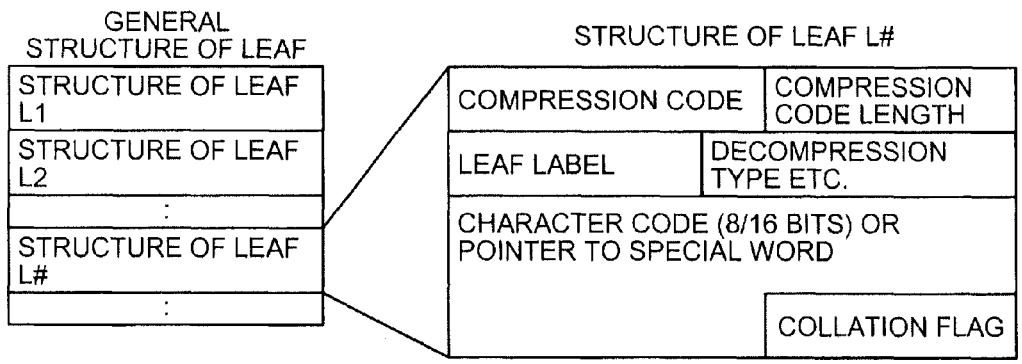
FIG. 33 is a diagram of the leaf structure.
FIG. 34 is a diagram of a higher-order character code structure.

FIG. 33 is a diagram of the leaf structure. The leaf structure is a data structure having first to fourth areas. In the leaf structure, the first area stores a compression code and a compression code length thereof. The second area stores a leaf label and a decompression type (see FIG. 3). The third area stores a higher-order 16-bit character code, a lower-order divided 8-bit character code, or a pointer to a special word depending on the decompression type.

The fourth area stores a code type and a code category. The code type identifies which of a numeric character, an alphabetic character, a special symbol, katakana, hiragana, or kanji a character code corresponds to, or whether a character code is a pointer to a special word. The code category identifies whether the character code is 16-bit or 8-bit. In the case of 16-bit character code or in the case of a reserved word, "1" is assigned as the code category and, in the case of 8-bit divided character code, "0" is assigned as the code category.

FIG. 34 is a diagram of a higher-order character code structure. A higher-order character code structure 3400 is a data structure storing a higher-order character code e# and a pointer to leaf L# thereof. For example, the generating apparatus extracts the character code e# by reference to the decompression type and the code category from the leaf structure and extracts the pointer to the leaf L# pointing the extracted character code e# from the root structure. If multiple pointers to the leaf L# exist, any pointer may be available. As a result, the higher-order character code structure 3400 is generated.

FIG. 35 is a diagram of a divided character code structure. A divided character code structure 3500 stores a divided character code and a pointer to leaf L# thereof. For example, the generating apparatus extracts the divided character code by reference to the decompression type and the code category from the leaf structure and extracts the pointer to the leaf L# pointing the extracted divided character code from the root structure. If multiple pointers to the leaf L# exist, any pointer may be available. As a result, the divided character code structure 3500 is generated.

FIGS. 36 and 37 are diagrams of a special word structure. FIG. 36 depicts the special words including only the reserved words and FIG. 37 depicts the special words including the reserved words and the basic words. A special word structure 3600 is a data structure storing a special word and a pointer to leaf L# thereof. For example, the generating apparatus extracts the special word by reference to the decompression type and the code category from the leaf structure and extracts the pointer to the leaf L# pointing the extracted special word from the root structure. If multiple pointers to the leaf L# exist, any pointer may be available. As a result, the special word structure 3600 is generated.

Figure 38:
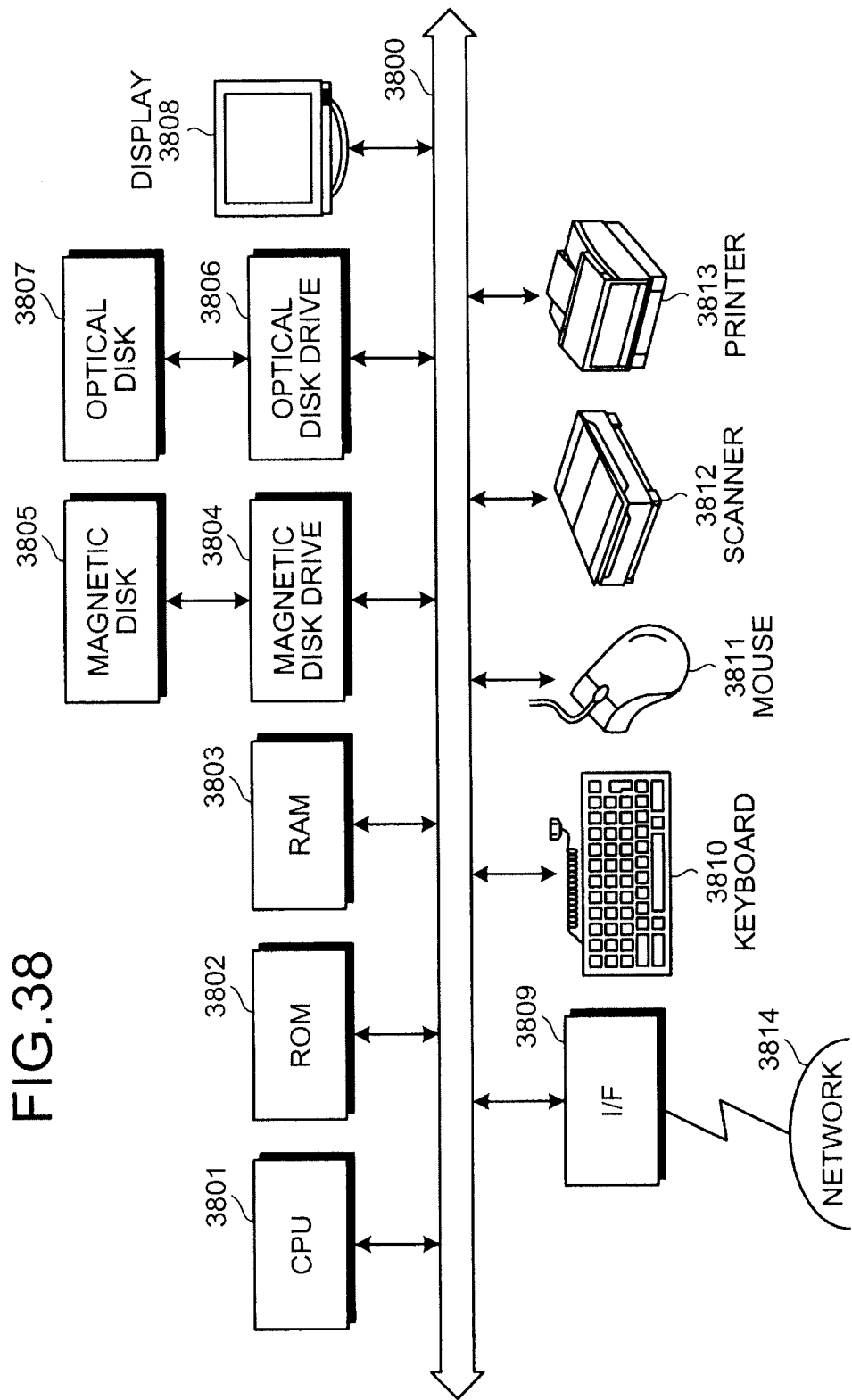
FIG. 38 is a block diagram of a hardware configuration of a generating apparatus according to an embodiment.

FIG. 38 is a block diagram of a hardware configuration of the generating apparatus according to the embodiment. As depicted in FIG. 38, the generating apparatus includes a central processing unit (CPU) 3801, a read-only memory (ROM) 3802, a random access memory (RAM) 3803, a magnetic disk drive 3804, a magnetic disk 3805, an optical disk drive 3806, an optical disk 3807, a display 3808, an interface (I/F) 3809, a keyboard 3810, a mouse 3811, a scanner 3812, and a printer 3813, respectively connected by a bus 3800.

The CPU 3801 governs overall control of the generating apparatus. The ROM 3802 stores therein programs such as a boot program. The RAM 3803 is used as a work area of the CPU 3801. The magnetic disk drive 3804, under the control of the CPU 3801, controls the reading and writing of data with respect to the magnetic disk 3805. The magnetic disk 3805 stores therein data written under control of the magnetic disk drive 3804.

The optical disk drive 3806, under the control of the CPU 3801, controls the reading and writing of data with respect to the optical disk 3807. The optical disk 3807 stores therein data written under control of the optical disk drive 3806, the data being read by a computer.

The display 3808 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 3808.

The I/F 3809 is connected to a network 3814 such as a local area network (LAN), a wide area network (WAN), and the Internet through a communication line and is connected to other apparatuses through the network 3814. The I/F 3809 administers an internal interface with the network 3814 and controls the input/output of data from/to external apparatuses. For example, a modem or a LAN adaptor may be employed as the I/F 3809.

The keyboard 3810 includes, for example, keys for inputting letters, numerals, and various instructions and performs the input of data. Alternatively, a touch-panel-type input pad or numeric keypad, etc. may be adopted. The mouse 3811 is used to move the cursor, select a region, or move and change the size of windows. A track ball or a joy stick may be adopted provided each respectively has a function similar to a pointing device.

The scanner 3812 optically reads an image and takes in the image data into the generating apparatus. The scanner 3812 may have an optical character reader (OCR) function as well. The printer 3813 prints image data and text data. The printer 3813 may be, for example, a laser printer or an ink jet printer.

The generating program, the $2^N$-branch nodeless Huffman tree, the higher-order character code structure 3400, the divided character code structure 3500, and the special word structure 3600 according to the embodiment described above are stored in the storage device such as the RAM 3803 and the magnetic disk 3805 described above.

Figure 39:
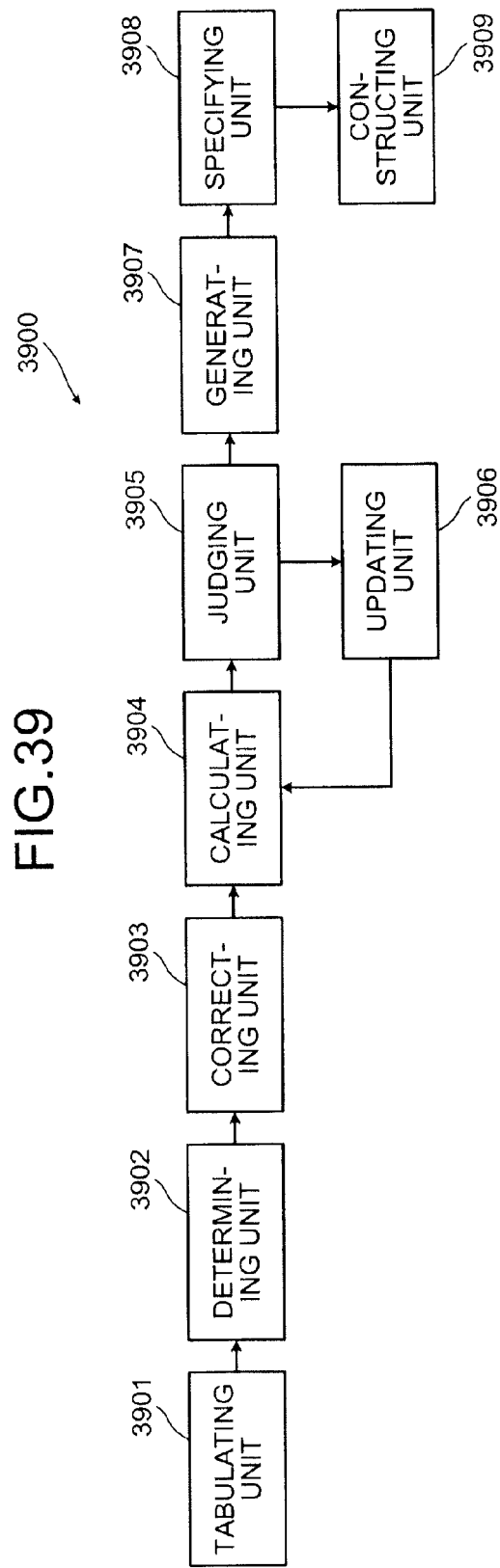
FIG. 39 is a block diagram of a functional configuration example of the generating apparatus.

FIG. 39 is a block diagram of a functional configuration example of the generating apparatus. A generating apparatus 3900 includes a tabulating unit 3901, a determining unit 3902, a correcting unit 3903, a calculating unit 3904, a judging unit 3905, an updating unit 3906, a generating unit 3907, a specifying unit 3908, and a constructing unit 3909. For example, the functions of the tabulating unit 3901 to the constructing unit 3909 are implemented by causing the CPU 3801 to execute programs stored in a storage device such as the ROM 3802, the RAM 3803, the magnetic disc 3805, and the optical disc 3807 depicted in FIG. 38.

The tabulating unit 3901 has a function of tabulating data. For example, the tabulating unit 3901 reads an object file group to tabulate the numbers of appearances of single characters. For example, the tabulating unit 3901 sorts the single characters in descending order of the numbers of appearances and defines single characters within a predetermined rank (e.g., 1024th place) as higher-order character codes. A single character ranked lower than the predetermined rank is divided into upper 8 bits and lower 8 bits and is re-tabulated as eight-bit divided character codes.

The tabulating unit 3901 executes a longest match search process to identify the special words and tabulates the numbers of appearances of the special words. The tabulating unit 3901 mixes and re-sorts the higher-order character codes, the divided character codes, and the special words by the numbers of appearances. As a result, the rank field, the decompression type field, the code field, the character field, and appearance number field depicted in FIG. 4 are filled.

If the number of appearances of each character data is acquired, the tabulating unit 3901 calculates the sum of the numbers of appearances of all of the character data as the total number. The tabulating unit 3901 divides the number of appearances by the total number to calculate an appearance rate for each character data. The tabulating unit 3901 specifies an occurrence probability corresponding to the calculated appearance rate as described in the section of "(2) Calculation of Compression Code Length" of FIG. 2 and defines an exponent thereof as a compression code length. As a result, a compression code length is identified for each character data (see FIG. 3). The tabulating unit 3901 refers to the character data table of FIG. 4 to tabulate the number of character data types (uncorrected number of leaves depicted in FIG. 5) for each compression code length.

The determining unit 3902 has a function of determining the upper limit length N of the compression code length assigned to the character data, among compression code lengths from a minimum compression code length to a maximum compression code length and based on the total number of character data types. For example, if the total number of character data types is greater than $2^{K-1}$ and less than or equal to $2^K$, the determining unit 3902 determines the upper limit length N as K bits. For example, if the total number of character data types is greater than $2^{10}$ and less than or equal to $2^{11}$, the determining unit 3902 determines the upper limit length N as 11 bits.

If the total number of character data types is greater than $2^{11}$ and less than or equal to $2^{12}$, the determining unit 3902 determines the upper limit length N as 12 bits. If the total number of character data types is greater than $2^{12}$ and less than or equal to $2^{13}$, the determining unit 3902 determines the upper limit length N as 13 bits. Classification of character data by character code type will be described.

FIG. 40 is a diagram of a classification example of character data in UTF 16. The special words include 25 reserved words and up to 4096 basic words. If the basic words are not included, only the 25 types of reserved words are included. In UTF 16, if the basic words are not included, the maximum total number of the character data is 1305. Therefore, because of $2^{10} < 1305 \leq 2^{11}$, the upper limit length N is determined as N=11 bits. If 2048 basic words are included, the maximum total number of the character data is 3353. Therefore, because of $2^{11} < 3353 \leq 2^{12}$, the upper limit length N is determined as N=12 bits. If 4096 basic words are included, the maximum total number of the character data is 5401. Therefore, because of $2^{12}<5401\leq2^{13}$, the upper limit length N is determined as N=13 bits.

FIG. 41 is a diagram of a classification example of character data in ASCII code. The special words include 25 reserved words and up to 2048 basic words. If 1024 basic words are included, the maximum total number of the character data is 1305. Therefore, because of $2^{10}<1305\leq2^{11}$, the upper limit length N is determined as N=11 bits. If 2048 basic words are included, the maximum total number of the character data is 3353. Therefore, because of $2^{11}<3353\leq2^{12}$, the upper limit length N is determined as N=12 bits.

FIG. 42 is a diagram of a classification example of character data in shift JIS code. The special words include 25 reserved words and up to 4096 basic words. In the case of shift JIS code, a Japanese character is represented as a combination of two 8-bit codes and therefore considered as an even number of words (character strings). If 2048 basic words are included, the maximum total number of the character data is 3353. Therefore, because of $2^{11}<3353\leq2^{12}$, the upper limit length N is determined as N=12 bits. If 4096 basic words are included, the maximum total number of the character data is 5401. Therefore, because of $2^{12}<5401\leq2^{13}$, the upper limit length N is determined as N=13 bits.

In FIG. 39, the correcting unit 3903 has a function of correcting the number of character data types tabulated by the tabulating unit 3901 for the upper limit N determined by the determining unit 3902, to the sum of the numbers of character data types for the compression code lengths greater than or equal to the upper limit length N. For example, the correcting unit 3903 executes a correction process according to the correction A described above.

The calculating unit 3904 has a function of calculating the sum of occurrence probabilities specifying the compression code lengths up to the upper limit length N after the correction by the correcting unit 3903. For example, the calculating unit 3904 calculates the total occurrence probability depicted in FIGS. 5, 14, and 23.

The judging unit 3905 has a function of judging whether the total occurrence probability calculated by the calculating unit 3904 is greater than or equal to the threshold value t and less than or equal to one. The threshold value t is a value satisfying $0<t\leq1$ and is set in advance. The threshold value t may be one. If greater than or equal to the threshold value t and less than or equal to one, the number of character data types for each compression code length after the correction by the correcting unit 3903 may be fixed as the number of leaves at each compression code length.

On the other hand, if less than the threshold value t, the total occurrence probability can further be increased and, therefore, the correction $B^+$ described above can be performed. If the total occurrence probability becomes greater than one, the correction $B^-$ described above can be performed.

The updating unit 3906 has a function of dividing the number of character data types for each compression code length up to the upper limit length N by the total occurrence probability to update the number of character data types for each compression code length up to the upper limit length N if the judging unit 3905 judges that the total occurrence probability is not greater than or equal to the threshold value t or not less than or equal to one. For example, the updating unit 3906 starts the correction $B^+$ if it is determined that the total occurrence probability is less than the threshold value t, or starts the correction $B^-$ if it is determined that the total occurrence probability is greater than one.

In this case, the calculating unit 3904 recalculates the total occurrence probability based on the number of character data types for each compression code length up to the upper limit length N after the update. The judging unit 3905 judges whether the total occurrence probability recalculated by the calculating unit 3904 is acquired as the maximum value less than or equal to one, for example, whether the total occurrence probability converges to the maximum asymptotic value less than or equal to one.

The generating unit 3907 has a function of generating a leaf structure having a compression code assigned to character data. For example, a condition of generation by the generating unit 3907 is satisfied if the judging unit 3905 determines that the total occurrence probability is greater than or equal to the threshold value t and less than or equal to one with the correction A or that the total occurrence probability is acquired as the maximum value less than or equal to one with the correction B. If the condition is satisfied, the generating unit 3907 assigns a compression code to each character data based on, for example, the compression code length up to the upper limit length N, the number of character data types for each compression code length up to the upper limit length N, and the appearance rate of the character data. The generating unit 3907 generates the leaf structure including the assigned compression code, the compression code length thereof, and the character data.

In particular, character data is selected in ascending order from the first place out of the character data ranked by the appearance rate. The generating unit 3907 identifies a compression code length of the selected character data and assigns a unique compression code resulting in the compression code length.

For example, the character data ranked first for the number of appearances is the high-rank character "0". In the case of N=12, the compression code length is 6 bits and, therefore, the unique compression code "000000" is assigned. The character data ranked second for the number of appearances is the high-rank character ">". In the case of N=12, the compression code length is 6 bits and, therefore, the unique compression code "000001" is assigned.

In this way, the compression code is assigned in ascending order of the ranking for the number of appearances. After the compression code is determined, the generating unit 3907 integrates the character data, the compression code length, the decompression type, etc., to generate a leaf structure for each character data.

The specifying unit 3908 has a function of specifying the number of branches per leaf structure generated by the generating unit 3907 based on the compression code length up to the upper limit length N for each compression code length up to the upper limit length N. For example, the specifying unit 3908 specifies the number of branches per leaf for each compression code length as depicted in FIGS. 5, 14, and 23.

The constructing unit 3909 has a function of constructing a $2^N$-branch nodeless Huffman tree. For example, the constructing unit 3909 generates for each leaf structure a group of pointers to leaf acquired by connecting the compression code in the leaf structure and a bit string representative of a branch number corresponding to the number of branches specified by the specifying unit 3908. For example, in the case of N=11, a group of pointers to leaf is generated for each leaf structure as depicted in FIGS. 7 to 12. In the case of N=12, a group of pointers to leaf is generated for each leaf structure as depicted in FIGS. 15 to 21. In the case of N=13, a group of pointers to leaf is generated for each leaf structure as depicted in FIGS. 24 to 31.

The constructing unit 3909 constructs a $2^N$-branch nodeless Huffman tree having a group of pointers to leaf for each leaf structure as a root. For example, in the case of N=11, a $2^{11}$-branch nodeless Huffman tree is constructed as depicted in FIG. 13. In the case of N=12, a $2^{12}$-branch nodeless Huffman tree is constructed as depicted in FIG. 22. In the case of N=13, a $2^{13}$-branch nodeless Huffman tree is constructed as depicted in FIG. 32.

FIG. 43 is a flowchart of a $2^N$-branch nodeless Huffman tree generation process procedure (first half). In FIG. 43, the generating apparatus 3900 uses the tabulating unit 3901 to execute a first tabulation process (step S4301) and a second tabulation process (step S4302). In the first tabulation process (step S4301), the numbers of appearances of the character data are tabulated. In the second tabulation process (step S4302), the number of character data types is tabulated for each compression code length. Details of the first tabulation process (step S4301) and the second tabulation process (step S4302) will be described later.

The generating apparatus 3900 uses the determining unit 3902 to determine the upper limit length N of the compression code length (step S4303). The N is used as a maximum compression code length in the correction A described later. The generating apparatus 3900 determines whether the compression code length of all of the character data is within N bits (step S4304).

If not within N bits (step S4304: NO), the generating apparatus 3900 uses the correcting unit 3903 to execute a correction A process (step S4305). For example, the generating apparatus 3900 obtains the sum of the number of character data types (number of leafs) for the compression code lengths greater than or equal to the N bits such that the upper limit length N is set to the maximum compression code length, and corrects the number of character data types for the compression code length of N bits to the sum. Therefore, the number of character data types for the compression code length greater than or equal to (N+1) bits becomes zero and the maximum compression code length is set to N bits. The generating apparatus 3900 goes to step S4306.

On the other hand, if within N bits (step S4304: YES), the generating apparatus 3900 goes to step S4306 without executing the correction A process (step S4305). At step S4306, the generating apparatus 3900 uses the calculating unit 3904 to calculate occurrence probabilities of the respective compression code lengths (step S4306) and calculates the sum of the calculated occurrence probabilities of the respective compression code lengths (total occurrence probability TOP) (step S4307). The generating apparatus 3900 goes to step S4401 of FIG. 44.

Figure 44:
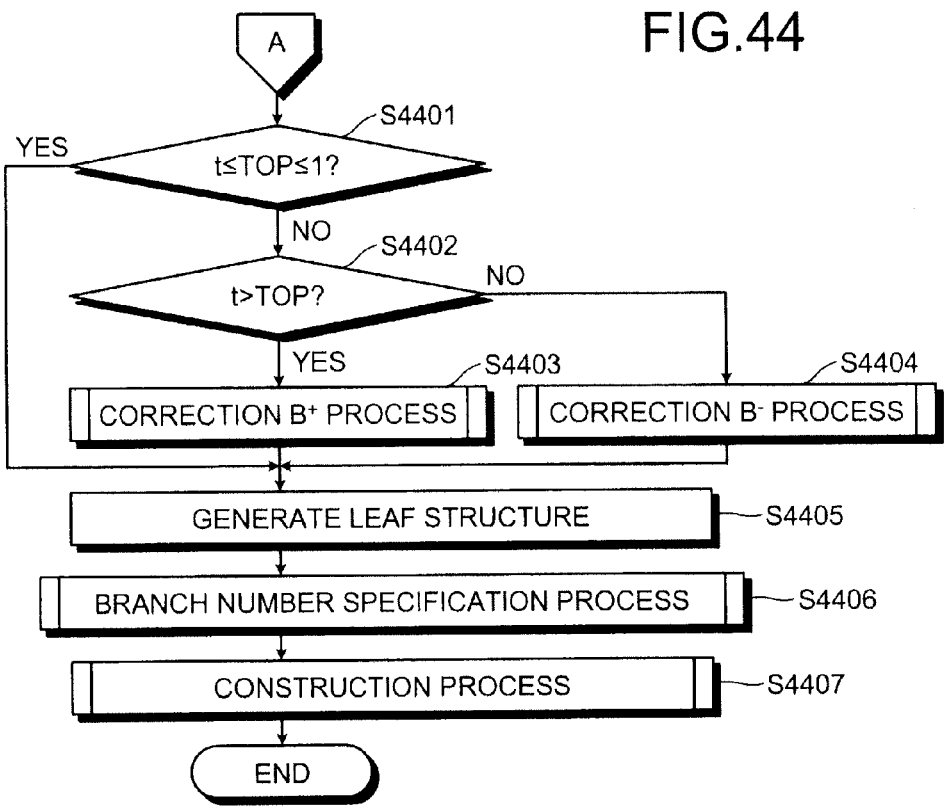
FIG. 44 is a flowchart of the $2^N$-branch nodeless Huffman tree generation process procedure (second half)

FIG. 44 is a flowchart of the $2^N$-branch nodeless Huffman tree generation process procedure (second half). The generating apparatus 3900 uses the judging unit 3905 to determine whether the calculated total occurrence probability TOP satisfies $t \leq TOP \leq 1$ (step S4401). The threshold value described above is denoted by t. If $t \leq TOP \leq 1$ is not satisfied (step S4401: NO), the generating apparatus 3900 uses the judging unit 3905 to determine whether t>TOP is satisfied (step S4402). If t>TOP is satisfied (step S4402: YES), the generating apparatus 3900 uses the updating unit 3906 to executed a correction $B^+$ process (step S4403). Detail of the correction $B^+$ process (step S4403) will be described later. After the correction $B^+$ process, the procedure gores to step S4405.

On the other hand, if t>TOP is not satisfied at step S4402 (step S4402: NO), the generating apparatus 3900 uses the updating unit 3906 to executed a correction $B^-$ process (step S4404). Detail of the correction $B^-$ process (step S4404) will be described later. After the correction $B^-$ process, the procedure gores to step S4405. If $t \leq TOP \leq 1$ is satisfied at step S4401 (step S4401: YES), the procedure gores to step S4405.

At step S4405, the generating apparatus 3900 uses the generating unit 3907 to generate a leaf structure for each character data (step S4405). The generating apparatus 3900 uses the specifying unit 3908 to execute a branch number specification process (step S4406). In the branch number specification process (step S4406), the number of branches per leaf is specified for each compression code length. Detail of the branch number specification process (step S4406) will be described later.

The generating apparatus 3900 uses the constructing unit 3909 to execute a construction process (step S4407). Since the number of branches are specified for each leaf structure in the branch number specification process (step S4406), the constructing unit 3909 generates for each leaf structure a group of pointers to leaf corresponding to the number of branches. The generated groups of pointers to leaves for the leaf structures are integrated into a root structure. As a result, a $2^N$-branch nodeless Huffman tree is generated. The generated $2^N$-branch nodeless Huffman tree is stored in the storage device (such as the RAM 3803 and the magnetic disc 3805) in the generating apparatus 3900.

Figure 45:
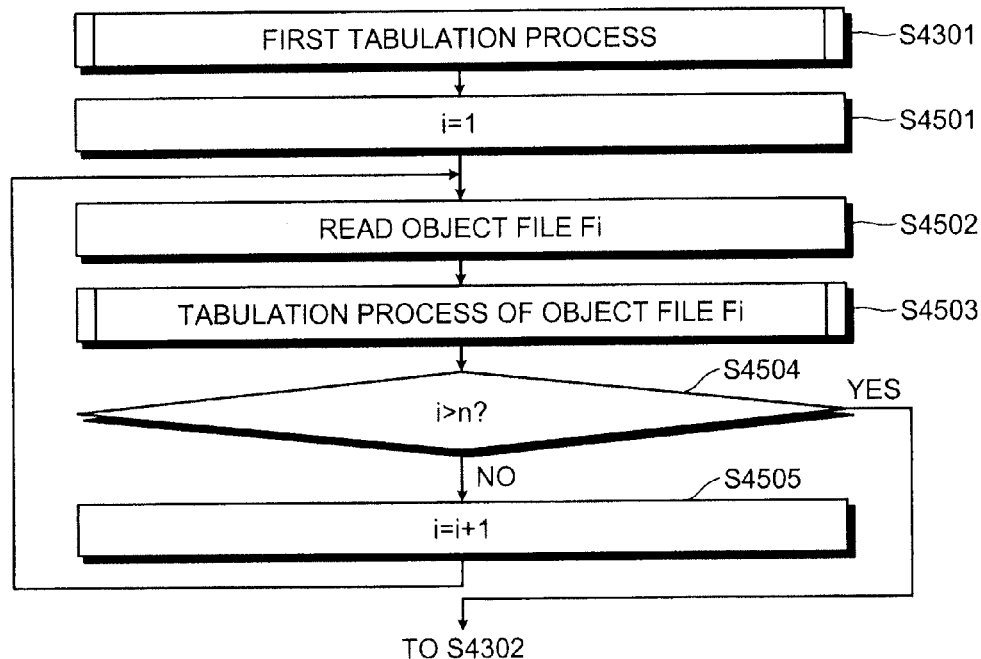
FIG. 45 is a flowchart of the first tabulation process (step S4301) depicted in FIG. 43.

FIG. 45 is a flowchart of the first tabulation process (step S4301) depicted in FIG. 43. The generating apparatus 3900 sets a file number i to i=1 (step S4501) and reads an object file Fi (step S4502). The generating apparatus 3900 executes the tabulation process of the object file Fi (step S4503). The generating apparatus 3900 then determines whether the file number i satisfies i>n (where n is the total number of object files F1 to Fn) (step S4504).

If i>n is not satisfied (step S4504: NO), the generating apparatus 3900 increments i (step S4505) and returns to step S4502. On the other hand, if i>n is satisfied (step S4504: YES), the generating apparatus 3900 goes to the second tabulation process (step S4302) and terminates the first tabulation process (step S4301). With this first tabulation process (step S4301), the tabulation process of the object file Fi (step S4503) can be executed for each of the object files Fi.

Figure 46:
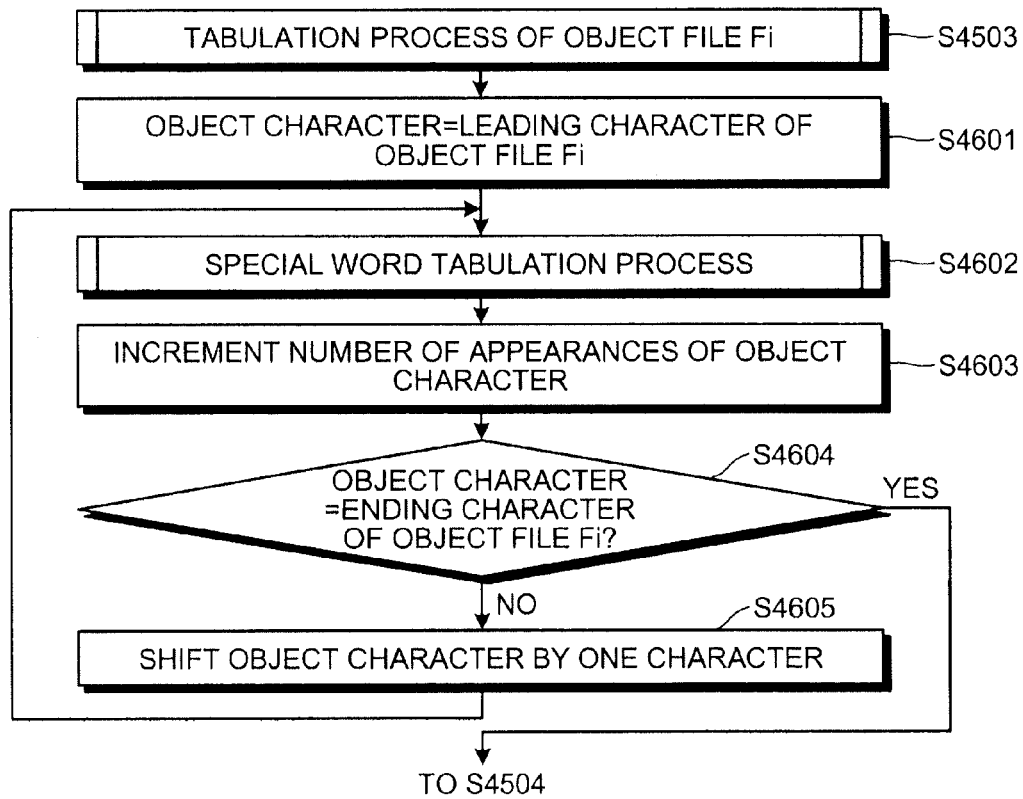
FIG. 46 is a flowchart of the tabulation process of the object file Fi (step S4503) depicted in FIG. 45.

FIG. 46 is a flowchart of the tabulation process of the object file Fi (step S4503) depicted in FIG. 45. The generating apparatus 3900 defines the leading character of the object file Fi as an object character (step S4601) and executes a special word tabulation process (step S4602). The generating apparatus 3900 then increments the number of appearances of the object character by one (step S4603). The generating apparatus 3900 determines whether the object character is the ending character of the object file Fi (step S4604).

If the object character is not the ending character of the object file Fi (step S4604: NO), the generating apparatus 3900 shifts the object character by one character toward the end (step S4605) and returns to step S4602. On the other hand, if the object character is the ending character of the object file Fi (step S4604: YES), the generating apparatus 3900 goes to step S4504 and terminates the tabulation process of the object file Fi (step S4503). With this tabulation process of the object file Fi (step S4503), the appearance frequencies of the special words and the single characters present in the object file group F can be tabulated.

Figure 47:
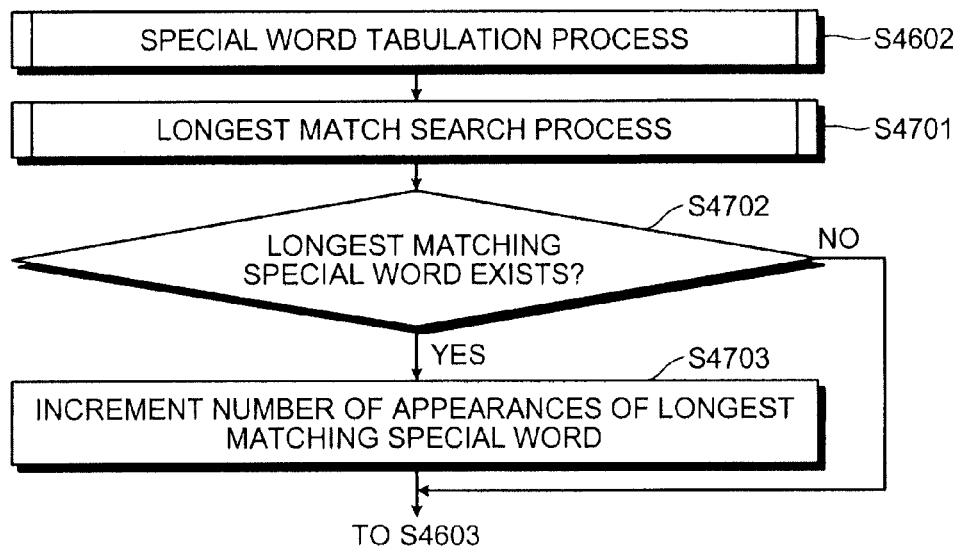
FIG. 47 is a flowchart of the special word tabulation process (step S4602) depicted in FIG. 46.

FIG. 47 is a flowchart of the special word tabulation process (step S4602) depicted in FIG. 46. The generating apparatus 3900 executes a longest match search process (step S4701) and determines whether a longest matching special word exists (step S4702). If the longest matching basic word exists (step S4702: YES), the generating apparatus 3900 increments the number of appearances of the longest matching special word by one in a special word appearance frequency table (step S4703) and goes to step S4603.

If no longest matching basic word exists (step S4702: NO), the generating apparatus 3900 goes to step S4603. As a result, the special word tabulation process (step S4602) is terminated. With the special word tabulation process (step S4602), the special words can be counted by the longest match search process (step S4701) and, therefore, a special word having a longer character string can preferentially be counted.

Figure 48:
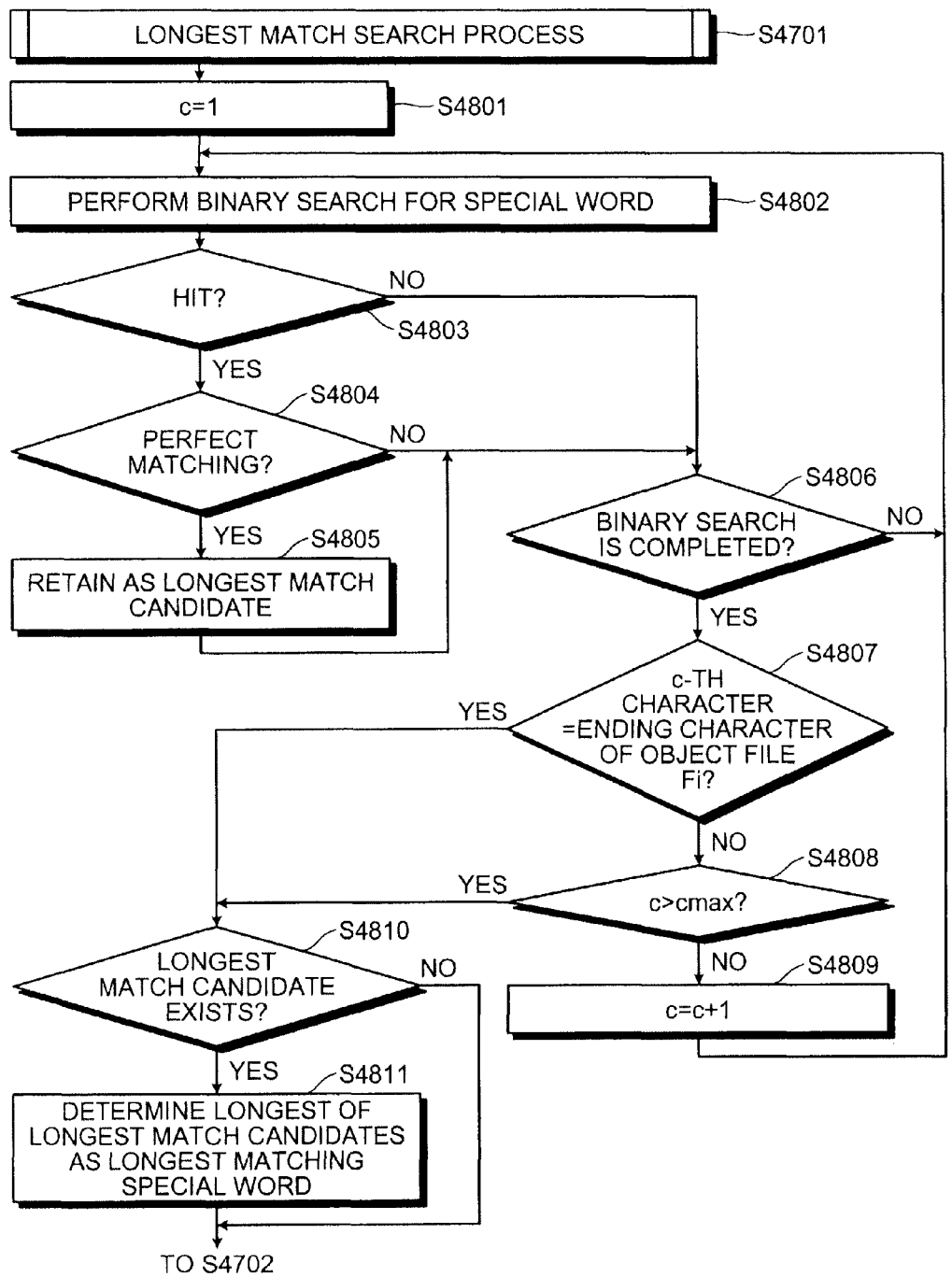
FIG. 48 is a flowchart of the longest match search process (step S4701) depicted in FIG. 47.

FIG. 48 is a flowchart of the longest match search process (step S4701) depicted in FIG. 47. The generating apparatus 3900 sets c=1 (step S4801). The number of characters from the object character is denoted by c (including the object character). In the case of c=1, only the object character is indicated. The generating apparatus 3900 then searches for a special word structure starting with characters matching an object character string of c characters from the object character (step S4802). The generating apparatus 3900 determines whether the special word exists as a result of the search (step S4803). If no special word is hit by the binary search (step S4803: NO), the generating apparatus 3900 goes to step S4806.

On the other hand, if a special word is hit by the binary search (step S4803: YES), the generating apparatus 3900 determines whether the hit special word perfectly matches the object character string (step S4804). If not perfectly matching (step S4804: NO), the generating apparatus 3900 goes to step S4806. On the other hand, if perfectly matching (step S4804: YES), the generating apparatus 3900 retains the special word as a longest match candidate in a storage device (step S4805) and goes to step S4806.

At step S4806, the generating apparatus 3900 determines whether the binary search is completed for the object character string (step S4806). For example, the generating apparatus 3900 determines whether the binary search is performed to the ending special word. If the binary search is not completed (step S4806: NO), the generating apparatus 3900 goes to step S4802 to continue until the binary search is completed.

On the other hand, if the binary search is completed for the object character string (step S4806: YES), the generating apparatus 3900 determines whether a c-th character is the ending character of the object file Fi (step S4807). If the c-th character is the ending character of the object file Fi (step S4807: YES), the generating apparatus 3900 goes to step S4810. On the other hand, if the c-th character is not the ending character of the object file Fi (step S4807: NO), the generating apparatus 3900 determines whether c>cmax is satisfied (step S4808). A preset value is denoted by cmax, thereby setting the upper limit number of characters of the object character string.

If c>cmax is not satisfied (step S4808: NO), the generating apparatus 3900 increments c (step S4809) and returns to step S4802. On the other hand, if c>cmax is satisfied (step S4808: YES), the generating apparatus 3900 determines whether a longest match candidate exists (step S4810). For example, the generating apparatus 3900 determines whether at least one longest match candidate is retained in a memory at step S4805.

If the longest match candidates exist (step S4810: YES), the generating apparatus 3900 determines the longest character string of the longest match candidates as the longest matching special word (step S4811). The generating apparatus 3900 goes to step S4702. On the other hand, if no longest match candidate exists at step S4810 (step S4810: NO), the generating apparatus 3900 goes to step S4702. As a result, the longest match search process (step S4701) is terminated. With this longest match search process (step S4701), the longest character string of the perfectly matching character strings can be retrieved as the special word out of the special words within the special word structure.

Figure 49:
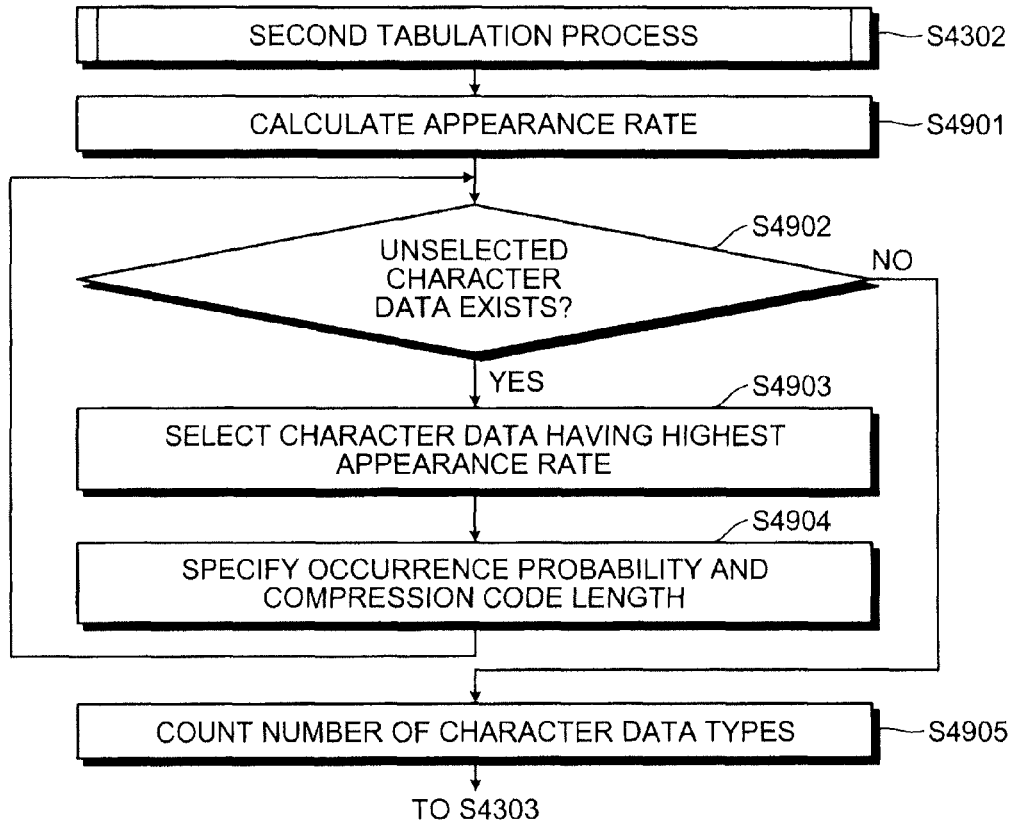
FIG. 49 is a flowchart of the second tabulation process (step S4302) depicted in FIG. 43.

FIG. 49 is a flowchart of the second tabulation process (step S4302) depicted in FIG. 43. The generating apparatus 3900 calculates an appearance rate for each character data (step S4901). The generating apparatus 3900 determines whether unselected character data exists (step S4902). If unselected character data exists (step S4902: YES), the generating apparatus 3900 selects the unselected character data having the highest appearance rate (step S4903). The generating apparatus 3900 specifies the occurrence probability and the compression code length depending on the appearance rate of the selected character data (step S4904) and returns to step S4902.

If no unselected character data exists at step S4902 (step S4902: NO), the generating apparatus 3900 counts the number of character data types for each compression code length (step S4905). As a result, the number of leaves (number of types of the character data) is identified for each compression code length.

Figure 50:
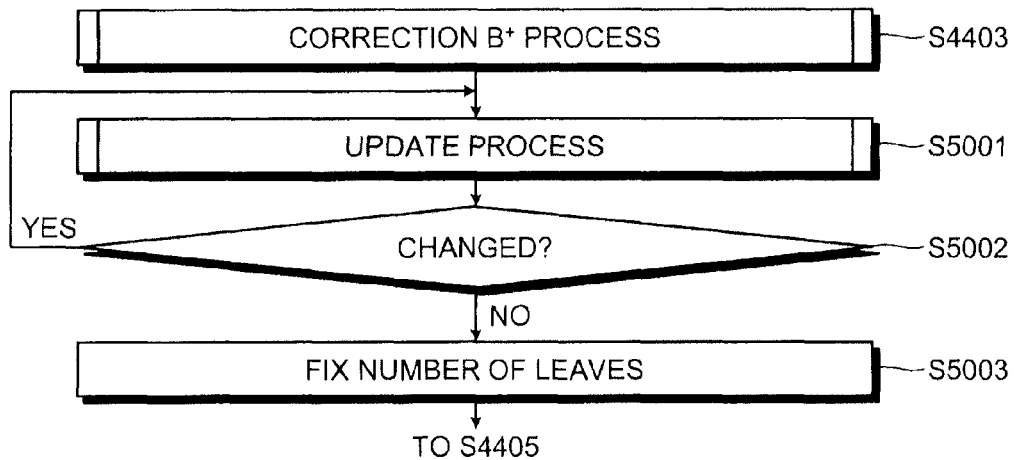
FIG. 50 is a flowchart of the correction B+ process (step S4403) depicted in FIG. 44.

FIG. 50 is a flowchart of the correction $B^+$ process (step S4403) depicted in FIG. 44. The generating apparatus 3900 executes an update process (step S5001). Details of the update process (step S5001) will be described later. After the update process (step S5001), the generating apparatus 3900 determines whether the number of leaves is changed before and after the update (step S5002). If changed (step S5002: YES), the total occurrence probability TOP does not yet converge to the maximum asymptotic value equal to less than one, the generating apparatus 3900 returns to the update process (step S5001).

On the other hand, if not changed (step S5002: NO), the number of leaves will not change if the update process (step S5001) is further executed. This means that the previous correction $B^+$ achieves the convergence to the maximum asymptotic value, and the generating apparatus 3900 fixes the number of leaves in this update process (step S5001) for each compression code length (step S5003) and goes to step S4405. As a result, the total occurrence probability TOP can be increased and made asymptotic to one to improve the compression efficiency.

Figure 51:
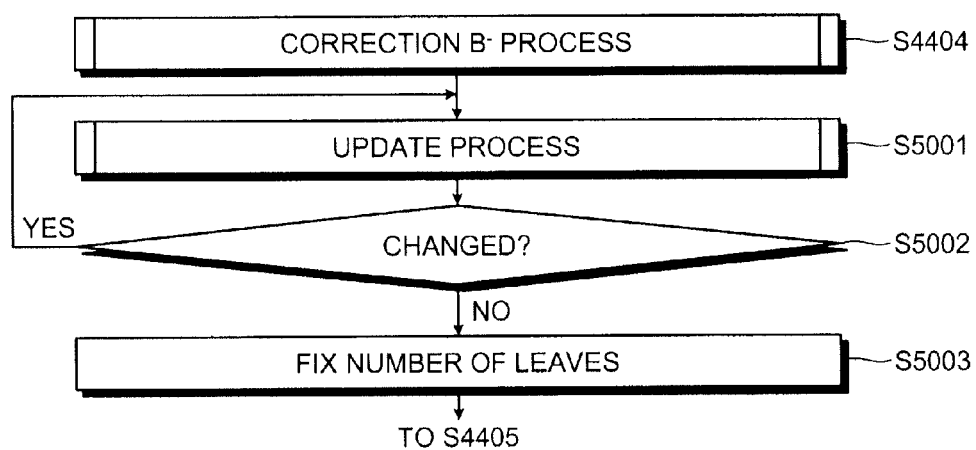
FIG. 51 is a flowchart of the correction B- process (step S4404) depicted in FIG. 44.

FIG. 51 is a flowchart of the correction $B^-$ process (step S4404) depicted in FIG. 44. The correction $B^-$ process (step S4404) has the same contents as the correction $B^+$ process (step S4403) depicted in FIG. 50 and, therefore, the same process is denoted by the same step number. Although the correction $B^-$ process (step S4404) has the same contents as the correction $B^+$ process (step S4403), the total occurrence probability TOP to be handled is a value greater than one and the update process (step S5001) is repeated to make the total occurrence probability TOP lower than one with the correction $B^-$ at a certain point.

When the total occurrence probability TOP becomes less than one, the update process (step S5001) is repeated until the convergence to the maximum asymptotic value less than or equal to one as is the case with the correction $B^+$. As a result, the total occurrence probability TOP greater than one can be decreased and made asymptotic to one to improve the compression efficiency.

Figure 52:
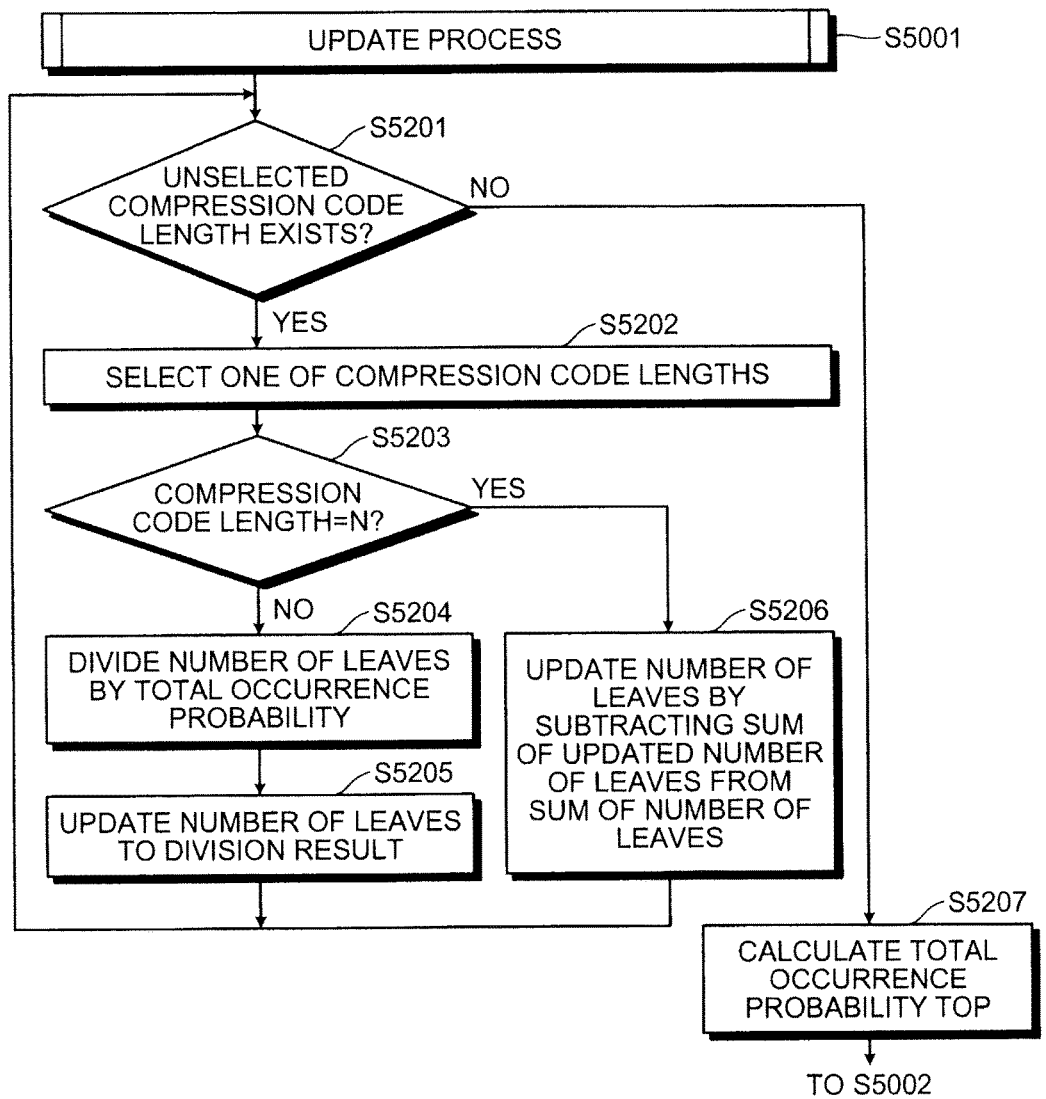
FIG. 52 is a flowchart of the update process (step S5001) depicted in FIGS. 50 and 51.

FIG. 52 is a flowchart of the update process (step S5001) depicted in FIGS. 50 and 51. The generating apparatus 3900 determines whether an unselected compression code length exists (step S5201). If the unselected compression code lengths exist (step S5201: YES), the generating apparatus 3900 selects the shortest one from the unselected compression code lengths (step S5202). The generating apparatus 3900 determines whether the selected compression code length is the upper limit length N (the longest compression code length in the correction A) (step S5203).

If the selected compression code length is not the upper limit length N (step S5203: NO), the generating apparatus 3900 divides the number of leaves (number of types of the character data) at the selected compression code length by the total occurrence probability TOP (step S5204). The generating unit 3907 updates the number of leaves at the selected compression code length to a value of the division result (step S5205). Figures after the decimal point of the value of the division result may be rounded down, rounded off, or rounded up. The generating apparatus 3900 returns to step S5201.

If the selected compression code length is the upper limit length N at step S5203 (step S5203: YES), the generating apparatus 3900 subtracts the sum of the number of leaves updated at step S5205 from the sum of the number of leaves to update the number of leaves at the selected compression code length (the upper limit length N in this case) to a value of the subtraction result (step S5206). The generating apparatus 3900 returns to step S5201.

If an unselected compression code length (compression code length less than or equal to the upper limit length N) does not exist at step S5201 (step S5201: NO), the generating apparatus 3900 calculates the total occurrence probability TOP after the update of the number of leaves (step S5207) and goes to step S5002 of FIGS. 50 and 51.

Figure 53:
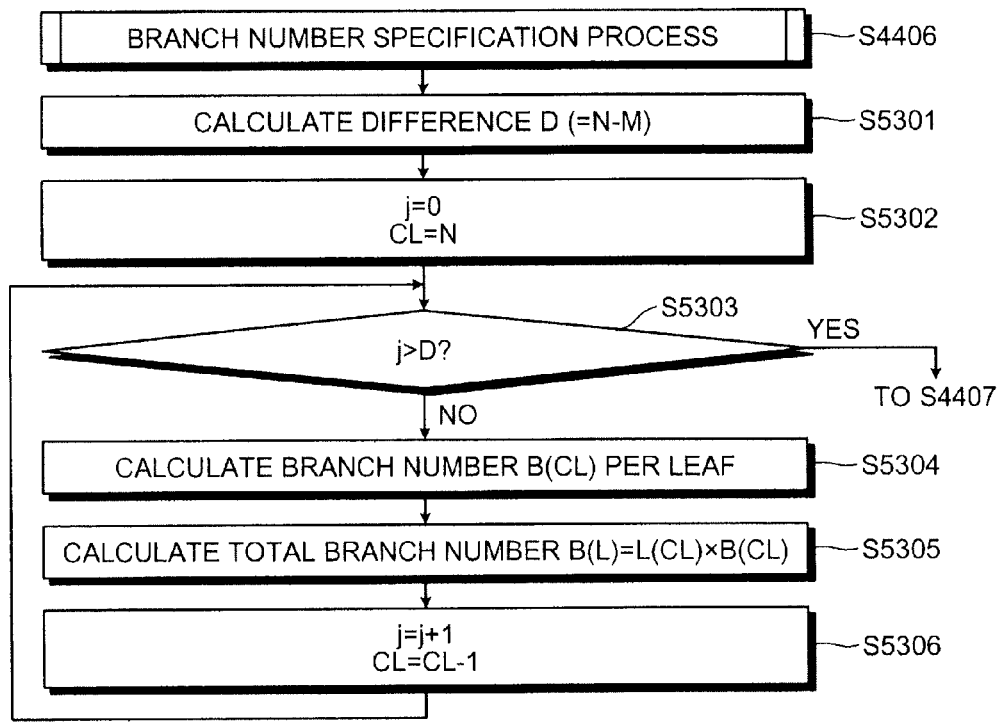
FIG. 53 is a flowchart of the branch number specification process (step S4406) depicted in FIG. 44.

FIG. 53 is a flowchart of the branch number specification process (step S4406) depicted in FIG. 44. The generating apparatus 3900 uses the specifying unit 3908 to calculate a difference D (=N−M) between a maximum compression code length CLmax (=N) and a minimum compression code length CLmin (=M) (step S5301). For example, in the case of N=11, M=6 is known by reference to FIG. 5. Therefore, D=5 is obtained.

The generating apparatus 3900 sets a variable j of an exponent of 2 to j=0 and sets a variable CL of compression code length to CL=N (step S5302). The generating apparatus 3900 determines whether j>D is satisfied (step S5303). If j>D is not satisfied (step S5303: NO), the generating apparatus 3900 calculates the branch number b(CL) per leaf at the compression code length CL (step S5304). The branch number b(CL) per leaf at the compression code length CL is calculated from b(CL)=$2^j$. For example, since j=0 results in the compression code length CL=N=11, the branch number b(11) per leaf at the compression code length of 11 bits is b(11)=$2^j$=$2^0$=1.

The generating apparatus 3900 calculates the total branch number B(L) at the compression code length CL (step S5305). The total branch number B(L) at the compression code length CL is calculated by B(L)=L(CL)×b(CL). L(CL) is the number of leaves (number of types of character data) at the compression code length CL. For example, since j=0 results in the compression code length CL=N=11, the total branch number B(L) at the compression code length of 11 bits is 1215×$2^0$=1215.

Subsequently, the generating apparatus 3900 increments j and decrements the compression code length CL (step S5306) and returns to step S5303 to determine whether j after the increment satisfies j>D. In the case of N=11, j=D results in j=D=5 and, as a result, CL=M=6 is obtained. Therefore, at step S5304, the branch number b(6) at the compression code length CL (6 bits) is b(6)=$2^5$=32. Similarly, the total branch number B(L) is B(6)=6×$2^5$=192. If j>D is satisfied (step S5303: YES), the generating apparatus 3900 goes to the construction process (step S4407).

Figure 54:
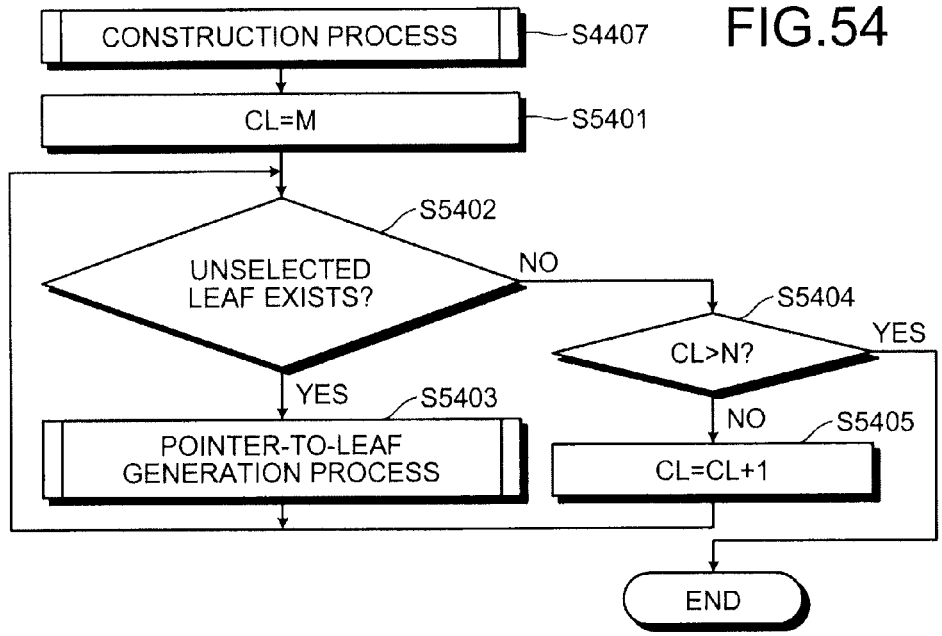
FIG. 54 is a flowchart of the construction process (step S4407) depicted in FIG. 44.

FIG. 54 is a flowchart of the construction process (step S4407) depicted in FIG. 44. The generating apparatus 3900 sets the compression code length CL to CL=CLmin=M (step S5401). The generating apparatus 3900 determines whether an unselected leaf exists at the compression code length CL (step S5402). If an unselected leaf exists (step S5402: YES), the generating apparatus 3900 executes a pointer-to-leaf generation process (step S5403) and returns to step S5402. In the pointer-to-leaf generation process (step S5403), pointers to leaf are generated to the number of branches corresponding to the compression code length CL for each leaf structure. Details of the pointer-to-leaf generation process (step S5403) will be described later.

On the other hand, if no unselected leaf exists at step S5402 (step S5402: NO), the generating apparatus 3900 determines whether CL>N is satisfied (step S5404). If CL>N is not satisfied (step S5404: NO), the generating apparatus 3900 increments CL (step S5405) and returns to step S5402. On the other hand, if CL>N is satisfied (step S5404: YES), this means that the $2^N$-branch nodeless Huffman tree is constructed, and a sequence of the process is terminated.

Figure 55:
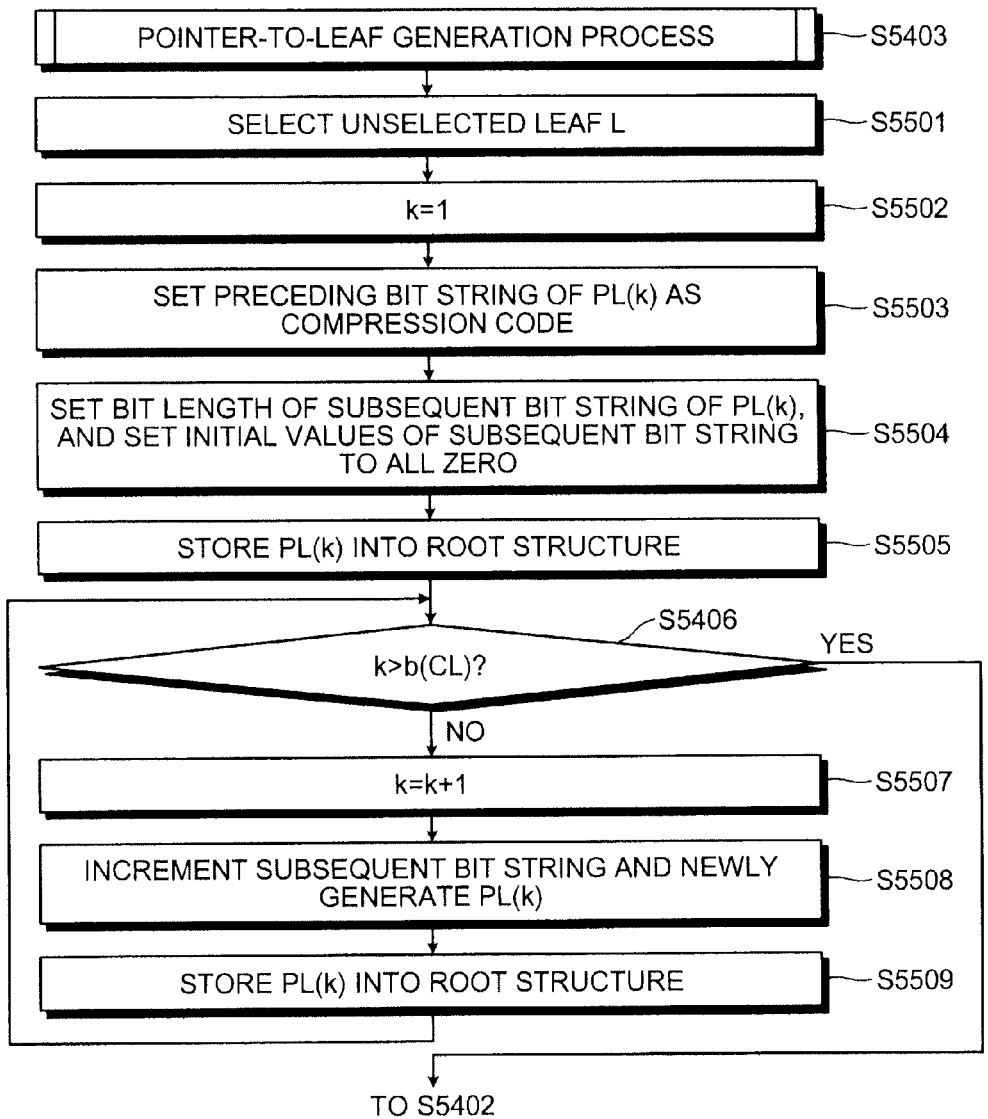
FIG. 55 is a flowchart of the pointer-to-leaf generation process (step S5403) depicted in FIG. 54.

FIG. 55 is a flowchart of the pointer-to-leaf generation process (step S5403) depicted in FIG. 54. The generating apparatus 3900 selects an unselected leaf L (step S5501) and sets the number k of pointers to the selected leaf to k=1 (step S5502). The generating apparatus 3900 sets a preceding bit string of a pointer PL(k) to the selected leaf as the compression code of the selected leaf (step S5503). For example, in the case of the upper limit length N=11, if the selected leaf is the leaf structure of the character data "0", the compression code is "000000". Therefore, the preceding bit string of the pointer PL(k) to the selected leaf is also "000000" as depicted in FIG. 7.

The generating apparatus 3900 sets a bit length of the subsequent bit string of the pointer PL(k) to the selected leaf to a difference acquired by subtracting the compression code length CL of the selected leaf from the maximum compression code length N and sets initial values of the subsequent bit string to all zero (step S5504). For example, if the selected leaf is the leaf structure of the character data "0", the compression code length CL is 6 bits and, therefore, the bit length of the subsequent bit string is 5 bits (=11−6). In the case of k=1, the subsequent bit string is set to all zero and, therefore, the subsequent bit string is 5-bit "00000".

The generating apparatus 3900 stores the pointer PL(k) to the selected leaf into the root structure (step S5505). Subsequently, the generating apparatus 3900 determines whether k>b(CL) is satisfied (step S5506), where b(CL) is the number of branches per leaf at the compression code length CL of the selected leaf. If k>b(CL) is not satisfied (step S5506: NO), pointers to leaf are generated for not all the branches assigned to the selected leaf and, therefore, the generating apparatus 3900 increments k (step S5507).

The generating apparatus 3900 increments the current subsequent bit string and couples the incremented subsequent bit string to the end of the preceding bit string to newly generate the pointer PL(k) to the selected leaf (step S5508). The generating apparatus 3900 stores the pointer PL(k) to the selected leaf into the root structure (step S5509) and returns to step S5506. By repeating step S5506 to S5509, the pointers to leaf are generated to the number of branches per leaf. At step S5506, if k>b(CL) is satisfied (step S5506: YES), the generating apparatus 3900 goes to step S5402.

According to this embodiment, since the maximum branch number $2^N$ of the $2^N$-branch nodeless Huffman tree can be set to the optimum number depending on the number of types of character data appearing in the object file group, the size of the $2^N$-branch nodeless Huffman tree can be made appropriate. According to this embodiment, even if the upper limit length N is not an integer multiple of 2 to 4 (e.g., the upper limit length N=11 or 13), the $2^N$-branch nodeless Huffman tree can be generated with good compression efficiency.

Another example of the compression B process will be described. In the correction $B^+$ process and the correction $B^-$ process described above, the number of leaves at each compression code length is updated by dividing the number of leaves at each compression code length by the total occurrence provability on the basis of the number of leaves at each compression code length. On the other hand, in this example, the number of leaves is moved from the minimum compression code length CLmin toward the maximum compression code length CLmax (i.e., upper limit length N) such that the number of leaves at a smaller compression code length is increased/decreased as compared to the number of leaves at a larger compression code length.

For example, in the correction $B^+$ process of this example, the number of leaves is corrected such that the number of leaves at a smaller compression code length is decreased as compared to the number of leaves at a larger compression code length. On the other hand, in the correction $B^-$ process of this example, the number of leaves is moved such that the number of leaves at a smaller compression code length is increased as compared to the number of leaves at a larger compression code length. Subsequently, the corrected number of leaves is divided by the total occurrence provability to update the number of leaves at each compression code length.

In the example of the following description, description will be made of an example that the number L(CL) of leafs at a certain compression code length CL is corrected to be increased/decreased as compared to the number L(CL+1) of leaves at a compression code length (CL+1); however, a compression code length larger than the compression code length CL may be (CL+2), (CL+3), etc. The number of leaves to be moved is not limited to one and may be two or more. For example, the number of all the leaves at a source compression code length may be moved to a destination.

Figure 56:
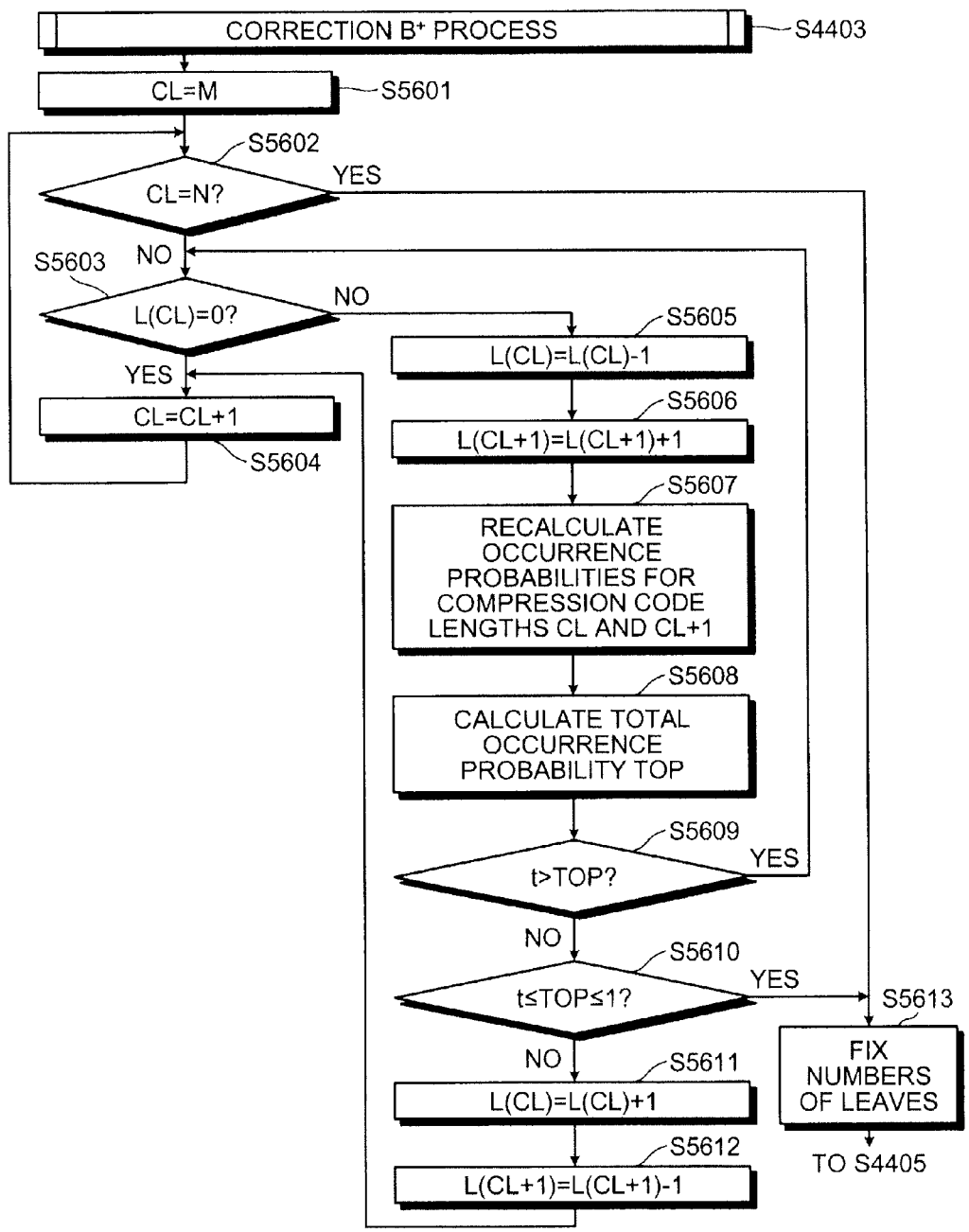
FIG. 56 is a flowchart of another example of the correction B+ process (step S4403)

FIG. 56 is a flowchart of another example of the correction $B^+$ process (step S4403). In the correction $B^+$ process (step S4403), the minimum compression code length CLmin is assumed to be M. The maximum compression code length CLmax is the upper limit length N. FIG. 56 depicts an example of moving the number of leaves one by one.

The generating apparatus 3900 sets the compression code length CL to CL=M (step S5601). The generating apparatus 3900 determines whether the compression code length CL is CL=N (step S5602). If CL=N is not satisfied (step S5602: NO), this means that the compression code length CL does not yet reach the maximum compression code length CLmax. In this case, the generating apparatus 3900 determines whether the number L(CL) of leaves is L(CL)=0 (step S5603).

If L(CL)=0 is satisfied (step S5603: YES), the number L(CL) of leaves to be moved does not exist and, therefore, the generating apparatus 3900 increments the compression code length CL (step S5604) and returns to step S5602. If the compression code length CL is CL=N (step S5602: YES), the generating apparatus 3900 goes to step S5613 to fix the number of leaves at each compression code length with this correction.

If the number L(CL) of leaves is not L(CL)=0 at step S5603 (step S5603: NO), the generating apparatus 3900 decrements the number L(CL) of leaves at the current object compression code length CL (step S5605) and increments the number L(CL+1) of leaves at the destination compression code length (CL+1) (step S5606).

Since the numbers of leaves are increased/decreased at the compression code lengths CL and (CL+1) at steps S5605 and S5606, the generating apparatus 3900 recalculates the occurrence probability for the compression code length CL and the occurrence probability for the compression code length (CL+1) (step S5607). Subsequently, the generating apparatus 3900 calculates the total occurrence probability TOP with the latest numbers of leaves at the compression code lengths CLmin to CLmax (step S5608).

The generating apparatus 3900 determines whether the calculated TOP satisfies t>TOP (step S5609). If t>TOP is satisfied (step S5609: YES), since room for improvement exists, the generating apparatus 3900 returns to step S5603. On the other hand, if t>TOP is not satisfied (step S5609: NO), the generating apparatus 3900 determines whether t≤TOP≤1 is satisfied (step S5610). If t≤TOP≤1 is satisfied (step S5610: YES), since correction is no longer necessary, the generating apparatus 3900 goes to step S5613.

On the other hand, if t≤TOP≤1 is not satisfied (step S5610: NO), the generating apparatus 3900 increments the number L(CL) of leaves at the current object compression code length CL (step S5611) and decrements the number L(CL+1) of leaves at the destination compression code length (CL+1) (step S5612). In other words, if t≤TOP≤1 is not satisfied (step S5610: NO), TOP>1 is satisfied, which means failure of this correction.

Therefore, the movement of the number of leaves at steps S5605 and S5606 is restored at steps S5611 and S5612. Subsequently, the generating apparatus 3900 returns to step S5604. Since the compression code length CL is incremented at step S5604, an increase in occurrence probability due to the movement of the number of leaves is reduced to ½ as compared to the compression code length CL before the increment. Therefore, as the compression code length CL is incremented, finer adjustment can be performed to achieve t≤TOP≤1 with more minute correction width.

At step S5613, the generating apparatus 3900 fixes the number L(CLmin) to the number L(CLmax) of leaves at the respective compression code lengths CLmin to CLmax at this point (step S5613). Subsequently, the generating apparatus 3900 goes to step S4405 to terminate the correction $B^+$ process (step S4403).

Figure 57:
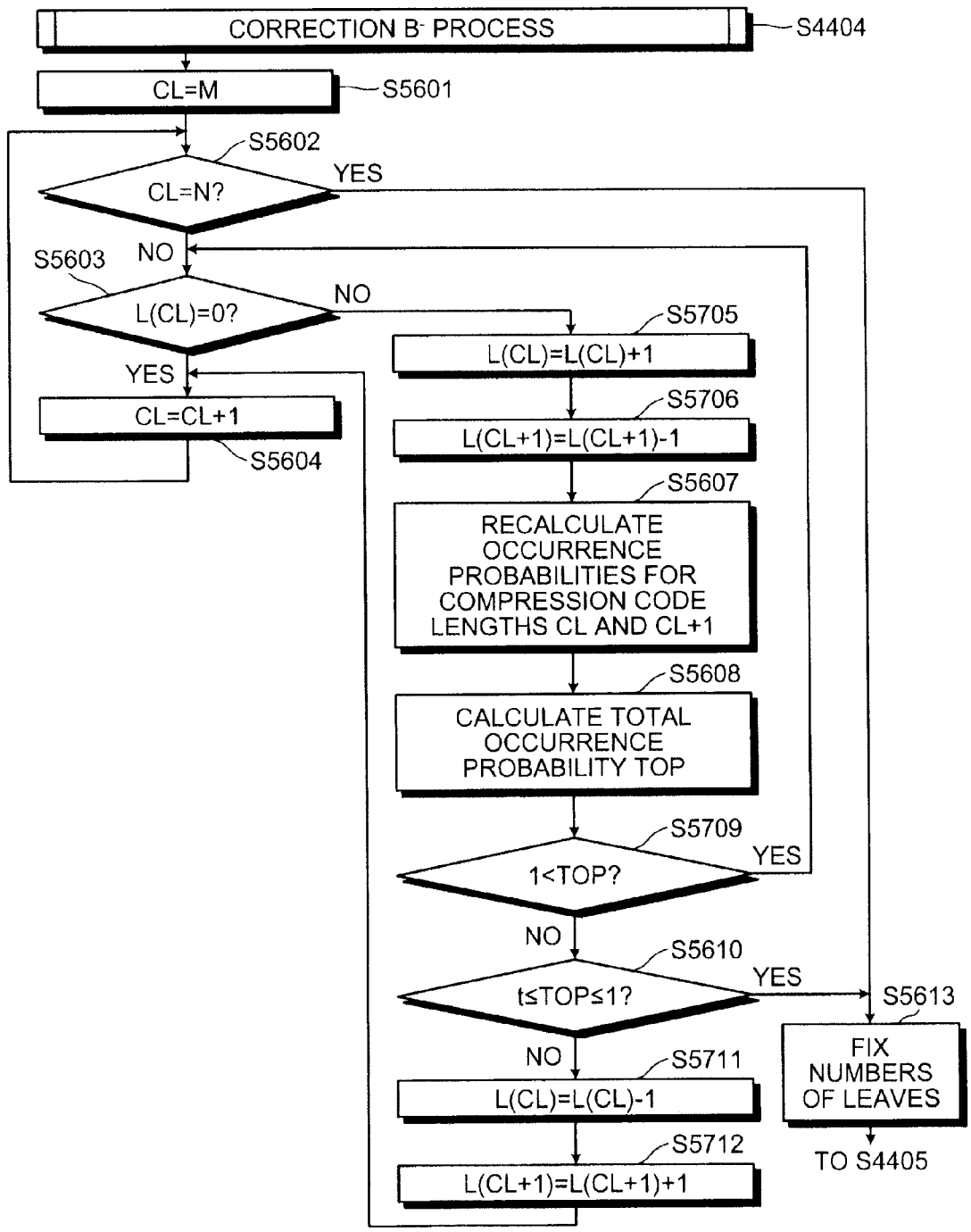
FIG. 57 is a flowchart of another example of the correction B- process (step S4404)

FIG. 57 is a flowchart of another example of the correction $B^-$ process (step S4404). The correction $B^-$ process (step S4404) has substantially the same contents as the correction $B^+$ process (step S4403) depicted in FIG. 56 and, therefore, the same process is denoted by the same step number. Differences exist in steps S5705, S5706, S5709, S5711, and S5712.

The generating apparatus 3900 sets the compression code length CL to CL=M (step S5601). The generating apparatus 3900 determines whether the compression code length CL is CL=N (step S5602). If CL=N is not satisfied (step S5602: NO), this means that the compression code length CL does not yet reach the maximum compression code length CLmax. In this case, the generating apparatus 3900 determines whether the number L(CL) of leaves is L(CL)=0 (step S5603).

If L(CL)=0 is satisfied (step S5603: YES), the number L(CL) of leaves to be moved does not exist and, therefore, the generating apparatus 3900 increments the compression code length CL (step S5604) and returns to step S5602. If the compression code length CL is CL=N (step S5602: YES), the generating apparatus 3900 goes to step S5613 to fix the number of leaves at each compression code length with this correction.

If the number L(CL) of leaves is not L(CL)=0 at step S5603 (step S5603: NO), the generating apparatus 3900 increments the number L(CL) of leaves at the current object compression code length CL (step S5705) and decrements the number L(CL+1) of leaves at the destination compression code length (CL+1) (step S5706).

Since the numbers of leaves are increased/decreased at the compression code lengths CL and (CL+1) at steps S5705 and S5706, the generating apparatus 3900 recalculates the occurrence probability for the compression code length CL and the occurrence probability for the compression code length (CL+1) (step S5607). Subsequently, the generating apparatus 3900 calculates the total occurrence probability TOP with the latest numbers of leaves at the compression code lengths CLmin to CLmax (step S5608).

The generating apparatus 3900 determines whether the calculated TOP satisfies 1<TOP (step S5709). If 1<TOP is satisfied (step S5709: YES), since room for improvement exists, the generating apparatus 3900 returns to step S5603. On the other hand, if 1<TOP is not satisfied (step S5709: NO), the generating apparatus 3900 determines whether t≤TOP≤1 is satisfied (step S5610). If t≤TOP≤1 is satisfied (step S5610: YES), since correction is no longer necessary, the generating apparatus 3900 goes to step S5613.

On the other hand, if t≤TOP≤1 is not satisfied (step S5610: NO), the generating apparatus 3900 decrements the number L(CL) of leaves at the current object compression code length CL (step S5711) and increments the number L(CL+1) of leaves at the destination compression code length (CL+1) (step S5712). In other words, if t≤TOP≤1 is not satisfied (step S5610: NO), t>TOP is satisfied, which means failure of this correction.

Therefore, the movement of the number of leaves at steps S5705 and S5706 is restored at steps S5711 and S5712. Subsequently, the generating apparatus 3900 returns to step S5604. Since the compression code length CL is incremented at step S5604, a decrease in occurrence probability due to the movement of the number of leaves is reduced to ½ as compared to the compression code length CL before the increment. Therefore, as the compression code length CL is incremented, finer adjustment can be performed to achieve t≤TOP≤1 with more minute correction width.

At step S5613, the generating apparatus 3900 fixes the number L(CLmin) to the number L(CLmax) of leaves at the respective compression code lengths CLmin to CLmax at this point (step S5613). Subsequently, the generating apparatus 3900 goes to step S4405 to terminate the correction B$^-$ process (step S4404).

FIG. 58 is a diagram of details of (3) Specification of Number of Leaves to (5) Generation of Leaf Structure (N=12) of FIG. 2 when another example of the correction B$^+$ process depicted in FIG. 56 is applied. FIG. 58 depicts an example that the number of leaves at a source compression code length is shifted one by one to the number of leaves at a destination compression code length smaller by 1 bit. In FIG. 58, the threshold value t of FIG. 56 is set to t=1. In FIG. 58, the correction B$^+$ process is applied since the total occurrence probability TOP with the correction A is "0.823". The destination is set as the minimum compression code length of 6 bits and the source is set as the compression code length of 7 bits, which is larger by 1 bit. In the correction B$^+$1, the number 9 of leaves at the compression code length of 7 bits is moved one by one to the compression code length of 6 bits.

The generating apparatus 3900 obtains the total occurrence probability TOP for each movement to determine whether the total occurrence probability TOP converges to the maximum asymptotic value less than or equal to one. In this example, the total occurrence probability TOP is not greater than one with the correction B$^-$1. If the number of leaves at the source compression code length of 7 bits becomes zero, the number of leaves at the destination compression code length of 6 bits is 11 (=9+2). Since the total occurrence probability TOP with the correction B$^-$1 at this point is "0.894", the correction B$^+$ is further required.

In the correction B$^+$2, the destination and source compression code lengths are increased by 1 bit. Therefore, the destination compression code length is changed from 6 bits to 7 bits and the source compression code length is changed from 7 bits to 8 bits.

The number 22 of leaves at the source compression code length of 8 bits is moved one by one to the destination compression code length of 7 bits at which the number of leaves becomes zero with the correction B$^+$1. The generating apparatus 3900 obtains the total occurrence probability TOP for each movement to determine whether the total occurrence probability TOP converges to the maximum asymptotic value less than or equal to one. In this example, the total occurrence probability TOP is not greater than one with the correction B$^+$2. If the number of leaves at the source compression code length of 8 bits becomes zero, the number of leaves at the destination compression code length of 7 bits is 22 (=0+22). Since the total occurrence probability TOP with the correction B$^+$2 at this point is "0.979", the correction B$^+$ is further required.

In the correction B$^+$3, the destination and source compression code lengths are increased by 1 bit. Therefore, the destination compression code length is changed from 7 bits to 8 bits and the source compression code length is changed from 8 bits to 9 bits.

The number 19 of leaves at the source compression code length of 9 bits is moved one by one to the destination compression code length of 8 bits at which the number of leaves becomes zero with the correction B$^+$2. The generating apparatus 3900 obtains the total occurrence probability TOP for each movement to determine whether the total occurrence probability TOP converges to the maximum asymptotic value less than or equal to one. In this example, the total occurrence probability TOP exceeds one when the number of leaves at the source compression code length of 9 bits is changed from 28 to 17 and the number of leaves at the destination compression code length of 8 bits is changed from 0 to 11. Therefore, each of the numbers of the leaves is restored by one to set the number of leaves at the source compression code length of 9 bits to 18 and the number of leaves at the destination compression code length of 8 bits to 10, and the correction B$^+$3 is terminated. Since the total occurrence probability TOP with the correction B$^+$3 at this point is "0.999", the correction B$^+$ is further required.

In the correction B$^+$4, the destination and source compression code lengths are increased by 1 bit. Therefore, the destination compression code length is changed from 8 bits to 9 bits and the source compression code length is changed from 9 bits to 10 bits.

The number 29 of leaves at the source compression code length of 10 bits is moved one by one to the destination compression code length of 9 bits at which the number of leaves is set to 18 with the correction $B^+3$. The generating apparatus 3900 obtains the total occurrence probability TOP for each movement to determine whether the total occurrence probability TOP converges to the maximum asymptotic value less than or equal to one. In this example, the total occurrence probability TOP exceeds one when the number of leaves at the source compression code length of 10 bits is changed from 29 to 27 and the number of leaves at the destination compression code length of 9 bits is changed from 18 to 20. Therefore, each of the numbers of the leaves is restored by one to set the number of leaves at the source compression code length of 10 bits to 28 and the number of leaves at the destination compression code length of 9 bits to 19, and the correction $B^+4$ is terminated. Since the total occurrence probability TOP with the correction $B^+4$ at this point is "1.000", the correction $B^+$ is further required.

In the correction $B^+5$, the destination and source compression code lengths are increased by 1 bit. Therefore, the destination compression code length is changed from 9 bits to 10 bits and the source compression code length is changed from 10 bits to 11 bits.

The number 25 of leaves at the source compression code length of 11 bits is moved one by one to the destination compression code length of 10 bits at which the number of leaves is set to 28 with the correction $B^+4$. The generating apparatus 3900 obtains the total occurrence probability TOP for each movement to determine whether the total occurrence probability TOP converges to the maximum asymptotic value less than or equal to one. In this example, the total occurrence probability TOP exceeds one when the number of leaves at the source compression code length of 11 bits is changed from 25 to 23 and the number of leaves at the destination compression code length of 10 bits is changed from 28 to 30. Therefore, each of the numbers of the leaves is restored by one to set the number of leaves at the source compression code length of 11 bits to 24 and the number of leaves at the destination compression code length of 10 bits to 29, and the correction $B^+5$ is terminated. Since the total occurrence probability TOP with the correction $B^+5$ at this point is "1.000", the correction $B^+$ is further required.

In the correction $B^+6$, the destination and source compression code lengths are increased by 1 bit. Therefore, the destination compression code length is changed from 10 bits to 11 bits and the source compression code length is changed from 11 bits to 12 bits.

The number 2214 of leaves at the source compression code length of 12 bits is moved one by one to the destination compression code length of 11 bits at which the number of leaves is set to 24 with the correction $B^+5$. The generating apparatus 3900 obtains the total occurrence probability TOP for each movement to determine whether the total occurrence probability TOP converges to the maximum asymptotic value less than or equal to one. In this example, the total occurrence probability TOP exceeds one when the number of leaves at the source compression code length of 12 bits is changed from 2214 to 2213 and the number of leaves at the destination compression code length of 11 bits is changed from 24 to 25. Therefore, each of the numbers of the leaves is restored by one. The restored numbers of leaves are identical to the numbers of leaves at the end of the correction $B^+5$. The total occurrence probability TOP at the end of the correction $B^+5$ is "1.000". In this example, the source compression code length can no longer be increased and, therefore, the numbers of leaves at the end of the correction $B^+5$ are fixed.

FIG. 59 is a diagram of details of (3) Specification of Number of Leaves to (5) Generation of Leaf Structure (N=11) of FIG. 2 when another example of the correction $B^-$ process described above is applied. FIG. 59 depicts an example that the number of all the leaves at a source correction code length is shifted to the number of leaves at a destination compression code length, which is larger by 1 bit. In FIG. 59, the threshold value t of FIG. 57 is set to t=1. In FIG. 59, the correction $B^-$ process is applied since the total occurrence probability TOP with the correction A is "1.146". The source is set as the minimum compression code length of 5 bits and the destination is set as the compression code length of 6 bits, which is larger by 1 bit. In the correction $B^-1$, the number 2 of leaves at the source compression code length of 5 bits is moved one by one to the compression code length of 6 bits.

The generating apparatus 3900 obtains the total occurrence probability TOP for each movement to determine whether the total occurrence probability TOP converges to the maximum asymptotic value less than or equal to one. In this example, the total occurrence probability TOP does not become less than or equal to one with the correction $B^-1$. If the number of leaves at the source compression code length of 5 bits becomes zero, the number of leaves at the destination compression code length of 6 bits is 11 (=9+2). Since the total occurrence probability TOP with the correction $B^-1$ at this point is "1.115", the correction $B^-$ is further required.

In the correction $B^-2$, the destination and source compression code lengths are increased by 1 bit. Therefore, the source compression code length is changed from 5 bits to 6 bits and the destination compression code length is changed from 6 bits to 7 bits.

The number 11 of leaves at the source compression code length of 6 bits is moved one by one to the number 22 of leaves at the destination compression code length of 7 bits. The generating apparatus 3900 obtains the total occurrence probability TOP for each movement to determine whether the total occurrence probability TOP converges to the maximum asymptotic value less than or equal to one. In this example, the total occurrence probability TOP does not become less than or equal to one with the correction $B^-2$. If the number of leaves at the source compression code length of 6 bits becomes zero, the number of leaves at the destination compression code length of 7 bits is 33 (=22+11). Since the total occurrence probability TOP with the correction $B^-2$ at this point is "1.029", the correction $B^-$ is further required.

In the correction $B^-3$, the destination and source compression code lengths are increased by 1 bit. Therefore, the source compression code length is changed from 6 bits to 7 bits and the destination compression code length is changed from 7 bits to 8 bits.

The number 33 of leaves at the source compression code length of 7 bits is moved one by one to the number 28 of leaves at the destination compression code length of 8 bits. The generating apparatus 3900 obtains the total occurrence probability TOP for each movement to determine whether the total occurrence probability TOP converges to the maximum asymptotic value less than or equal to one. In this example, the total occurrence probability TOP is "0.998", which is less than or equal to one, when the number of leaves at the source compression code length of 7 bits reaches 25 and the number of leaves at the destination compression code length of 8 bits reaches 36. Since the total occurrence probability TOP decreases even if the number of leaves is further moved, the numbers of leaves at the compression code lengths at this point are fixed.

A compression process of an object file group using the $2^N$-branch nodeless Huffman tree described above will be described. The compression process may be executed by the generating apparatus 3900 or may be executed by an information processing apparatus storing the $2^N$-branch nodeless Huffman tree. In other words, at least the $2^N$-branch nodeless Huffman tree may be stored. The generating apparatus 3900 and the information processing apparatus will hereinafter collectively be referred to as a computer. A compression object character string and compression codes thereof will be taken as an example for the description.

FIG. 60 is a diagram of an example of a compression object character string. FIG. 60 depicts 16-bit codes (in hexadecimal and binary) of a character string 次の熊は.

FIG. 61 is a diagram of a compression code of the compression object character string depicted in FIG. 60. The compression code depicted in FIG. 61 is depicted as an example of compression using the $2^N$-branch nodeless Huffman tree (N=12) depicted in FIG. 22. In FIG. 61, as compared to FIG. 60, a higher-order character 次 is compressed from 16 bits into 12 bits. A higher-order character の is compressed from 16 bits into 7 bits.

An upper divided character code "0x51" of 熊 is compressed from 8 bits into 11 bits. A lower divided character code "0x4E" of 熊 is compressed from 8 bits into 11 bits. A higher-order character は is compressed from 16 bits into 9 bits. Although the divided character codes have a longer bit length after the compression, a single character such as 熊 is originally divided because of a smaller number of appearances and therefore causes no problem in the object file group as a whole.

FIG. 62 is a diagram of another example of a compression object character string. FIG. 62 depicts 16-bit codes (in hexadecimal and binary) of a character string 熊は動物園の.

FIG. 63 is a diagram of a compression code of the compression object character string depicted in FIG. 62. The compression code depicted in FIG. 63 is depicted as an example of compression using the $2^N$-branch nodeless Huffman tree (N=13) depicted in FIG. 32. In FIG. 63, as compared to FIG. 62, the upper divided character code "0x51" of 熊 is compressed from 8 bits into 12 bits. The lower divided character code "0x4E" of 熊 is compressed from 8 bits into 12 bits. The higher-order character は is compressed from 16 bits into 10 bits.

動物園 corresponds to a basic word and is therefore compressed from 48 bits into 13 bits. The higher-order character の is compressed from 16 bits into 8 bits.

Although the divided character codes have a longer bit length after the compression, a single character such as 熊 is originally divided because of a smaller number of appearances and therefore causes no problem in the object file group as a whole. The basic word has a very short compression code (up to 13 bits) as compared to the bit string thereof and, therefore, the compression efficiency is sufficiently improved if two or more characters (higher-order characters) are included.

Figure 64:
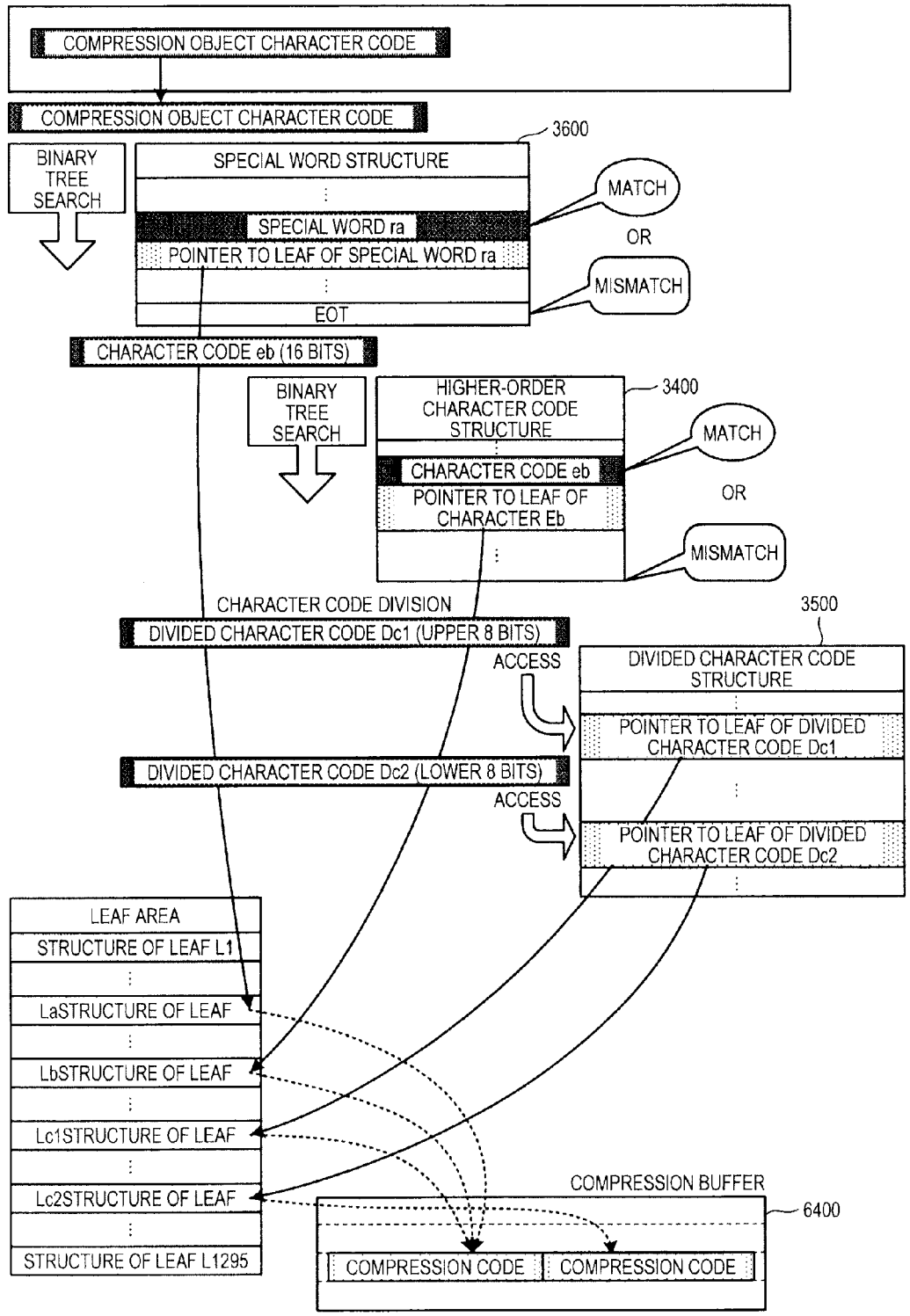
FIG. 64 is a diagram of a specific example of the compression process using a $2^N$-branch nodeless Huffman tree.

FIG. 64 is a diagram of a specific example of the compression process using a $2^N$-branch nodeless Huffman tree. The computer acquires a compression object character code of a first character from the object file group Fs and retains a position on an object file. The computer performs a binary tree search of the special word structure 3600. Since a special word is a character code string of two or more characters, if the compression object character code of the first character is hit, a character code of a second character is acquired as the compression object character code.

The character code of the second character is searched from the position where the compression object character code of the first character is hit. The binary tree search is repeatedly performed for a third character or later until a mismatching compression object character code appears. If a matching special word ra ("a" is a number of a leaf) is retrieved, a pointer to the leaf La correlated in the special word structure 3600 is used to access a structure of the leaf La. The computer searches for the compression code of the special word ra stored in the accessed structure of the leaf La and stores the compression code into a compression buffer 6400.

On the other hand, if a mismatching compression character code appears, the binary tree search of the special word structure 3600 is terminated (proceeds to End Of Transmission (EOT)). The computer sets the compression object character code of the first character into a register again and performs the binary tree search of the higher-order character code structure 3400.

If a matching character code eb (b is a number of a leaf) is retrieved, the computer uses a pointer to the leaf Lb to access a structure of the leaf Lb. The computer searches for the compression code of the character code eb stored in the accessed structure of the leaf Lb and stores the compression code into the compression buffer 6400.

On the other hand, if no matching character code appears and the binary tree search is terminated, the compression object character code is not a higher-order character code and, therefore, the computer divides the compression object character code into upper 8 bits and lower 8 bits. For the divided character code of the upper 8 bits, the computer performs a binary tree search of the divided character code structure 3500. If a matching divided character code Dc1 (c1 is a number of a leaf) is retrieved, the computer uses a pointer to the leaf Lc1 to access a structure of the leaf Lc1. The computer searches for the compression code of the divided character code Dc1 stored in the accessed structure of the leaf Lc1 and stores the compression code into the compression buffer 6400.

For the divided character code of the lower 8 bits, the computer continues the binary tree search of the divided character code structure 3500. If a matching divided character code Dc2 (c2 is a number of a leaf) is retrieved, the computer uses a pointer to the leaf Lc2 to access a structure of the leaf Lc2. The computer searches for the compression code of the divided character code Dc2 stored in the accessed structure of the leaf Lc2 and stores the compression code into the compression buffer 6400.

Figure 65:
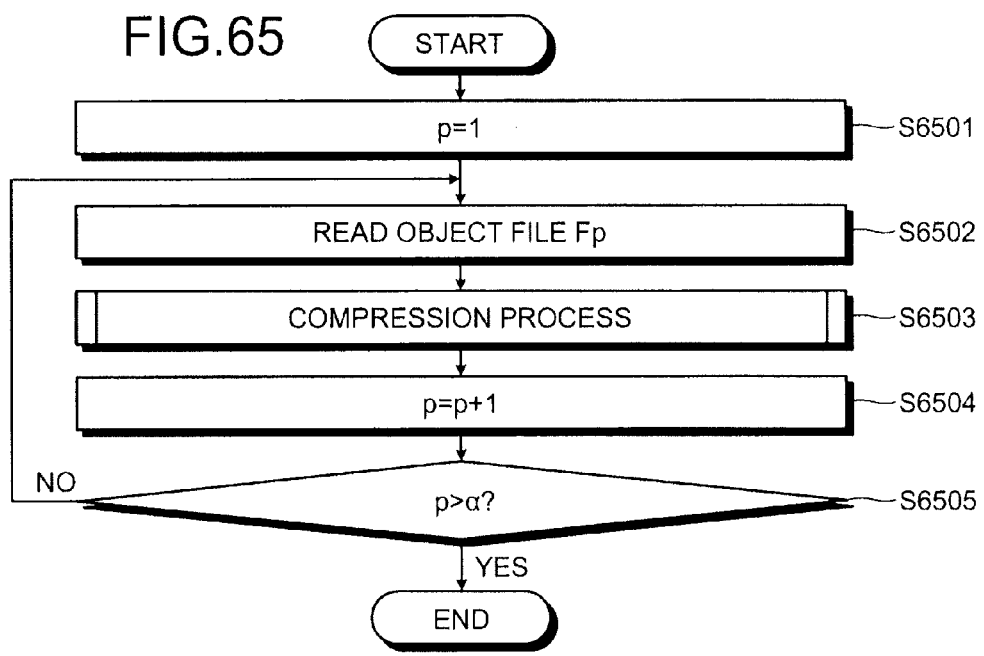
FIG. 65 is a flowchart of a file compression process procedure using a $2^N$-branch nodeless Huffman tree automatically executed by the computer.

FIG. 65 is a flowchart of a file compression process procedure using a $2^N$-branch nodeless Huffman tree automatically executed by the computer. The computer sets the file number: p to p=1 (step S6501) and reads an object file Fp (step S6502). The computer executes the compression process (step S6503) and increments the file number: p (step S6504). The computer determines whether p>α is satisfied (step S6505), where α is the total number of the object files Fs. If p>α is not satisfied (step S6505: NO), the computer returns to step S6502. On the other hand, if p>α is satisfied (step S6505: YES), the computer terminates a sequence of the file compression process.

Figure 66:
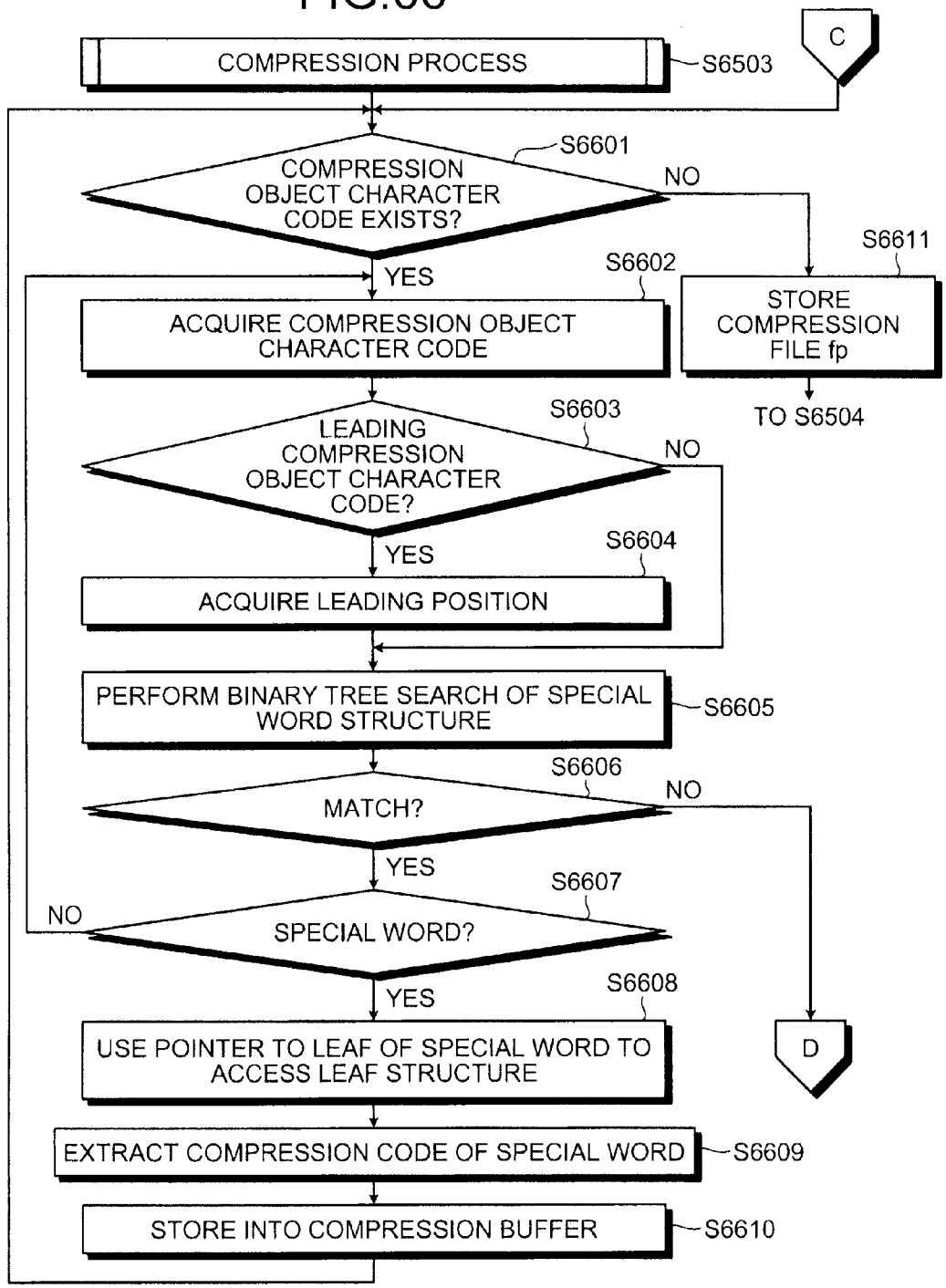
FIG. 66 is a flowchart (part 1) of the compression process (step S6503) depicted in FIG. 65.

FIG. 66 is a flowchart (part 1) of the compression process (step S6503) depicted in FIG. 65. In FIG. 66, the computer determines whether a compression object character code exists in the object file group Fs (step S6601). If existing (step S6601: YES), the computer acquires and sets the compression object character code in the register (step S6602). The computer determines whether the compression object character code is the leading compression object character code (step S6603).

The leading compression object character code is an uncompressed character code of a first character. If the code is the leading code (step S6603: YES), the computer acquires a pointer of the position (leading position) of the compression object character code on the object file group Fs (step S6604) and goes to step S6605. On the other hand, if the code is not the leading code (step S6603: NO), the computer goes to step S6605 without acquiring the leading position.

The computer performs the binary tree search of the special word structure 3600 (step S6605). If the compression object character code matches (step S6606: YES), the computer determines whether a continuous matching character code string corresponds to (a character code string of) a special word (step S6607). If not corresponding (step S6607: NO), the computer returns to step S6602 and acquires the subsequent character code as the compression object character code. In this case, since the subsequent character code is not the leading code, the leading position is not acquired.

On the other hand, at step S6607, if corresponding to a special word (step S6607: YES), the computer uses a pointer to a leaf L# of the corresponding special word to access a structure of the leaf L# (step S6608). The computer extracts the compression code of the special word stored in the pointed structure of the leaf L# (step S6609).

Subsequently, the computer stores the extracted compression code into the compression buffer 6400 (step S6610) and returns to step S6601. This loop makes up a flow of the compression process of special words. At step S6601, if no compression object character code exists (step S6601: NO), the computer performs file output from the compression buffer 6400 to store a compression file fp acquired by compressing an object file Fp (step S6611). The computer goes to step S6504. On the other hand, if not matching at step S6606 (step S6606: NO), the computer enters a loop of the compression process of 16-bit character codes.

Figure 67:
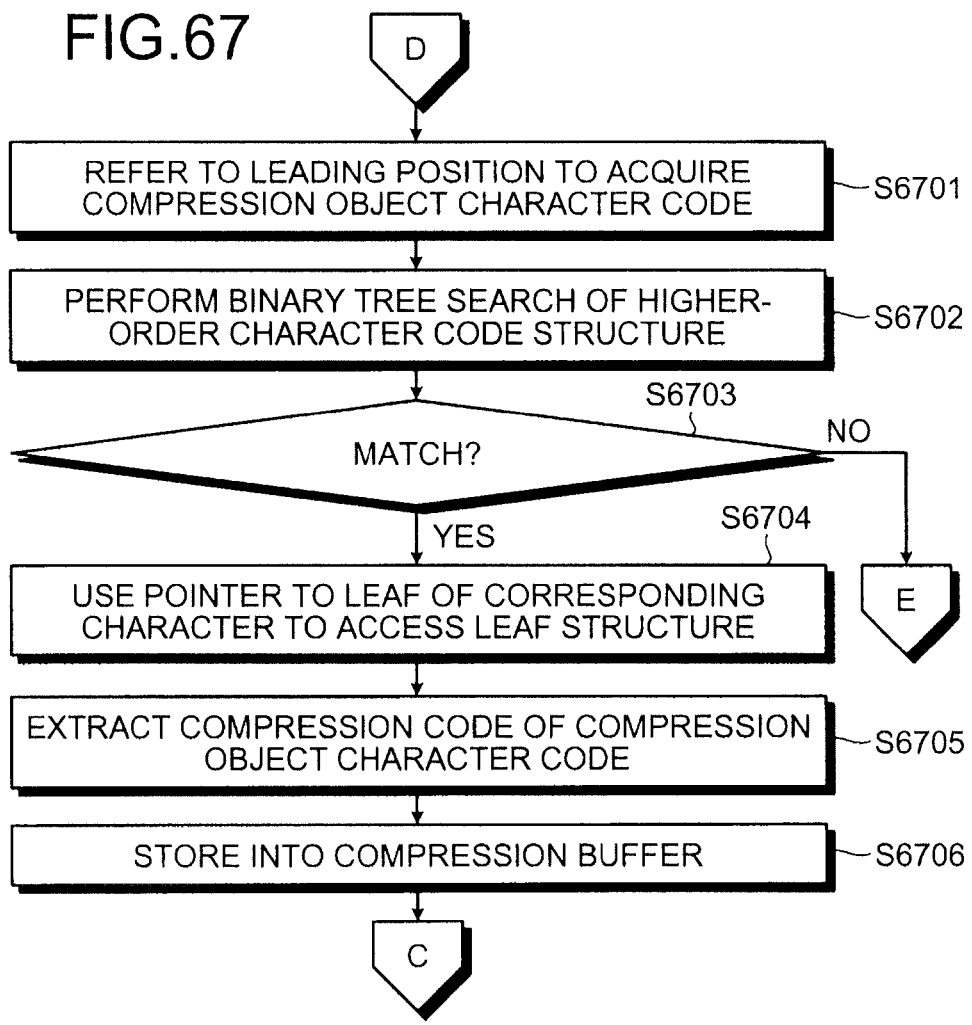
FIG. 67 is a flowchart (part 2) of the compression process (step S6503) depicted in FIG. 65.

FIG. 67 is a flowchart (part 2) of the compression process (step S6503) depicted in FIG. 65. In FIG. 67, the computer refers to the pointer of the leading position acquired at step S6604 to acquire and set the compression object character code from the object file group Fs into the register (step S6701).

The computer performs the binary tree search of the higher-order character code structure 3400 for the compression object character code (step S6702). If matching (step S6703: YES), the computer uses a pointer to the leaf L# of the corresponding character to access the structure of the leaf L# (step S6704). The computer extracts the compression code of the compression object character code stored in the pointed structure of the leaf L# (step S6705).

Subsequently, the computer stores the retrieved compression code into the compression buffer 6400 (step S6706) and returns to step S6601. This loop makes up a flow of the compression process of 16-bit character codes. On the other hand, if no matching character code exists at step S6703 (step S6703: NO), the computer enters a loop of the compression process of divided character codes.

Figure 68:
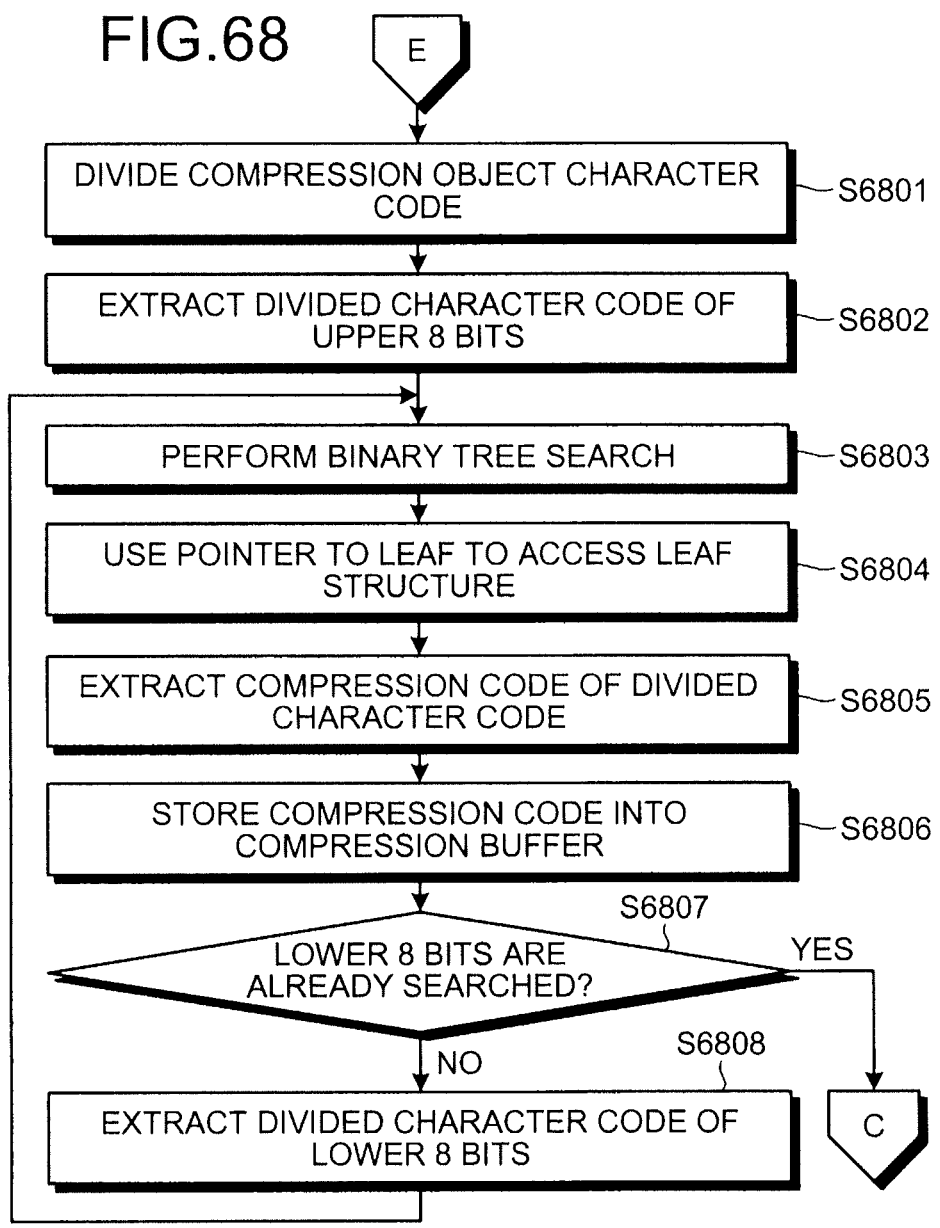
FIG. 68 is a flowchart (part 3) of the compression process (step S6503) depicted in FIG. 65.

FIG. 68 is a flowchart (part 3) of the compression process (step S6503) depicted in FIG. 65. In FIG. 68, the computer divides the compression object character code into upper 8 bits and lower 8 bits (step S6801) and extracts the divided character code of the upper 8 bits (step S6802). The computer performs the binary tree search of the divided character code structure 3500 (step S6803).

The computer uses a pointer to the leaf L# of the retrieved divided character code to access the structure of the leaf L# (step S6804). The computer extracts the compression code of the divided character code stored in the pointed structure of the leaf L# (step S6805). Subsequently, the computer stores the retrieved compression code into the compression buffer 6400 (step S6806).

The computer determines whether the lower 8 bits are already searched (step S6807) and if not already searched (step S6807: NO), the computer extracts the divided character code of the lower 8 bits (step S6808) and executes steps S6803 to S6806. On the other hand, if the lower 8 bits are already searched (step S6807: YES), the computer returns to step S6601 and enters the loop of the compression process of special words.

As described above, in the compression process using the $2^N$-branch nodeless Huffman tree, it is not necessary to search toward the root because of the absence of inner nodes, and the character data stored in the pointed structure of the leaf L# may simply be extracted and written into the compression buffer 6400. Therefore, the compression process can be accelerated.

The structure of the leaf L# storing the compression object character code can immediately be identified from the special word structure 3600, the higher-order character code structure 3400, and the divided character code structure 3500. Therefore, it is not necessary to search the leaves of the $2^N$-branch nodeless Huffman tree and the compression process can be accelerated. By dividing a lower-order character code into an upper bit code and a lower bit code, sixty thousand or more lower-order character codes can be compressed into compression codes of only 256 types of divided character codes. Therefore, the compression rate can be improved.

A decompression process example of decompressing a compression code string compressed by using the $2^N$-branch nodeless Huffman tree will be described.

FIGS. 69 to 73 are diagrams of a decompression process example of the compression code string depicted in FIG. 61. In the decompression process, the computer sets the compression code string in the register and extracts a compression code through a mask pattern. The extracted compression code is searched from the root of the $2^N$-branch nodeless Huffman tree by one pass (access through one branch). The computer reads and stores a character code stored in the accessed structure of the leaf L# into a decompression buffer 6900.

To extract the compression code, the computer offsets a mask position of the mask pattern. The initial value of the mask pattern is set to "0xFFF00000". This mask pattern is a bit string having the leading 12 bits of "1" and the subsequent 20 bits of "0".

The computer calculates a bit address abi, a byte offset byos, and a bit offset bios. The bit address abi is a value indicative of a bit position of the extracted compression code and the current bit address abi is a value obtained by adding a compression code length leg of the previously extracted compression code to the pervious bit address abi. In the initial state, the bit address abi is set to abi=0.

The byte offset byos is a value indicative of a byte boundary of the compression code string retained in a memory and is obtained as a quotient of the bit address abi/8. For example, in the case of the byte offset byos=0, the compression code string from the start stored in the memory is set in the register and, in the case of the byte offset byos=1, the compression code string from the first byte stored in the memory is set in the register.

The bit offset bios is a value of offsetting the mask position ("FFF") of the mask pattern and is a remainder of the bit address abi/8. For example, in the case of the bit offset bios=0, the mask position is not shifted, resulting in the mask pattern of "0xFFF00000". On the other hand, in the case of the bit offset bios=4, the mask position is shifted by 4 bits toward the end, resulting in the mask pattern of "0x0FFF0000".

A register shift number rs is the number of bits by which the compression code string in the register is shifted toward the end after the AND operation with the mask pattern, and is obtained from rs=32-12-bios. Due to this shift, the computer extracts a bit string of the ending m bits in the register after the shift as an object bit string. After the object bit string is extracted, the computer clears the register.

In FIGS. 69 to 73, it is assumed that the compression code string depicted in FIG. 61 is retained in the memory. A block in the memory of FIGS. 69 to 73 indicates a one-byte bit string and a numerical character inside indicates a byte position acting as a byte boundary.

Figure 69:
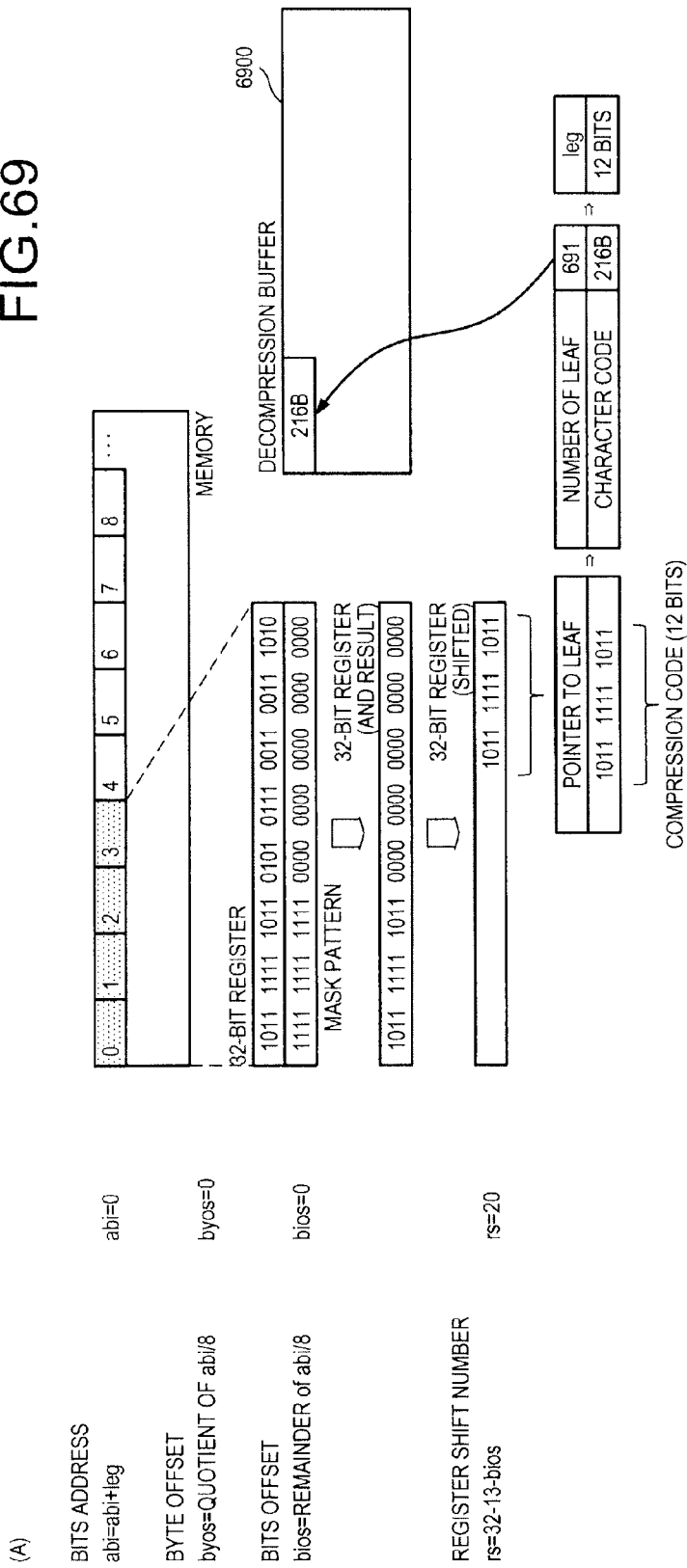
FIG. 69 is a diagram (part 1) of a decompression process example of the compression code string depicted in FIG. 61.

FIG. 69 depicts an initial state (state of (A)). In (A), the bit address abi=0 leads to the byte offset byos=0 and the bit offset bios=0. Because of the byte offset byos=0, the computer sets in the register a compression code string of 4 bytes (shaded in FIG. 69) from the start of the compression code string retained in the memory.

Because of the bit offset bios=0, the mask pattern is "0xFFF00000". Therefore, an AND result is acquired from the logical product (AND) operation of the compression code string set in the register and the mask pattern "0xFFF00000".

Because of the bit offset bios=0, the register shift number rs is rs=32−m−bios=32−12−0=20. Therefore, the AND result in the register is shifted by 20 bits toward the end. Due to this shift, "101111111011" is left in the register and, therefore, the computer extracts the ending 12 bits as the object bit string. In this case, "101111111011" is extracted as the object bit string. After the extraction, the register is cleared.

As depicted in FIG. 22, the pointers to leaves L1 to L2329 are stored in the root structure of the $2^N$-branch nodeless Huffman tree. Therefore, the computer searches for the pointer to the leaf L# matched with the extracted object bit string "101111111011". In this case, since one of the pointers to the leaf L691 is matched, the computer reads the corresponding pointer to the leaf L691 to access the structure of the leaf L691.

Since the structure of the leaf L691 stores a character code "0x216B" (corresponding to a higher-order character: 來), the computer extracts and stores this character code "0x216B" into the decompression buffer 6900. Since the structure of the leaf L691 also stores the compression code length leg (=12 bits) of the character code "0x216B", the computer also extracts the compression code length leg of the character code "0x216B". The computer updates the bit address abi with this extracted compression code length leg. In this case, the updated bit address abi is abi=0+12=12.

Figure 70:
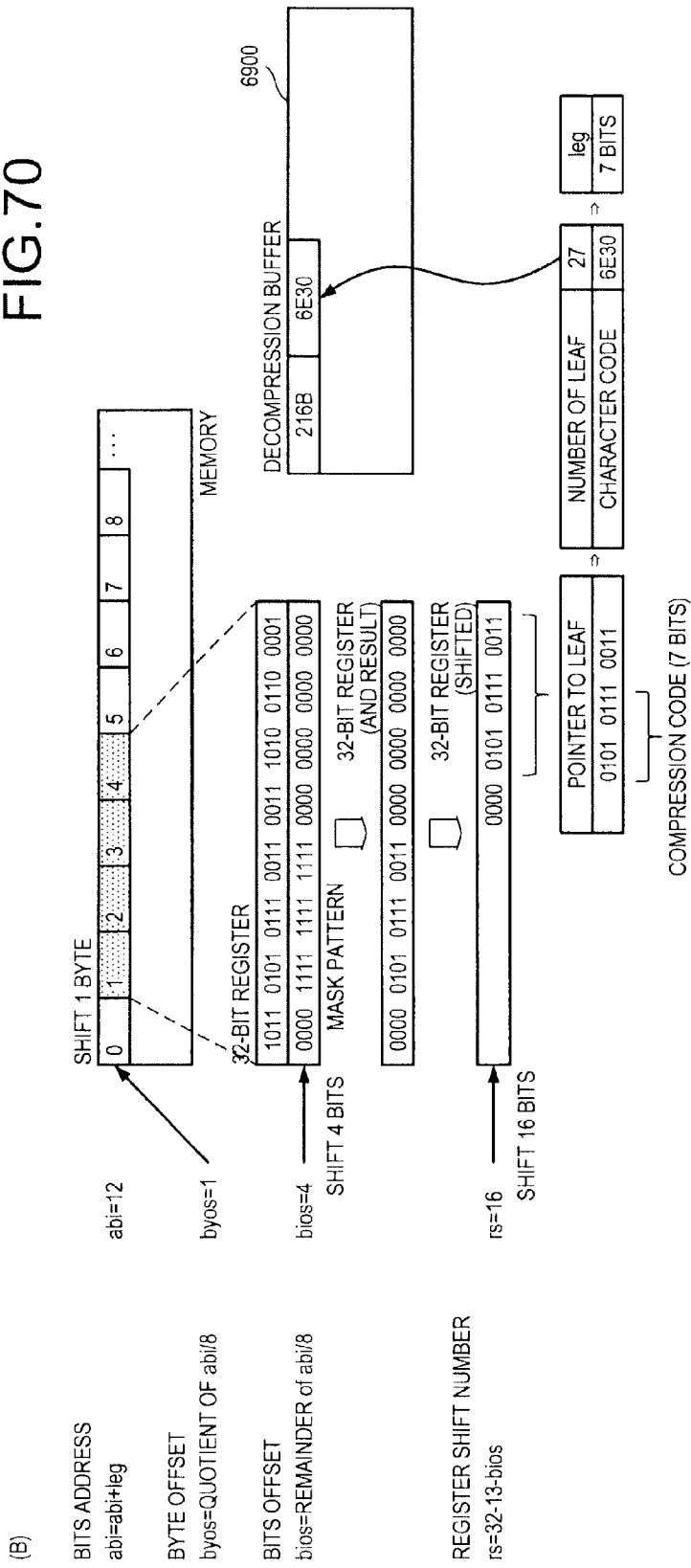
FIG. 70 is a diagram (part 2) of a decompression process example of the compression code string depicted in FIG. 61.

FIG. 70 depicts a decompression process if the register is shifted by the byte offset byos from the state of (A) depicted in FIG. 69 (state of (B)). Since the previous bit address abi of (A) is abi=0 and the compression code length leg is 12 bits, the bit address abi of (B) is abi=12 bits.

This bit address abi=12 leads to the byte offset byos=1 and the bit offset bios=4. Because of the byte offset byos=1, the computer sets in the register a compression code string of 4 bytes (shaded in FIG. 70) from the first byte of the compression code string retained in the memory.

Because of the bit offset bios=4, the mask pattern is "0x0FFF0000". Therefore, an AND result is acquired from the logical product (AND) operation of the compression code string set in the register and the mask pattern "0x0FFF0000".

Because of the bit offset bios=4, the register shift number rs is rs=32−m−bios=32−12−4=16. Therefore, the AND result in the register is shifted by 16 bits toward the end. Due to this shift, "0000010101110011" is left in the register and, therefore, the computer extracts the ending 12 bits as the object bit string. In this case, "010101110011" is extracted as the object bit string. After the extraction, the register is cleared.

As depicted in FIG. 22, the pointers to leaves L1 to L2329 are stored in the root structure of the $2^N$-branch nodeless Huffman tree. Therefore, the computer searches for the pointer to the leaf L# matched with the extracted object bit string "010101110011". In this case, since one of the pointers to the leaf L27 is matched, the computer reads the corresponding pointer to the leaf L27 to access the structure of the leaf L27.

Since the structure of the leaf L27 stores a character code "0x6E30" (corresponding to a higher-order character: ◎), the computer extracts and stores this character code "0x6E30" into the decompression buffer 6900. Since the structure of the leaf L27 also stores the compression code length leg (=7 bits) of the character code "0x6E30", the computer also extracts the compression code length leg of the character code "0x6E30". The computer updates the bit address abi with this extracted compression code length leg. In this case, the updated bit address abi is abi=12+7=19.

Figure 71:
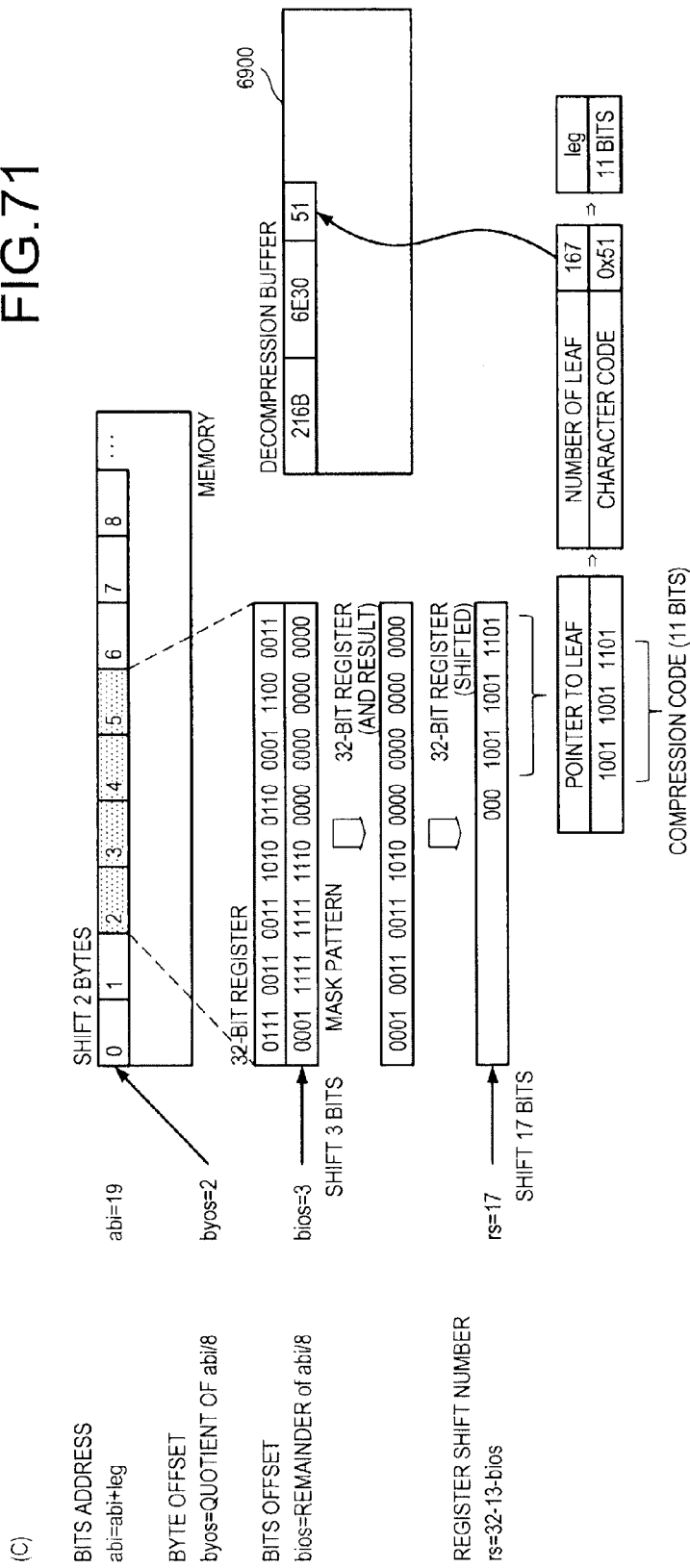
FIG. 71 is a diagram (part 3) of a decompression process example of the compression code string depicted in FIG. 61.

FIG. 71 depicts a decompression process if the register is shifted by the byte offset byos from the state of (B) depicted in FIG. 70 (state of (C)). Since the previous bit address abi of (B) is abi=12 and the compression code length leg is 7 bits, the bit address abi of (C) is abi=19 bits.

This bit address abi=19 leads to the byte offset byos=2 and the bit offset bios=3. Because of the byte offset byos=2, the computer sets in the register a compression code string of 4 bytes (shaded in FIG. 71) from the second byte of the compression code string retained in the memory.

Because of the bit offset bios=3, the mask pattern is "0x1FFE0000". Therefore, an AND result is acquired from the logical product (AND) operation of the compression code string set in the register and the mask pattern "0x1FFE0000".

Because of the bit offset bios=3, the register shift number rs is rs=32−m−bios=32−12−3=17. Therefore, the AND result in the register is shifted by 17 bits toward the end. Due to this shift, "000100110011101" is left in the register and, therefore, the computer extracts the ending 12 bits as the object bit string. In this case, "100110011101" is extracted as the object bit string. After the extraction, the register is cleared.

As depicted in FIG. 22, the pointers to leaves L1 to L2329 are stored in the root structure of the $2^N$-branch nodeless Huffman tree. Therefore, the computer searches for the pointer to the leaf L# matched with the extracted object bit string "100110011101". In this case, since one of the pointers to the leaf L167 is matched, the computer reads the corresponding pointer to the leaf L167 to access the structure of the leaf L167.

Since the structure of the leaf L167 stores a divided character code "0x51", the computer extracts and stores this character code "0x51" into the decompression buffer 6900. Since the structure of the leaf L167 also stores the compression code length leg (=11 bits) of the character code "0x51", the computer also extracts the compression code length leg of the character code "0x51". The computer updates the bit address abi with this extracted compression code length leg. In this case, the updated bit address abi is abi=19+11=30.

Figure 72:
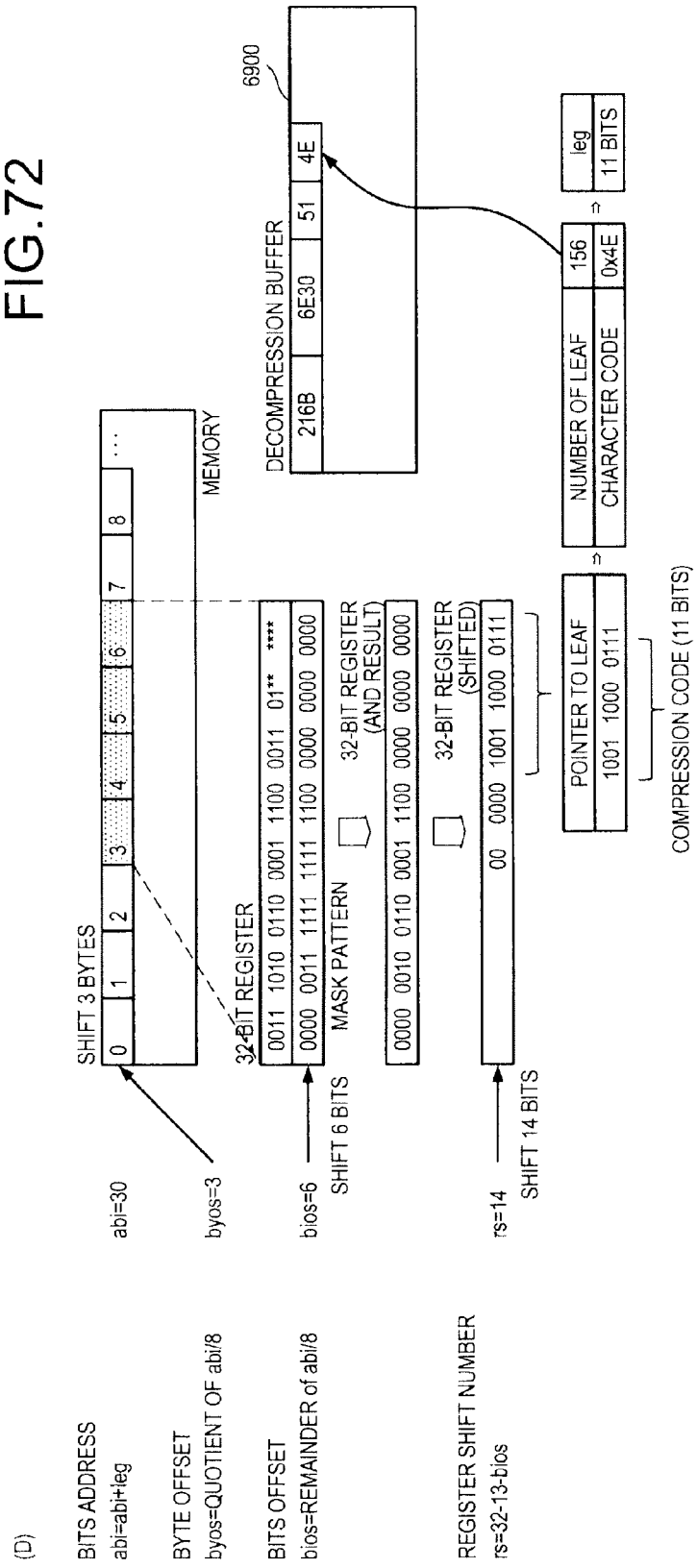
FIG. 72 is a diagram (part 4) of a decompression process example of the compression code string depicted in FIG. 61.

FIG. 72 depicts a decompression process if the register is shifted by the byte offset byos from the state of (C) depicted in FIG. 71 (state of (D)). Since the previous bit address abi of (C) is abi=19 and the compression code length leg is 11 bits, the bit address abi of (D) is abi=30 bits.

This bit address abi=30 leads to the byte offset byos=3 and the bit offset bios=6. Because of the byte offset byos=3, the computer sets in the register a compression code string of 4 bytes (shaded in FIG. 72) from the third byte of the compression code string retained in the memory.

Because of the bit offset bios=6, the mask pattern is "0x03FFC000". Therefore, an AND result is acquired from the logical product (AND) operation of the compression code string set in the register and the mask pattern "0x03FFC000".

Because of the bit offset bios=6, the register shift number rs is rs=32−m−bios=32−12−6=14. Therefore, the AND result in the register is shifted by 14 bits toward the end. Due to this shift, "0000000100110000111" is left in the register and, therefore, the computer extracts the ending 12 bits as the object bit string. In this case, "100110000111" is extracted as the object bit string. After the extraction, the register is cleared.

As depicted in FIG. 22, the pointers to leaves L1 to L2329 are stored in the root structure of the $2^N$-branch nodeless Huffman tree. Therefore, the computer searches for the pointer to the leaf L# matched with the extracted object bit string "100110000111". In this case, since one of the pointers to the leaf L156 is matched, the computer reads the corresponding pointer to the leaf L156 to access the structure of the leaf L156.

Since the structure of the leaf L156 stores a divided character code "0x4E", the computer extracts and stores this character code "0x4E" into the decompression buffer 6900. Since the structure of the leaf L156 also stores the compression code length leg (=11 bits) of the character code "0x4E", the computer also extracts the compression code length leg of the character code "0x4E". The computer updates the bit address abi with this extracted compression code length leg. In this case, the updated bit address abi is abi=30+11=41.

Figure 73:
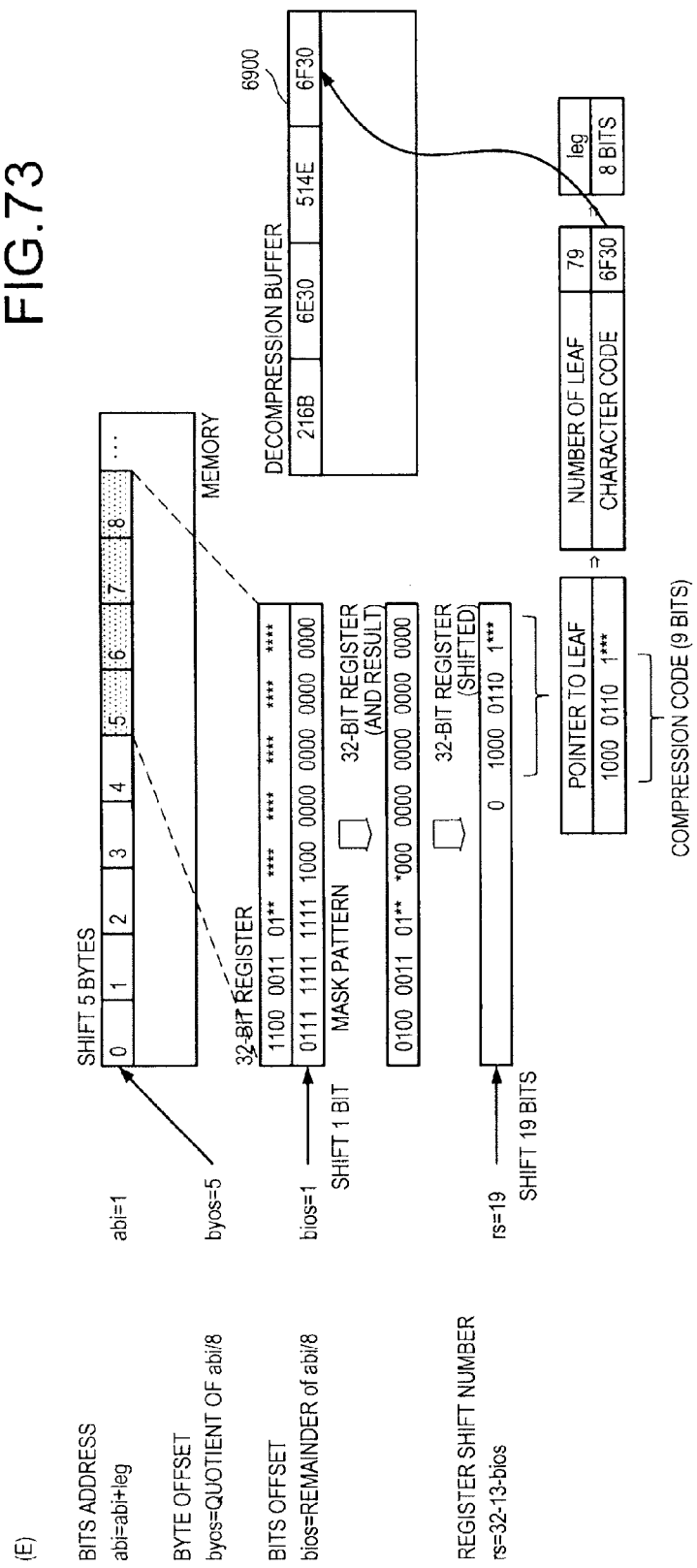
FIG. 73 is a diagram (part 5) of a decompression process example of the compression code string depicted in FIG. 61.

FIG. 73 depicts a decompression process if the register is shifted by the byte offset byos from the state of (D) depicted in FIG. 72 (state of (E)). Since the previous bit address abi of (D) is abi=30 and the compression code length leg is 11 bits, the bit address abi of (E) is abi=41 bits.

This bit address abi=41 leads to the byte offset byos=5 and the bit offset bios=1. Because of the byte offset byos=5, the computer sets in the register a compression code string of 4 bytes (shaded in FIG. 73) from the fifth byte of the compression code string retained in the memory.

Because of the bit offset bios=1, the mask pattern is "0x7FF80000". Therefore, an AND result is acquired from the logical product (AND) operation of the compression code string set in the register and the mask pattern "0x7FF80000".

Because of the bit offset bios=1, the register shift number rs is rs=32−m−bios=32−12−1=19. Therefore, the AND result in the register is shifted by 19 bits toward the end. Due to this shift, "0100001101***" ("*" represents 1 or 0) is left in the register and, therefore, the computer extracts the ending 12 bits as the object bit string. In this case, "100001101***" is extracted as the object bit string. After the extraction, the register is cleared.

As depicted in FIG. 22, the pointers to leaves L1 to L2329 are stored in the root structure of the $2^N$-branch nodeless Huffman tree. Therefore, the computer searches for the pointer to the leaf L# matched with the extracted object bit string "100001101*". In this case, since one of the pointers to the leaf L79 is matched, the computer reads the corresponding pointer to the leaf L79 to access the structure of the leaf L79**.

Since the structure of the leaf L79 stores a character code "0x6F30", the computer extracts and stores this character code "0x6F30" into the decompression buffer 6900. Since the structure of the leaf L79 also stores the compression code length leg (=8 bits) of the character code "0x6F30", the computer also extracts the compression code length leg of the character code "0x6F30". The computer updates the bit address abi with this extracted compression code length leg. In this case, the updated bit address abi is abi=41+8=49.

Since a compression code is included in a pointer to leaf, a leaf structure can directly be accessed without identifying the compression code regardless of which pointer to leaf is extracted. Therefore, the acceleration of the decompression process can be realized.

Figure 74:
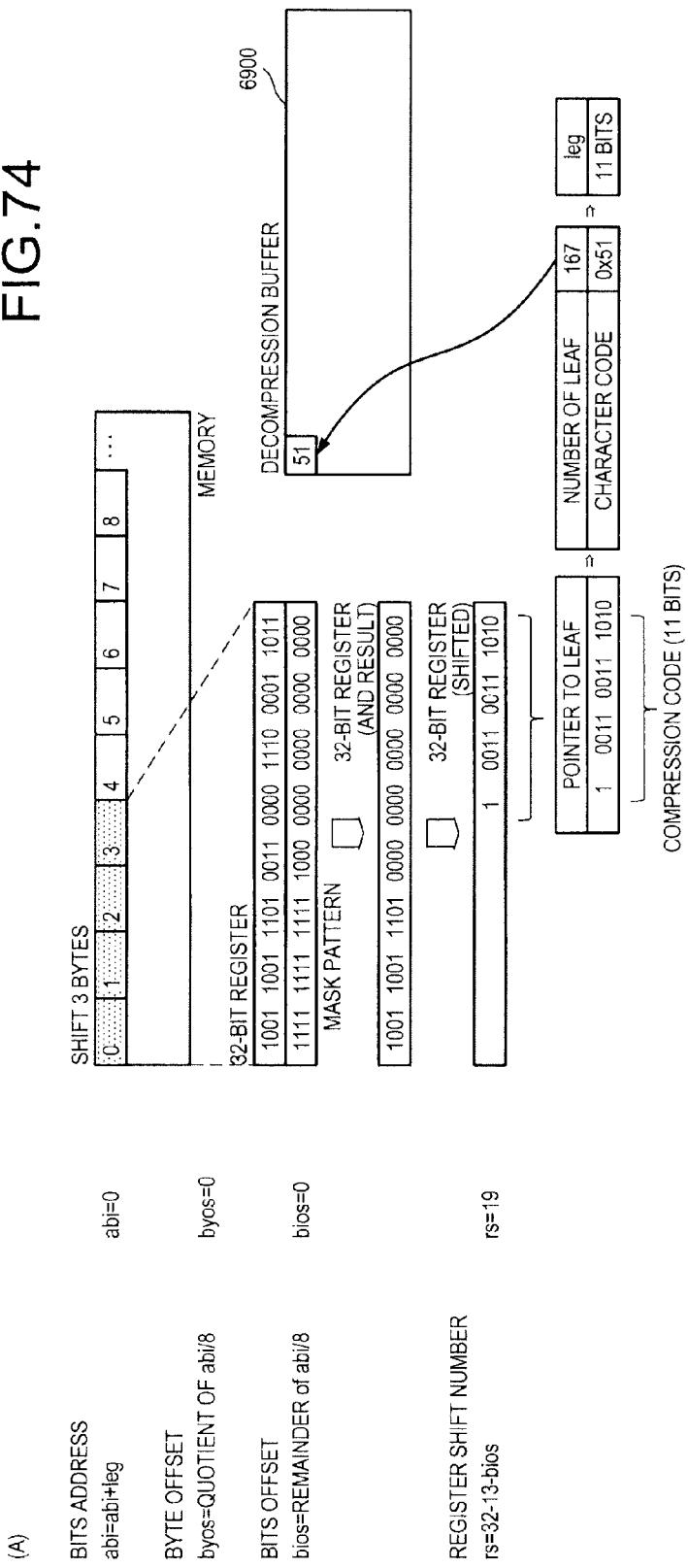
FIG. 74 is a diagram (part 1) of a decompression process example of the compression code string depicted in FIG. 63.

FIGS. 74 to 78 are diagrams of a decompression process example of the compression code string depicted in FIG. 63. FIG. 74 depicts an initial state (state of (A)). In (A), the bit address abi=0 leads to the byte offset byos=0 and the bit offset bios=0. Because of the byte offset byos=0, the computer sets in the register a compression code string of 4 bytes (shaded in FIG. 74) from the start of the compression code string retained in the memory.

Because of the bit offset bios=0, the mask pattern is "0xFFF80000". Therefore, an AND result is acquired from the logical product (AND) operation of the compression code string set in the register and the mask pattern "0xFFF80000".

Because of the bit offset bios=0, the register shift number rs is rs=32−m−bios=32−13−0=19. Therefore, the AND result in the register is shifted by 19 bits toward the end. Due to this shift, "1001100111010" is left in the register and, therefore, the computer extracts the ending 13 bits as the object bit string. In this case, "1001100111010" is extracted as the object bit string. After the extraction, the register is cleared.

As depicted in FIG. 32, the pointers to leaves L1 to L5401 are stored in the root structure of the $2^N$-branch nodeless Huffman tree. Therefore, the computer searches for the pointer to the leaf L# matched with the extracted object bit string "101111111011". In this case, since one of the pointers to the leaf L167 is matched, the computer reads the corresponding pointer to the leaf L167 to access the structure of the leaf L167.

Since the structure of the leaf L167 stores a divided character code "0x51", the computer extracts and stores this character code "0x51" into the decompression buffer 6900. Since the structure of the leaf L167 also stores the compression code length leg (=11 bits) of the character code "0x51", the computer also extracts the compression code length leg of the character code "0x51". The computer updates the bit address abi with this extracted compression code length leg. In this case, the updated bit address abi is abi=0+11=11.

Figure 75:
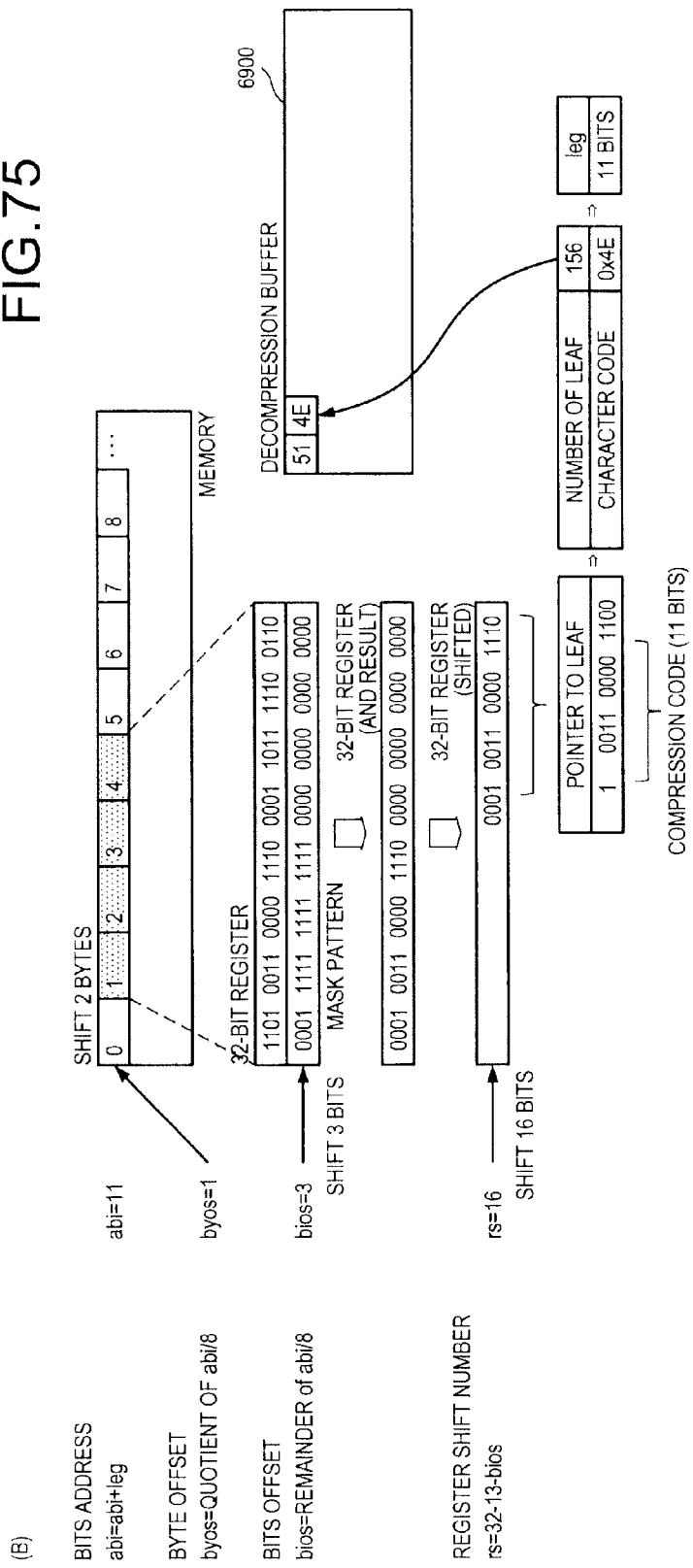
FIG. 75 is a diagram (part 2) of a decompression process example of the compression code string depicted in FIG. 63.

FIG. 75 depicts a decompression process if the register is shifted by the byte offset byos from the state of (A) depicted in FIG. 74 (state of (B)). Since the previous bit address abi of (A) is abi=0 and the compression code length leg is 11 bits, the bit address abi of (B) is abi=11 bits.

This bit address abi=11 leads to the byte offset byos=1 and the bit offset bios=3. Because of the byte offset byos=1, the computer sets in the register a compression code string of 4 bytes (shaded in FIG. 75) from the first byte of the compression code string retained in the memory.

Because of the bit offset bios=3, the mask pattern is "0x1FFF0000". Therefore, an AND result is acquired from the logical product (AND) operation of the compression code string set in the register and the mask pattern "0x1FFF0000".

Because of the bit offset bios=3, the register shift number rs is rs=32−m−bios=32−13−3=16. Therefore, the AND result in the register is shifted by 16 bits toward the end. Due to this shift, "0001001100001110" is left in the register and, therefore, the computer extracts the ending 13 bits as the object bit string. In this case, "1001100001110" is extracted as the object bit string. After the extraction, the register is cleared.

As depicted in FIG. 32, the pointers to leaves L1 to L5401 are stored in the root structure of the $2^N$-branch nodeless Huffman tree. Therefore, the computer searches for the pointer to the leaf L# matched with the extracted object bit string "1001100001110". In this case, since one of the pointers to the leaf L156 is matched, the computer reads the corresponding pointer to the leaf L156 to access the structure of the leaf L156.

Since the structure of the leaf L156 stores a divided character code "0x4E", the computer extracts and stores this character code "0x4E" into the decompression buffer 6900. Since the structure of the leaf L156 also stores the compression code length leg (=11 bits) of the character code "0x4E", the computer also extracts the compression code length leg of the character code "0x4E". The computer updates the bit address abi with this extracted compression code length leg. In this case, the updated bit address abi is abi=11+11=22.

Figure 76:
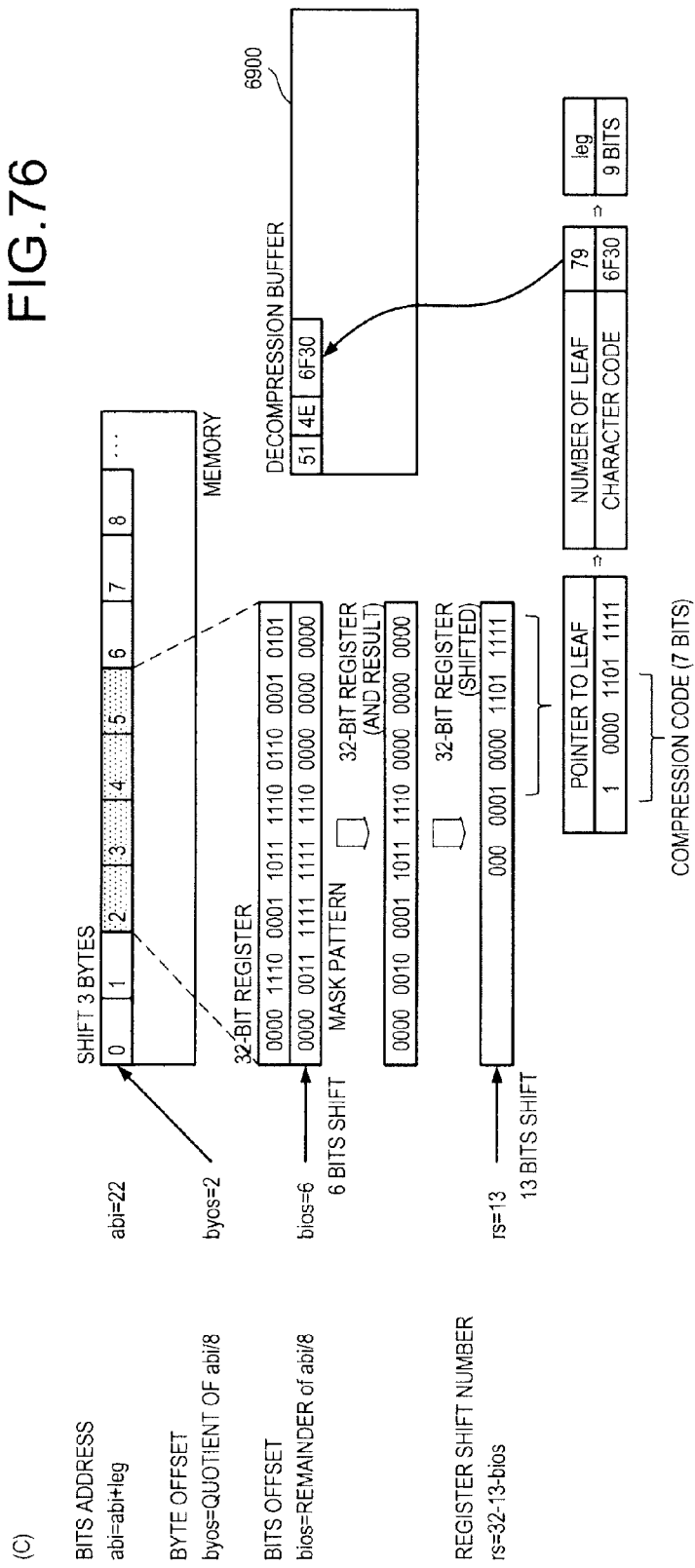
FIG. 76 is a diagram (part 3) of a decompression process example of the compression code string depicted in FIG. 63.

FIG. 76 depicts a decompression process if the register is shifted by the byte offset byos from the state of (B) depicted in FIG. 75 (state of (C)). Since the previous bit address abi of (B) is abi=11 and the compression code length leg is 11 bits, the bit address abi of (C) is abi=22 bits.

This bit address abi=22 leads to the byte offset byos=2 and the bit offset bios=6. Because of the byte offset byos=2, the computer sets in the register a compression code string of 4 bytes (shaded in FIG. 76) from the second byte of the compression code string retained in the memory.

Because of the bit offset bios=6, the mask pattern is "0x03FFE000". Therefore, an AND result is acquired from the logical product (AND) operation of the compression code string set in the register and the mask pattern "0x03FFE000".

Because of the bit offset bios=6, the register shift number rs is rs=32−m−bios=32−13−6=13. Therefore, the AND result in the register is shifted by 13 bits toward the end. Due to this shift, "00000010000110111111" is left in the register and, therefore, the computer extracts the ending 13 bits as the object bit string. In this case, "1000011011111" is extracted as the object bit string. After the extraction, the register is cleared.

As depicted in FIG. 32, the pointers to leaves L1 to L5401 are stored in the root structure of the $2^N$-branch nodeless Huffman tree. Therefore, the computer searches for the pointer to the leaf L# matched with the extracted object bit string "1000011011111". In this case, since one of the pointers to the leaf L79 is matched, the computer reads the corresponding pointer to the leaf L79 to access the structure of the leaf L79.

Since the structure of the leaf L79 stores a character code "0x6F30", the computer extracts and stores this character code "0x6F30" into the decompression buffer 6900. Since the structure of the leaf L79 also stores the compression code length leg (=9 bits) of the character code "0x6F30", the computer also extracts the compression code length leg of the character code "0x6F30". The computer updates the bit address abi with this extracted compression code length leg. In this case, the updated bit address abi is abi=22+9=31.

Figure 77:
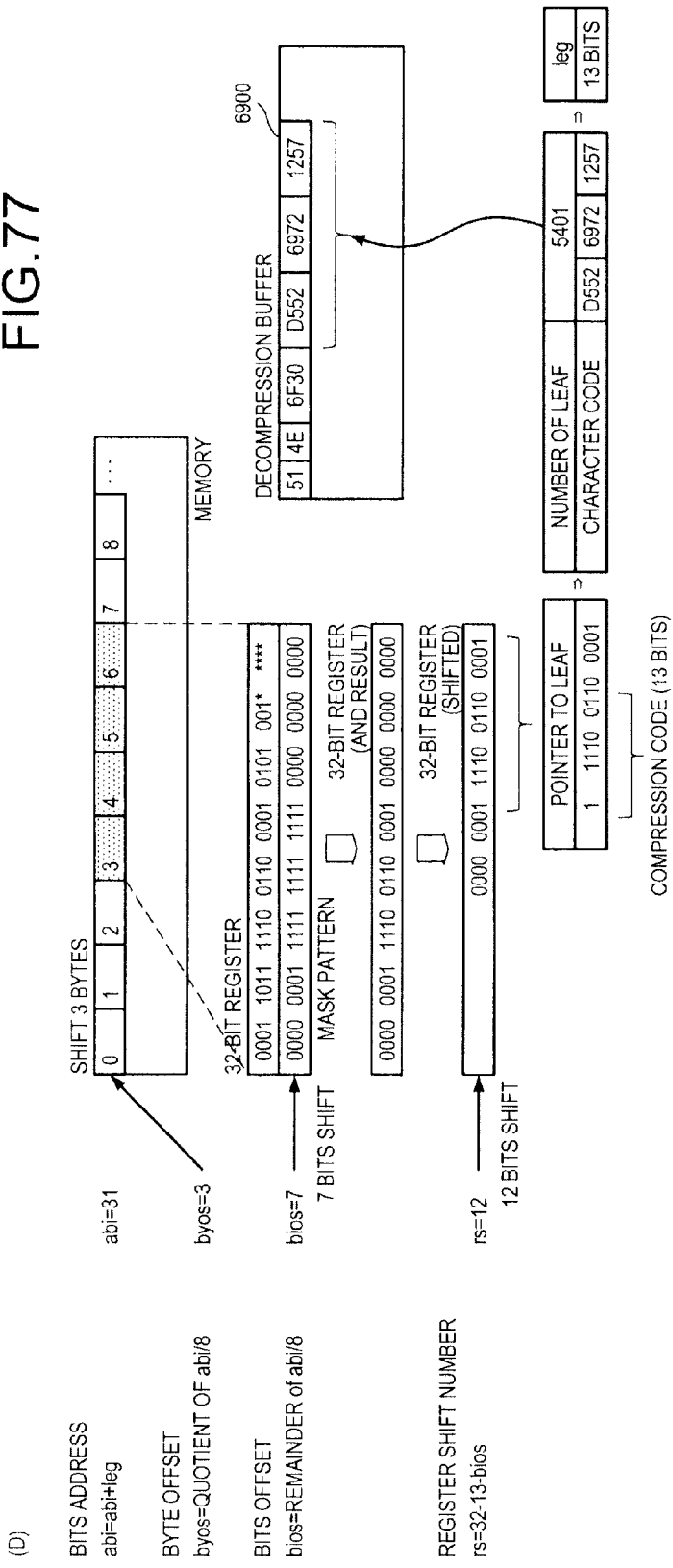
FIG. 77 is a diagram (part 4) of a decompression process example of the compression code string depicted in FIG. 63.

FIG. 77 depicts a decompression process if the register is shifted by the byte offset byos from the state of (C) depicted in FIG. 76 (state of (D)). Since the previous bit address abi of (C) is abi=22 and the compression code length leg is 9 bits, the bit address abi of (D) is abi=31 bits.

This bit address abi=31 leads to the byte offset byos=3 and the bit offset bios=7. Because of the byte offset byos=3, the computer sets in the register a compression code string of 4 bytes (shaded in FIG. 77) from the third byte of the compression code string retained in the memory.

Because of the bit offset bios=7, the mask pattern is "0x01FFF000". Therefore, an AND result is acquired from the logical product (AND) operation of the compression code string set in the register and the mask pattern "0x01FFF000".

Because of the bit offset bios=7, the register shift number rs is rs=32−m−bios=32−13−7=12. Therefore, the AND result in the register is shifted by 12 bits toward the end. Due to this shift, "00000001111001100001" is left in the register and, therefore, the computer extracts the ending 13 bits as the object bit string. In this case, "1111001100001" is extracted as the object bit string. After the extraction, the register is cleared.

As depicted in FIG. 32, the pointers to leaves L1 to L5401 are stored in the root structure of the $2^N$-branch nodeless Huffman tree. Therefore, the computer searches for the pointer to the leaf L# matched with the extracted object bit string "1111001100001". In this case, since one of the pointers to the leaf L5401 is matched, the computer reads the corresponding pointer to the leaf L5401 to access the structure of the leaf L5401.

Since the structure of the leaf L5401 stores a basic word 動物園, the computer extracts and stores this basic word 動物園 into the decompression buffer 6900. Since the structure of the leaf L5401 also stores the compression code length leg (=13 bits) of the basic word 動物園, the computer also extracts the compression code length leg of the basic word 動物園. The computer updates the bit address abi with this extracted compression code length leg. In this case, the updated bit address abi is abi=31+13=44.

Figure 78:
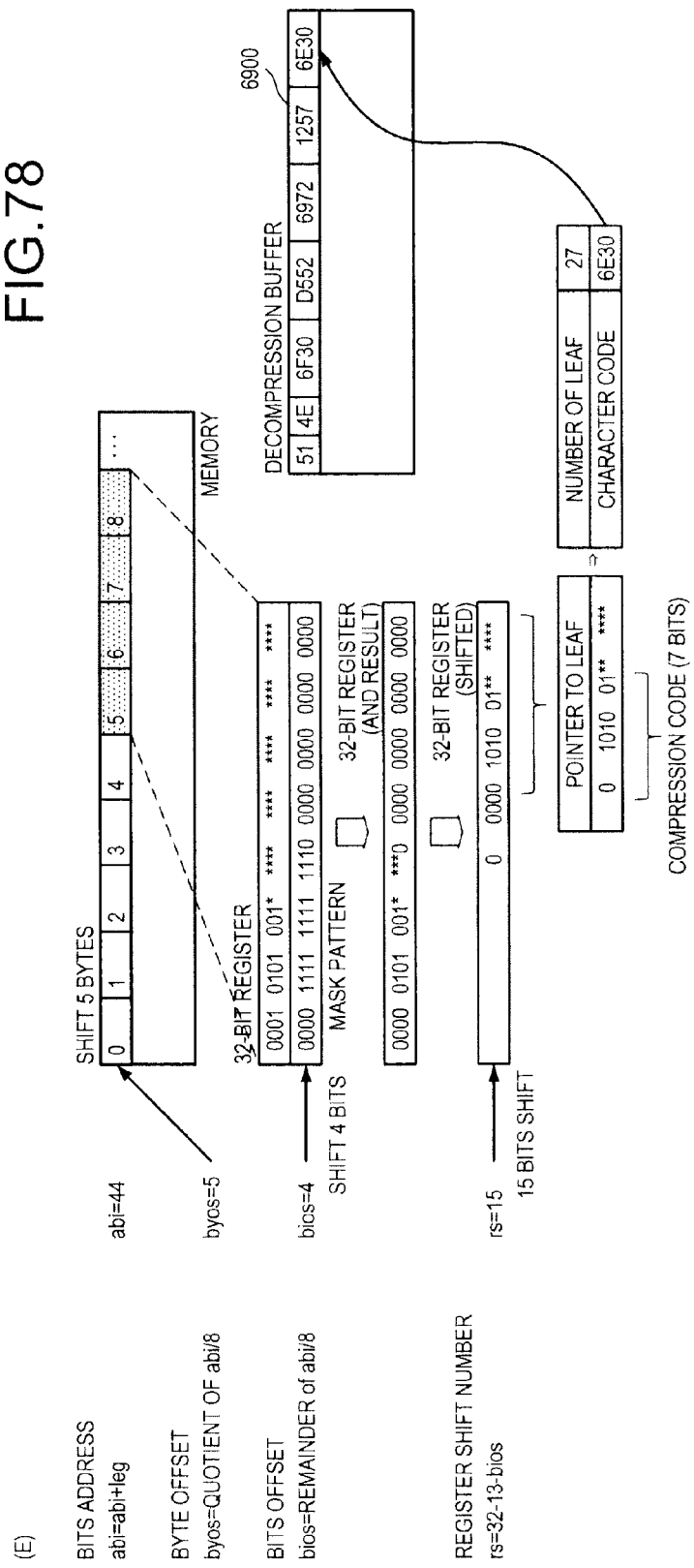
FIG. 78 is a diagram (part 5) of a decompression process example of the compression code string depicted in FIG. 63.

FIG. 78 depicts a decompression process if the register is shifted by the byte offset byos from the state of (D) depicted in FIG. 77 (state of (E)). Since the previous bit address abi of (D) is abi=31 and the compression code length leg is 13 bits, the bit address abi of (E) is abi=44 bits.

This bit address abi=44 leads to the byte offset byos=5 and the bit offset bios=4. Because of the byte offset byos=5, the computer sets in the register a compression code string of 4 bytes (shaded in FIG. 78) from the fifth byte of the compression code string retained in the memory.

Because of the bit offset bios=4, the mask pattern is "0x0FFE0000". Therefore, an AND result is acquired from the logical product (AND) operation of the compression code string set in the register and the mask pattern "0x0FFE0000".

Because of the bit offset bios=4, the register shift number rs is rs=32−m−bios=32−13−4=15. Therefore, the AND result in the register is shifted by 15 bits toward the end. Due to this shift, "00000101001******" ("*" represents 1 or 0) is left in the register and, therefore, the computer extracts the ending 13 bits as the object bit string. In this case, "0101001******" is extracted as the object bit string. After the extraction, the register is cleared.

As depicted in FIG. 32, the pointers to leaves L1 to L5401 are stored in the root structure of the $2^N$-branch nodeless Huffman tree. Therefore, the computer searches for the pointer to the leaf L# matched with the extracted object bit string "00000101001******". In this case, since one of the pointers to the leaf L27 is matched, the computer reads the corresponding pointer to the leaf L27 to access the structure of the leaf L27.

Since the structure of the leaf L27 stores a character code "0x6E30", the computer extracts and stores this character code "0x6E30" into the decompression buffer 6900. Since the structure of the leaf L27 also stores the compression code length leg (=9 bits) of the character code "0x6E30", the computer also extracts the compression code length leg of the character code "0x6E30". The computer updates the bit address abi with this extracted compression code length leg. In this case, the updated bit address abi is abi=44+9=53.

Since a compression code is included in a pointer to leaf, a leaf structure can directly be accessed without identifying the compression code regardless of which pointer to leaf is extracted. Therefore, the acceleration of the decompression process can be realized.

FIG. 79 is a flowchart (part 1) of a decompression process procedure using the $2^N$-branch nodeless Huffman tree. In FIG. 79, the computer sets the bit address abi to abi=0 (step S7901), calculates the byte offset byos (step S7902), and calculates the bit offset bios (step S7903). The computer sets a compression code string from the position of the byte offset byos into the register (step S7904).

The computer shifts a mask pattern by the bit offset bios toward the end (step S7905) and performs an AND operation with the compression code string set in the register (step S7906). The computer subsequently calculates the register shift number rs (step S7907) and shifts the register after the AND operation by the register shift number rs toward the end (step S7908).

FIG. 80 is a flowchart (part 2) of the decompression process procedure using the $2^N$-branch nodeless Huffman tree. After step S7908, in FIG. 80, the computer extracts the ending N bits as an object bit string from the register after the shift (step S8001). The computer identifies the pointer to the leaf L# from the root structure of the $2^N$-branch nodeless Huffman tree (step S8002) and accesses the structure of the leaf L# to be pointed by one pass (step S8003). The computer extracts character data from the accessed structure of the leaf L# (step S8004) and writes the extracted character data into the decompression buffer 6900 (step S8005).

The computer extracts the compression code length leg from the structure of the leaf L# (step S8006) and updates the bit address abi (step S8007). The computer then determines whether a compression code string exists in the memory, for example, whether a compression code string not subjected to the mask process using the mask pattern exists (step S8008). For example, this is determined based on whether a byte position corresponding to the byte offset byos exists. If the compression code string exists (step S8008: YES), the computer returns to step S7902 of FIG. 79.

On the other hand, if no compression code string exists (step S8008: NO), a sequence of the decompression process is terminated.

With such a decompression process, a compression code can be extracted from a compression code string on the basis of N bits and the pointer to the leaf L# having the corresponding branch number can be identified by accessing to the root structure of the $2^N$-branch nodeless Huffman tree. A character code is extracted from the accessed structure of the leaf L# to decompress the compression code. Since the $2^N$-branch nodeless Huffman tree has no inner node, if the pointer to the leaf L# is identified, the structure of the leaf L# can be accessed by one pass and a decompression rate can be accelerated.

As described above, according to this embodiment, the upper limit length N of the compression code length in the $2^N$-branch nodeless Huffman tree can be adjusted by one bit depending on the total number of character data types. Therefore, the $2^N$-branch nodeless Huffman tree can be generated with a size appropriate for the total number of character data types and memory saving can be achieved.

For example, if the total number of character data types is greater than $2^{K-1}$ and less than or equal to $2^K$, when the upper limit length N is determined as K bits, the numbers of leaves at the compression code lengths greater than or equal to the upper limit length K are aggregated into the number of leaves at the compression code length of the upper limit length K as described in the correction A. Therefore, since the $2^N$-branch nodeless Huffman tree is generated, a size can be made smaller than a nodeless Huffman tree having the upper code length greater than or equal to (K+1).

For example, if the total number of character data types is greater than $2^{10}$ and less than or equal to $2^{11}$, the $2^{11}$-branch nodeless Huffman tree can be generated by determining the upper limit length N as 11 bits. If the total number of character data types is greater than $2^{11}$ and less than or equal to $2^{12}$, the $2^{12}$-branch nodeless Huffman tree can be generated by determining the upper limit length N as 12 bits. If the total number of character data types is greater than $2^{12}$ and less than or equal to $2^{13}$, the $2^{13}$-branch nodeless Huffman tree can be generated by determining the upper limit length N as 13 bits.

If the total occurrence probability with the correction A is greater than or equal to the threshold value t and less than or equal to one, sufficient compression efficiency is expected. Therefore, the generation speed can be accelerated by generating the $2^N$-branch nodeless Huffman tree with the numbers of leaves at the compression code lengths with the correction A.

If the total occurrence probability with the correction A is not greater than or equal to the threshold value t or not less than or equal to one, the correction B can be performed to improve the compression efficiency. For example, if the total occurrence probability is less than the threshold value t, the correction $^+$ process can be executed to make the total occurrence probability asymptotic to one and the compression efficiency can be improved to the maximum. Similarly, if the total occurrence probability is greater than one, the correction $^-$ process can be executed to make the total occurrence probability asymptotic to one and the compression efficiency can be improved to the maximum.

The total occurrence probability can also be approximated to one by shifting the number of leaves between the compression code lengths. In any case, the compression efficiency can be improved by setting the numbers of leaves at the compression code lengths to the optimum numbers of leaves such that the total occurrence probability is approximated to one.

The method described in the present embodiment may be implemented by executing a prepared program on a computer such as a personal computer and a workstation. The generating program is stored on a computer-readable recording medium such as a hard disk, a flexible disk, a CD-ROM, an MO, and a DVD, read out from the computer-readable medium, and executed by the computer. The generating program may be distributed through a network such as the Internet.

According to the generating program, the generating apparatus, and the generating method, a $2^N$-branch nodeless Huffman tree can be constructed with a size optimum for a total number of character data types.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing therein a generating program that causes a computer to execute a process comprising:
    tabulating a number of character data types for each compression code length specified by an occurrence probability corresponding to an appearance rate of each character data appearing in an object file;
    determining an upper limit length N of compression code length assigned to the character data, among compression code lengths from a minimum compression code length to a maximum compression code length and based on the total number of character data types;
    correcting the number of character data types tabulated at the tabulating for the upper limit length N determined at the determining, to the sum of the numbers of character data types for the compression code lengths equal to or greater than the upper limit length N; and
    constructing a $2^N$-branch nodeless Huffman tree with the maximum branch number defined by the upper limit length N, the $2^N$-branch nodeless Huffman tree including leaves that are compression codes having compression code lengths corresponding to respective occurrence probabilities of the character data, based on the numbers of character data types for the respective compression code lengths after the correction at the correcting.

2. The non-transitory computer-readable recording medium according to claim 1, wherein the determining includes determining the upper limit length N as K bits if the total number of character data types is greater than $2^{K-1}$ and equal to or less than $2^K$.

3. The non-transitory computer-readable recording medium according to claim 2, wherein the determining includes determining the upper limit length N as 11 bits if the total number of character data types is greater than $2^{10}$ and equal to or less than $2^{11}$.

4. The non-transitory computer-readable recording medium according to claim 2, wherein the determining includes determining the upper limit length N as 12 bits if the total number of character data types is greater than $2^{11}$ and equal to or less than $2^{12}$.

5. The non-transitory computer-readable recording medium according to claim 2, wherein the determining includes determining the upper limit length N as 13 bits if the total number of types of the character information is greater than $2^{12}$ and equal to or less than $2^{13}$.

6. The non-transitory computer-readable recording medium according to claim 1, wherein the process further comprises:
    calculating a sum of occurrence probabilities specifying compression code lengths up to the upper limit length N, based on the numbers of character data types for the compression code lengths up to the upper limit length N after the correction at the correcting;
    judging whether the sum calculated at the calculating is equal to or greater than a threshold value and equal to or less than one;
    generating, if it is judged that the sum is equal to or greater than the threshold value and equal to or less than one at the judging, leaf structures for compression codes assigned to the character data based on the compression code lengths up to the upper limit length N, the numbers of character data types for the respective compression code lengths up to the upper limit length N, and the appearance rates of the character data; and
    specifying the number of branches of each of the leaf structures generated at the generating for each of the compression code lengths up to the upper limit length N, based on the compression code lengths up to the upper limit length N, wherein
    the constructing includes generating, for each leaf structure, a group of pointers to leaf each of which includes a compression code included in the leaf structure followed by a bit string representative of a branch number within the number of branches specified at the specifying, to construct the $2^N$-branch nodeless Huffman tree having the groups of the pointers for the leaf structures as a root.

7. The non-transitory computer-readable recording medium according to claim 6, wherein the process further comprises
    updating, if it is judged that the sum is not equal to or greater than the threshold value or not equal to or less than one at the judging, the number of character data types for each compression code length up to the upper limit length N by dividing the number of character data types by the sum, wherein
    the calculating includes recalculating the sum based on the numbers of character data types for the compression code lengths up to the upper limit length N after the update at the updating,
    the judging includes judging whether the sum recalculated at the calculating is a maximum value equal to or less than one, and
    the generating includes generating, if it is judged that the recalculated sum is the maximum value at the judging, leaf structures having compression codes assigned to the character data based on the compression code lengths up to the upper limit length N, the updated numbers of character data types for the respective compression code lengths up to the upper limit length N, and the appearance rates of the character data.

8. The non-transitory computer-readable recording medium according to claim 7, wherein the process further comprises repeatedly executing the update at the updating, the recalculation at the calculating, and the judgment at the judging until the recalculated sum reaches the maximum value equal to or less than one.

9. The non-transitory computer-readable recording medium according to claim 6, wherein the process further comprises updating, if it is judged that the sum is not equal to or greater than the threshold value or not equal to or less than one at the judging, the number of character data types for each compression code length up to the upper limit length N by decreasing, among the compression code lengths up to the upper limit N, the number of character data types for a first compression code length by a predetermined number and increasing the number of character data types for a second compression code length greater than the first compression code length by the predetermined number, wherein the calculating includes recalculating the sum based on the numbers of character data types for the compression code lengths up to the upper limit length N after the update at the updating, the judging includes judging whether the sum recalculated at the calculating is a maximum value equal to or less than one, and the generating includes generating, if it is judged that the recalculated sum is the maximum value at the judging, leaf structures having compression codes assigned to the character data based on the compression code lengths up to the upper limit length N, the updated numbers of character data types for the respective compression code lengths up to the upper limit length N, and the appearance rates of the character data.

10. The non-transitory computer-readable recording medium according to claim 9, wherein the process further comprises repeatedly executing the update at the updating, the recalculation at the calculating, and the judgment at the judging until the recalculated sum reaches the maximum value equal to or less than one.

11. A generating apparatus comprising:

at least one processor configured to:

tabulate a number of character data types for each compression code length specified by an occurrence probability corresponding to an appearance rate of each character data appearing in an object file;

determine an upper limit length N of compression code length assigned to the character data, among compression code lengths from a minimum compression code length to a maximum compression code length and based on the total number of character data types;

correct the number of character data types for the upper limit length N, to the sum of the numbers of character data types for the compression code lengths equal to or greater than the upper limit length N; and construct a $2^N$-branch nodeless Huffman tree with the maximum branch number defined by the upper limit length N, the $2^N$-branch nodeless Huffman tree including leaves that are compression codes having compression code lengths corresponding to respective occurrence probabilities of the character data, based on the numbers of character data types for the respective compression code lengths after correction.

12. A generating method executed by a computer that includes a storage device that stores an object file, the generating method comprising:

tabulating, by a tabulating unit, a number of character data types for each compression code length specified by an occurrence probability corresponding to an appearance rate of each character data appearing in the object file;

determining, by a determining unit, an upper limit length N of compression code length assigned to the character data, among compression code lengths from a minimum compression code length to a maximum compression code length and based on the total number of character data types;

correcting, by a correcting unit, the number of character data types tabulated at the tabulating for the upper limit length N determined at the determining, to the sum of the numbers of character data types for the compression code lengths equal to or greater than the upper limit length N; and constructing, by a constructing unit, a $2^N$-branch nodeless Huffman tree with the maximum branch number defined by the upper limit length N, the $2^N$-branch nodeless Huffman tree including leaves that are compression codes having compression code lengths corresponding to respective occurrence probabilities of the character data, based on the numbers of character data types for the respective compression code lengths after the correction at the correcting.

13. A non-transitory computer-readable recording medium storing therein a compression program that causes a computer to execute a process comprising:

tabulating a number of character data types for each compression code length specified by an occurrence probability corresponding to an appearance rate of each character data appearing in one or a plurality of object files;

determining an upper limit length N of compression code length assigned to the character data, among compression code lengths from a minimum compression code length to a maximum compression code length and based on the total number of character data types;

correcting the number of character data types tabulated at the tabulating for the upper limit length N determined at the determining, to the sum of the numbers of character data types for the compression code lengths equal to or greater than the upper limit length N; and constructing a $2^N$-branch nodeless Huffman tree with the maximum branch number defined by the upper limit length N, the $2^N$-branch nodeless Huffman tree including leaves that are compression codes having compression code lengths corresponding to respective occurrence probabilities of the character data, based on the numbers of character data types for the respective compression code lengths after the correction at the correcting; and compressing the one or the plurality of object files using the $2^N$-branch nodeless Huffman tree.

14. The non-transitory computer-readable recording medium according to claim 13, wherein the determining includes determining the upper limit length N as K bits if the total number of character data types is greater than $2^{K-1}$ and equal to or less than $2^K$.

15. The non-transitory computer-readable recording medium according to claim 13, wherein the process further comprises:

calculating a sum of occurrence probabilities specifying compression code lengths up to the upper limit length N, based on the numbers of character data types for the compression code lengths up to the upper limit length N after the correction at the correcting;

judging whether the sum calculated at the calculating is equal to or greater than a threshold value and equal to or less than one;

generating, if it is judged that the sum is equal to or greater than the threshold value and equal to or less than one at the judging, leaf structures for compression codes assigned to the character data based on the compression code lengths up to the upper limit length N, the numbers of character data types for the respective compression code lengths up to the upper limit length N, and the appearance rates of the character data; and specifying the number of branches of each of the leaf structures generated at the generating for each of the compression code lengths up to the upper limit length N, based on the compression code lengths up to the upper limit length N, wherein the constructing includes generating, for each leaf structure, a group of pointers to leaf each of which includes a compression code included in the leaf structure followed by a bit string representative of a branch number within the number of branches specified at the specifying, to construct the $2^N$-branch nodeless Huffman tree having the groups of the pointers for the leaf structures as a root.

16. The non-transitory computer-readable recording medium according to claim 15, wherein the process further comprises updating, if it is judged that the sum is not equal to or greater than the threshold value or not equal to or less than one at the judging, the number of character data types for each compression code length up to the upper limit length N by dividing the number of character data types by the sum, wherein the calculating includes recalculating the sum based on the numbers of character data types for the compression code lengths up to the upper limit length N after the update at the updating, the judging includes judging whether the sum recalculated at the calculating is a maximum value equal to or less than one, and the generating includes generating, if it is judged that the recalculated sum is the maximum value at the judging, leaf structures having compression codes assigned to the character data based on the compression code lengths up to the upper limit length N, the updated numbers of character data types for the respective compression code lengths up to the upper limit length N, and the appearance rates of the character data.

17. The non-transitory computer-readable recording medium according to claim 16, wherein the process further comprises repeatedly executing the update at the updating, the recalculation at the calculating, and the judgment at the judging until the recalculated sum reaches the maximum value equal to or less than one.

18. The non-transitory computer-readable recording medium according to claim 15, wherein the process further comprises updating, if it is judged that the sum is not equal to or greater than the threshold value or not equal to or less than one at the judging, the number of character data types for each compression code length up to the upper limit length N by decreasing, among the compression code lengths up to the upper limit N, the number of character data types for a first compression code length by a predetermined number and increasing the number of character data types for a second compression code length greater than the first compression code length by the predetermined number, wherein the calculating includes recalculating the sum based on the numbers of character data types for the compression code lengths up to the upper limit length N after the update at the updating, the judging includes judging whether the sum recalculated at the calculating is a maximum value equal to or less than one, and the generating includes generating, if it is judged that the recalculated sum is the maximum value at the judging, leaf structures having compression codes assigned to the character data based on the compression code lengths up to the upper limit length N, the updated numbers of character data types for the respective compression code lengths up to the upper limit length N, and the appearance rates of the character data.

19. The non-transitory computer-readable recording medium according to claim 18, wherein the process further comprises repeatedly executing the update at the updating, the recalculation at the calculating, and the judgment at the judging until the recalculated sum reaches the maximum value equal to or less than one.

* * * * *